United States Patent
Tukahara et al.

[11] Patent Number: 6,016,749
[45] Date of Patent: Jan. 25, 2000

[54] STAMP-MAKING APPARATUS, AS WELL AS FUNCTION CHANGEOVER MECHANISM, EXPOSURE SYSTEM AND STAMP-MAKING OBJECT MATERIAL-DETECTING DEVICE THEREFOR

[75] Inventors: Eiji Tukahara; Hideki Oikawa; Kenichi Nakajima; Hiroshi Kuriyama, all of Suwa; Kenji Watanabe, Tokyo; Takanobu Kameda, Tokyo; Chieko Aida, Tokyo; Tomoyuki Shimmura, Tokyo, all of Japan

[73] Assignee: Seiko Epson Corporation and King Jim Co., Ltd., Japan

[21] Appl. No.: 08/711,984

[22] Filed: Sep. 10, 1996

[30]    Foreign Application Priority Data

Sep. 12, 1995  [JP]  Japan ................................. 7-234465
Sep. 12, 1995  [JP]  Japan ................................. 7-234467
Sep. 12, 1995  [JP]  Japan ................................. 7-234468
Sep. 12, 1995  [JP]  Japan ................................. 7-234469

[51] Int. Cl.⁷ ............................................. B41K 1/34
[52] U.S. Cl. ..................................... 101/401.1; 400/208
[58] Field of Search .............................. 101/4, 12, 13, 101/14, 15, 16, 17, 3.1, 401.1; 400/208, 191, 223

[56]            References Cited

U.S. PATENT DOCUMENTS 3,189,732  6/1965  Russell .
3,360,173  12/1967 Miller .
3,776,442  12/1973 Ridley .
3,881,414  5/1975  D'Amato et al. .
4,605,327  8/1986  Ueki et al. .
4,714,957  12/1987 Takano .
4,960,337  10/1990 Kato et al. .
5,223,041  6/1993  Cerney .
5,252,428  10/1993 Kawamoto et al. .
5,342,672  8/1994  Killey .

FOREIGN PATENT DOCUMENTS 0 644 059 A1  3/1995  European Pat. Off. .
6-278350     10/1994  Japan .

OTHER PUBLICATIONS

European Patent Office Patent Abstracts of Japan; "Ribbon Cartridge for Printer"; Applicant Sharp Corp., Inventor Shimizu Masahiro; Publication No. 62156980, Publication Date Jul. 11, 1987.

English Abstract of JP 2–179783 (Jul. 12, 1990 Patent Date).

*Primary Examiner*—Eugene Eickholt
*Attorney, Agent, or Firm*—Harness, Dickey & Pierce, P.L.C.

[57]            ABSTRACT

A stamp-making apparatus is provided in which a transparent presser plate is arranged such that the presser plate is parallel with a stamp-making object material, an ink ribbon having a stamp image formed thereon is urged against the stamp-making object material via the presser plate, and exposure of the stamp-making object material to light is carried out via the ink ribbon as a mask. A ribbon feeder rolls out an ink ribbon wound around one end portion thereof to a position facing the stamp-making object material, and then rolls up the ink ribbon around another end portion thereof. A relative translation of the presser plate and the stamp-making object material is made toward each other by moving at least one of the presser plate and the stamp-making object material to thereby urge the ink ribbon against the stamp-making object material. Guide means guides the ink ribbon when the ink ribbon is fed, to space between the presser plate and the stamp-making object material. Tension of the ink ribbon is regulated in a manner linked to operation of the relative translation of the presser plate and the stamp-making object material made toward each other.

19 Claims, 36 Drawing Sheets

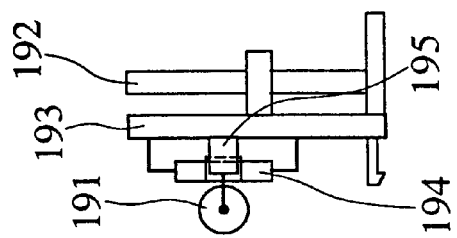
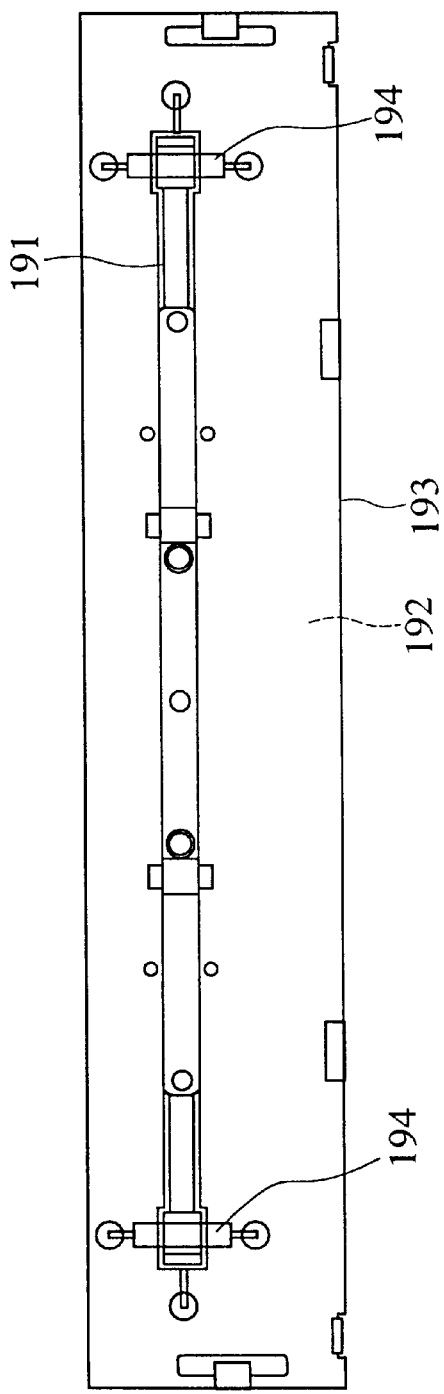

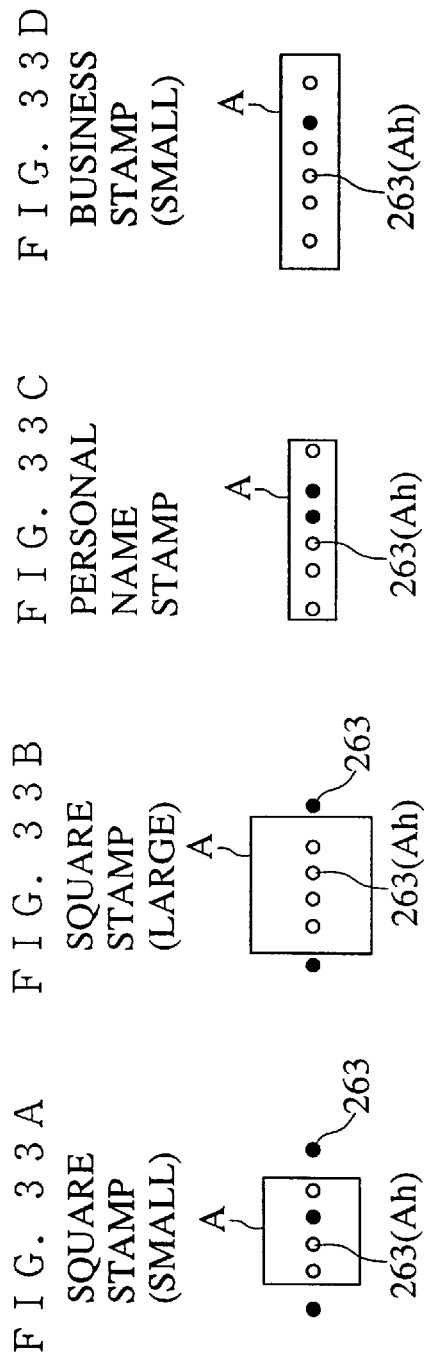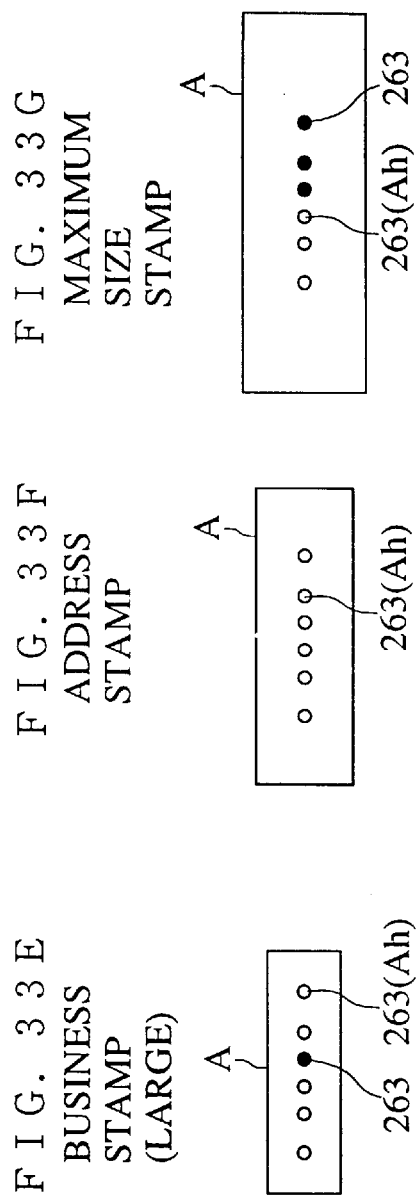

STAMP-MAKING APPARATUS, AS WELL AS FUNCTION CHANGEOVER MECHANISM, EXPOSURE SYSTEM AND STAMP-MAKING OBJECT MATERIAL-DETECTING DEVICE THEREFOR

BACKGROUND OF THE INVENTION

1. Field of the Invention

This invention relates to a stamp-making apparatus for making a stamp by printing an image forming a stamp impression of the stamp on an ink ribbon, and exposing a stamp-making object material mounted in the stamp-making apparatus to ultraviolet rays irradiated through the mask of the ink ribbon, as well as to a function changeover mechanism for switching between functions of printing, exposure, etc., of the stamp-making apparatus, an exposure system forming a source of exposure light to which a stamp-making object material is exposed, and a stamp object material-detecting device therefor.

2. Prior Art

Conventionally, a stamp-making apparatus of the above-mentioned kind includes a supply reel for rolling out an ink ribbon therefrom and a take-up reel for taking up the ink ribbon therein, as well as a presser plate for pressing the ribbon against a stamp body as a stamp-making object material from which a stamp is made, with the presser plate and the stamp body being arranged on opposite sides of a feed path of the ink ribbon in a manner facing toward each other. On upstream and downstream sides of the stamp body and the presser plate, a pair of rollers are provided for guiding the ink ribbon to a feed path between the stamp body and the presser plate such that the ink ribbon is fed in parallel with the stamp body and the presser plate. When exposure of the stamp body to light is conducted, the ink ribbon is stopped in a position in which a portion of the ink ribbon on which an image of a stamp impression (stamp image) is formed faces toward the stamp body, and then a translating mechanism, not shown, operates to move the presser plate forward to the stamp body and then the exposure of the stamp body is carried out (Japanese Laid-Open Patent Publication (Kokai) No. 6-278350).

As a light source for exposure, a self-heating hot-cathode tube, i.e. a so-called semi-hot tube is used. To detect expiration of the service life or failure of the self-heating hot-cathode tube, a pair of overtemperature cutouts are provided on electrode portions at opposite ends of the self-heating hot-cathode tube such that they each extend along a longitudinal axis of the same. That is, the overtemperature cutouts each having a column shape are provided such that they are brought into contact with the self-heating hot-cathode tube in parallel therewith.

Further, in a stamp-making object material-detecting apparatus of the above-mentioned kind, a stamp body (stamp-making object material) is mounted in a pocket of a stamp-making apparatus from above such that it lies on its side with a stamp surface to be formed facing in a forward direction, and a state of the stamp body being mounted in the pocket is detected by a sensor or a switch provided at the bottom of the pocket of the stamp-making apparatus.

In a conventional stamp-making apparatus, when the feed path of an ink ribbon is long, it is required to feed the ink ribbon while applying a predetermined level of tension thereto so as to prevent the ink ribbon from becoming loose. In particular, if the ink ribbon is fed with the width of a ribbon surface extending perpendicularly, i.e. on its side on a horizontal plane, the ink ribbon can fall off a feed roller or the like when it becomes loose, and therefore it is necessary to feed the ink ribbon in a strongly stretched state to avoid jamming. However, the ink ribbon is thin, and made of material having no rigidity, so that if the ribbon is sent in a strongly stretched state, vertical wrinkles are formed crosswise to the direction of feed of the ink ribbon.

On the other hand, it exposure of the stamp-making object material to light is carried out using the ink ribbon as a mask, reproducibility of the exposure is degraded due to diffusion of light unless the ink ribbon is brought into intimate contact with the stamp-making object material. Therefore, it is considered best to urge the ink ribbon against the stamp-making object material by means of a transparent presser plate. However, if a tensioned ink ribbon is simply urged against the stamp-making object material, exposure is effected with vertical wrinkles formed on the ink ribbon and the stamp image being deformed due to elongation of the ink ribbon. Inversely, if the ink ribbon is made loose during exposure, position of the stamp image on the ink ribbon with respect to the stamp-making object material is displaced.

Further, in a conventional stamp-making apparatus, if a print head for printing, the presser plate for exposure or the like is moved in an electrical manner by the use of electrical means such an electric motor, the apparatus becomes complicated not only in construction but also in the method of control, which increases the manufacturing costs of the stamp-making apparatus. Therefore, it is preferred that the print head and the presser plate should be directly moved in a mechanical manner, from the viewpoint of cost and reliability of the movement of these members. However, if operating members are provided for moving these members, respectively, the manner of operating these operating members becomes complicated and wrong operations are liable to occur.

Further, in this kind of the stamp-making apparatus, exposure to ultraviolet rays is carried out, and hence it is necessary to hold the stamp-making object material in an unmovable manner in carrying out the exposure and prevent invasion of dust to an exposure block. To this end, it is preferred that the apparatus is provided with a mounting block for receiving the stamp-making object material therein with a lid for opening and closing the mounting block. However, if the lid has a simple opening and closing structure, the lid can be opened by mistake during exposure, to undesirably allow ultraviolet rays to leak to the outside. Further, if the lid is opened during printing, the ink ribbon is jammed.

The semi-hot tube forming part of the exposure system is small-sized and has a preheating circuit simple in circuit configuration compared with a hot-cathode tube which is large in diameter and has a preheating circuit complicated in circuit configuration. The semi-hot tube generates sufficient quantity of light compared with cold-cathode tube which generates insufficient quantity of light. Therefore, the semi-hot tube is very useful for a luminescent tube installed in electronic devices and required to generate a substantial quantity of light. If an abnormality-detecting device is provided on such a semi-hot tube, in a conventional manner, such that overtemperature cutouts extend along the tube in a line contact manner, more heat readily dissipates from the semi-hot tube to the overtemperature cutouts when the semi-hot tube starts to be energized, resulting in a delayed production of sufficient quantity of light.

On the other hand, in the case of a conventional stamp-making object material-detecting device, if stamp bodies (stamp-making object materials) which are different in shape are mounted, some of them can be spaced from the bottom of the pocket, which causes a sensor or a switch for detecting the stamp bodies to operate in an inaccurate manner. On the other hand, if the stamp bodies are mounted in the pocket such that they are pressed against the bottom of the pocket, the position of the stamp-forming surface is varied among the stamp bodies.

SUMMARY OF THE INVENTION

It is a first object of the invention to provide a stamp-making apparatus which is capable of feeding an ink ribbon smoothly and at the same time attaining an excellent reproducibility of exposure to light.

It is a second object of the invention to provide a function changeover mechanism for a stamp-making apparatus, which is capable of changing between functions of printing, exposure, etc., of the stamp-making apparatus in a simplified and reliable manner, and at the same time preventing a lid from opening during printing and exposure to light.

It is a third object of the invention to provide an exposure system for a stamp-making apparatus including an overtemperature cutout which permits positive detection of abnormality of a self-heating hot-cathode tube as a source of light for exposure, and does not have an adverse effect concerning time required before a sufficient quantity of light is generated.

It is a fourth object of the invention to provide a stamp-making object material-detecting device for a stamp-making apparatus, which is capable of detecting each of stamp bodies with various shapes for being mounted in the apparatus with a stamp-forming surface of each stamp-making object material being positioned in a fixed manner with respect to the stamp making apparatus.

To attain the first object, according to a first aspect of the invention, there is provided a stamp-making apparatus including a presser plate having transparent properties and arranged in a manner such that the presser plate is parallel with a stamp-making object material, urging means for urging an ink ribbon having a stamp image formed thereon against the stamp-making object material via the presser plate, and exposure means for exposing the stamp-making object material to light via the ink ribbon employed as a mask.

The stamp-making apparatus according to a first aspect of the invention is characterized by comprising:

ribbon-feeding means having one end portion and another end portion, for rolling out the ink ribbon wound around the one end port ion to a position facing the stamp-making object material, and then rolling up the ink ribbon around the another end portion;

translating means as the urging means for making a relative translation of the presser plate and the stamp-making object material toward each other by moving at least one of the presser plate and the stamp-making object material to thereby urge the ink ribbon against the stamp-making object material;

guide means for guiding the ink ribbon when the ink ribbon is fed, to space between the presser plate and the stamp-making object material; and tension-regulating means for regulating tension of the ink ribbon in a manner linked to operation of the translating means.

According this construction of the first aspect of the invention, when the translating means is operated to urge the ink ribbon against the stamp-making object material via the presser plate, it is possible to regulate the tension of the ink ribbon by means of the tension-regulating means. Therefore, the ink ribbon is properly urged against the stamp-making object material such that no wrinkles are formed on the ink ribbon. This enables the ink ribbon to be brought into proper intimate contact with the stamp-making object material, without causing any inconvenience to exposure to light. From another point of view, the ink ribbon can be fed while applying a suitable amount of stretching force thereto, i.e. in such a manner that the ink ribbon does not become loose.

Preferably, the tension-regulating means reduces the tension of the ink ribbon such that no wrinkles are formed on the ink ribbon.

According to this construction of a preferred embodiment, since the tension of the ink ribbon is reduced such that no wrinkles are formed on the ink ribbon, the ink ribbon urged on the stamp-making object material does not become loose and at the same time any vertical wrinkles formed thereon are eliminated.

Preferably, the stamp-making apparatus includes a printing device for forming the stamp image on the ink ribbon, and the ink ribbon feeding means has a supply side feeding mechanism and a take-up side feeding mechanism, the supply side feeding mechanism being incorporated in the printing device.

According to this construction of a preferred embodiment, by incorporating the supply side feeding mechanism into the printing device, the supply side feeding mechanism and an ink ribbon-feeding mechanism of the printing device can be implemented by the same ribbon feeder, so that it is possible to eliminate the supply side feeding mechanism provided exclusively for feeding the ink ribbon for the stamp-making apparatus.

Preferably, the stamp-making apparatus includes a printing device for forming the stamp image on the ink ribbon, and the ink ribbon-feeding means has a supply side feeding mechanism and a take-up side feeding mechanism, the supply side feeding mechanism being arranged between the guide means and the printing device along a feed path of the ink ribbon.

According to this construction of a preferred embodiment, it is possible to set the stretching force of the ink ribbon being fed without being adversely affected by the printing device. That is, the tension of the ink ribbon can be set by the ribbon-feeding means in a manner suitable for exposure, while the same can be set by the printing device in a manner suitable for printing.

Preferably, the stamp-making apparatus includes ink ribbon support means arranged on opposite sides of the presser plate for supporting the ink ribbon, and the ink ribbon support means supports the ink ribbon when the presser plate urges the ink ribbon against the stamp-making object material, such that the ink ribbon is bent at opposite ends of the presser plate in directions away from the stamp-making object material.

According to this construction of a preferred embodiment, the ink ribbon urged against the stamp-making object material by the presser plate is not adversely affected by the ends of the stamp-making object material. That, is if the ink ribbon is set such that it is bent to the stamp-making object material side from the ends of the stamp-making object material, the ink ribbon is affected by the ends of stamp-making object material. In such a case, if the ends of the stamp-making object material are not accurately at right angles to the stretch of the ink ribbon (which depends on the accuracy of shaping and mounting of a stamp-making object material), some portion of the ink ribbon is urged strongly against corresponding part of the ends of the stamp-making object material, while another portion of the ink ribbon is urged weakly against corresponding part of the same, which makes t he ink ribbon liable to forming wrinkles thereon.

Preferably, the opposite ends of the presser plate are each beveled to form an arcuate surface, the ink ribbon being in contact with the arcuate surface of each of the opposite ends of the presser plate, when the presser plate urges the ink ribbon against the stamp-making object material.

This construction makes stress concentration hard to occur when the ink ribbon and the ends of the presser plate are brought into contact with each other. Therefore, even if some portion of the ink ribbon is urged strongly against corresponding part of the ends of the presser plate, while another portion of the ink ribbon is urged weakly against corresponding part of the same, the difference in the urging force is not large, so that wrinkles do not readily develop on the ink ribbon.

Preferably, the tension-regulating means includes a guide-moving mechanism for moving the guide means in a direction of loosening the ink ribbon, and a tensioning mechanism for applying a stretching force to the ink ribbon loosened by operation of the guide-moving means to a degree slight but sufficient not to produce any wrinkles on the ink ribbon.

According to this construction of a preferred embodiment, the tension-regulating means can be operated in a state in which the ink ribbon-feeding means cease to operate, so that the structure and manner of control of the tension-regulating means can be simplified. Further, when the ink ribbon is brought into intimate contact with the stamp-making object material, the guide means is out of the range of operation of the tension mechanism. Therefore, it is possible to further increase the intimacy of the ink ribbon.

Preferably, the translating means operates to make a translation of the presser plate to the stamp-making object material, and at the same time includes a brake mechanism for braking the translation of the presser plate.

According to this construction of a preferred embodiment, the translation of the presser plate is braked by the brake mechanism so that the presser plate moves relatively slowly. As a result, after the guide-moving mechanism and the tensioning mechanism, which are linked to the brake mechanism, complete their operations, the ink ribbon can be brought into intimate contact with the stamp-making object material by the presser plate. Therefore, the ink ribbon can be stably brought into intimate contact with the stamp-making object material in a reliable manner without forming any wrinkles thereon.

Preferably, the presser plate is linked to the translating means by way of a resilient member.

According to this construction of a preferred embodiment, the presser plate is urged against the stamp-making object material, with the ink ribbon caught thereon in such a manner that the ink ribbon is sandwiched between the presser plate and the stamp-making object material, by the urging force of the resilient member, in a manner following the stamp-making object material. Therefore, it is possible to further enhance the intimacy of contact between the ink ribbon and the stamp-making object material. Further, the resilient member prevents the presser plate from bounding back from plate-making object material when the former strikes the latter, whereby the ink ribbon can be urged against the stamp-making object material in a stable manner.

Preferably, the resilient member is arranged away from part of the presser plate corresponding to a surface of the stamp-making object material for being exposed to the light.

According to this construction of a preferred embodiment, the resilient member does not obstruct the path of light for exposure, and it is possible to prevent the stamp-making object material from being irregularly exposed to the light.

Preferably, the presser plate is slightly bent to a side remove from the presser plate-making object material.

According to this construction of a preferred embodiment, when the ink ribbon is urged by the presser plate against the stamp-making object material with the ink ribbon being sandwiched between the stamp-making object material and the presser plate, the presser plate strikes the stamp-making object material starting with a central area of the surface of the stamp-making object material. That is, the presser plate urges the ink ribbon against the exposure surface of the stamp-making object material such that the ink ribbon is spread thereon.

Preferably, the guide means comprises a first guide member arranged at a location upstream of the presser plate along a feed path of the ink ribbon and a second guide member arranged at a location downstream of the presser plate along the feed path of the ink ribbon, the first guide member and the second guide member each having a sliding contact portion in sliding contact with the ink ribbon and a fixed support member for supporting the sliding contact portion, the sliding contact portion being swingable in a direction of bending the ink ribbon with respect to the fixed support member.

According to this construction of a preferred embodiment, even if mounting accuracy of the guide means is not high, and even if dimensional variation occurs among individual guide means due to manufacturing process, the sliding contact portion swings in a suitable manner by the force received from the ink ribbon. Therefore, when the ink ribbon is guided into space between the presser plate and the stamp-making object material in parallel therewith, the motion of the ink ribbon along the width thereof is not restricted, and at the same time it is possible to prevent the ink ribbon from falling off the sliding contact portion.

To attain the first object, according to a second aspect of the invention, there is provided a stamp-making apparatus comprising ribbon-feeding means having one end portion and another end portion, for rolling out an ink ribbon wound around the one end portion to a position facing a stamp-making object material, and then rolling up the ink ribbon around the another end portion, and path-changing means arranged between the one end portion and the another end portion of the ribbon-feeding means for bending a feed path of the ink ribbon, wherein the path-changing means has a sliding contact portion for being brought into sliding contact with the ink ribbon, the sliding contact portion having a convex shape.

According to this construction of a preferred embodiment, since the sliding contact portion has a convex shape, similarly to the convex shape of a pulley for a belt, the force acts on the ink ribbon being fed to move the ink ribbon toward the center of the sliding contact portion, whereby it is possible to prevent the ink ribbon from falling off the sliding contact portion. That is, even if the path-changing means formed by a pin, a roller, or the like is not accurately arranged with respect to the ink ribbon, or even if the feed path of the ink ribbon is long, no difficulty arises to the feeding of the ink ribbon. Moreover, the convex shape makes an intermediate portion of the ink ribbon along its width slightly longer than side portions, so that it is possible to suppress the development of wrinkles.

To attain the first object, according to a third embodiment of the invention, there is provided a stamp-making apparatus comprising ribbon-feeding means having one end portion and another end portion, for rolling out an ink ribbon wound around the one end portion to a position facing a stamp-making object material, and then rolling up the ink ribbon around the another end portion; and path-changing means arranged between the one end portion and the another end portion of the ribbon-feeding means for bending a feed path of the ink ribbon, wherein the path-changing means has a sliding contact portion for being brought into sliding contact with the ink ribbon and a pair of flange portions provided at opposite ends of the sliding contact portion for guiding the ink ribbon along a width of the ink ribbon, the pair of flange portions each being sloped to the sliding contact portion.

According to this construction of a preferred embodiment, the ink ribbon can be suitably guided when it is fed, and at the same time, even if the ink ribbon becomes loose during feeding of the same, it is possible to prevent the ink ribbon from falling off the sliding contact portion. Further, since the flange portions are sloped to the sliding contact portion, even if the ink ribbon is deviated laterally, the slope acts to develop a force for returning the ink ribbon to its proper position, whereby the ink ribbon can be fed in an accurate and stable manner.

To attain the second object of the invention, according to a fourth aspect of the invention, there is provided a function changeover mechanism for a stamp-making apparatus including a lid, a print head, a platen roller, and a presser plate, the function changeover mechanism having first link means for locking/unlocking the lid, second link means for moving the print head to and from the platen roller, and third link means for moving the presser plate forward and backward, the function changeover mechanism being capable of switching between an open position in which the first link means is operated to open the lid for permitting a stamp-making object material to be set in the stamp-making apparatus, a plate-making position in which the second link means is operated to bring the print head into contact with the platen roller for printing, and an exposure position in which the third link means is operated to move the presser plate forward for exposure of the stamp-making object material to light.

The function changeover mechanism according to the fourth aspect of the invention is characterized by comprising a single operating element for causing the first link means, the second link means, and the third link means to be operated, and a lock mechanism for inhibiting the first link means from shifting to the open position when the third link means has been set to the exposure position.

According to this construction of a preferred embodiment, by the use of the single operating element, the function of the stamp-making apparatus can be changed via the first link means, the second link means, and the third link means, to the open position, the plate-making position, and the exposure position, respectively, and at the same time, it is possible to inhibit different positions from being simultaneously selected. Further, since the lock mechanism prevents the first link means from being shifted to the open position when the third link means has been to the exposure position, it is possible to lock the lid in the closed state during exposure.

Preferably, the lock mechanism inhibits the first link means from shifting to the open position when the second link means has been set to the plate-making position.

According to this construction of a preferred embodiment, since the lock mechanism prevents the first link means from being shifted to the open position when the second link means has been to the plate-making position, it is possible to lock the lid in the closed state during printing.

Preferably, the lock mechanism comprises a locking member for being shifted between a blocking position for blocking switching operation of the operating element and a permitting position for permitting the switching operation of the operating element so as to engage or disengage with the operating element, and a linking member for shifting the locking member to the blocking position in a manner linked to opening of the lid and for shifting the locking member to the permitting position in a manner linked to closing of the lid.

According to this construction of a preferred embodiment, since the locking is effected by blocking of changeover operation of the operating element linked to opening of the lid, the lock mechanism can be simplified in construction, and at the same time, the operator can be instantly notified of his wrong operation. Further, while the lid is locked so that it cannot be opened during printing and exposure, it is impossible to shift the operating element to the plate-making position and the exposure position when the lid is open, whereby the printing or exposure can be inhibited when the lid is open.

Preferably, the operating element can further assume an off position between the plate-making position and the exposure position, and the open position, in which the second link means is operated to move the print head away from the platen roller.

According to this construction of a preferred embodiment, by setting the apparatus to the off position when the printing device is not driven, it is possible to space the print head away from the platen roller when the lid is closed, whereby it is possible to prevent deformation of the platen roller or like inconveniences. Further, since the direction of operation of the operating element from the off position to the plate-making position and the exposure position is opposite to the direction of operation of the same from the off position to the open position, it is possible to ergonomically lessen wrong operations.

Preferably, the operating element is formed by a knob, and is switchable to each of the open position, the off position, the plate-making position, and the exposure position by normal or reverse rotation thereof.

According to this construction of a preferred embodiment, the rotational operation of the knob can effect changeover to each position. Therefore, it is possible to lessen wrong operations, such as an overrun of a desired position.

Preferably, the function changeover mechanism includes main link means having one end and another end, the main link means being rotatable about a support, the one end being engaged with the operating element and the another end being engaged with the first link means, the second link means, and the third link means, with the support being positioned between the one end and the another end of the main link means.

According to this construction of a preferred embodiment, by suitably changing the relative position between the main link means and the first to third link means, as well as the state of engagement between the same, it is possible to cause each of the first to third link means to perform a desired operation, by a fixed amount of operation of the operating element to each position. That is, by effecting engagement between the main link and each of the first to third link means by the use of a cam, it is possible to make desired link means stationary. Further, the rotation of the main link means can be transmitted while changing a direction of operation, and the operating stroke of the main link can be adjusted.

Preferably, the changeover mechanism includes cam means, and the third link means is movable forward and backward and linked to the main link means via the cam means, the third link means being urged toward the cam means, the main link means moving the third link means forward and backward by way of the cam means.

According to this construction of a preferred embodiment, by causing the third link means to move forward or backward by way of the cam means by the main link means, it is possible to make the stroke of the third link means longer. That is, even if the fulcrum of the main link is made closer to the third link to make the operating element light to operate based on the principle of leverage, the cam can lengthen the stroke of the third link means.

To attain the third object, according to a fifth aspect of the invention, there is provided an exposure system for a stamp-making apparatus, the exposure system having an exposure light source, and exposure means for exposing a stamp-making object material to light from the exposure light source by the use of an ink ribbon formed with a stamp image as a mask, wherein the exposure light source comprises a self-heating hot-cathode tube and an overtemperature cutout in the form of a column for thermally detecting abnormality of the self-heating hot-cathode tube, the overtemperature cutout being brought into contact with the self-heating hot-cathode such that a longitudinal axis of the overtemperature cutout being crosswise to a longitudinal axis of the self-heating hot-cathode tube.

According to this construction of the fifth aspect of the invention, the self-heating hot-cathode tube and the overtemperature cutout are in point contact with each other, so that it takes time for heat from the self-heating hot-cathode tube to spread within the overtemperature cutout. Therefore, the heat-detecting performance of the overtemperature cutout is not deteriorated, and at the same time the immediate conduction of heat from the self-heating hot-cathode tube to the overtemperature cutout is suppressed. As a result, the self-heating hot-cathode tube does not cause a delayed rise in the quantity of light generated by the self-heating hot-cathode tube when it starts to operate.

Preferably, the overtemperature cutout is urged by a spring toward the self-heating hot-cathode tube.

According to this construction of a preferred embodiment, even if there is a slight change in the location of the self-heating hot-cathode tube caused by replacement or vibrations to the same, it is possible to make the overtemperature cutout constantly in contact with the self-heating hot-cathode tube.

To attain the third object, according to a sixth aspect of the invention, there is provided an exposure system for a stamp-making apparatus, the exposure system having an exposure light source, and exposure means for exposing a stamp-making object material to light from the exposure light source by the use of an ink ribbon formed with a stamp image as a mask, wherein the exposure light source comprises a self-heating hot-cathode tube and an overtemperature cutout for thermally detecting abnormality of the self-heating hot-cathode tube, the overtemperature cutout being arranged in the vicinity of an end of the self-heating hot-cathode such that the overtemperature cutout being spaced from the self-heating hot-cathode tube.

According to this construction of the first aspect of the invention, no thermal loss due to conduction of heat from the self-heating hot-cathode tube to the overtemperature cutout occurs, so that the self-heating of the self-heating hot-cathode tube is promoted to improve the rise in the quantity of light generated by the same.

To attain the third object, according to a seventh aspect of the invention, there is provided an exposure system for stamp-making apparatus, the exposure system having an exposure light source, and exposure means for exposing a stamp-making object material to light from the exposure light source by the use of an ink ribbon formed with a stamp image as a mask, wherein the exposure light source comprises a self-heating hot-cathode tube and an overtemperature cutout for thermally detecting abnormality of the self-heating hot-cathode tube, the overtemperature cutout being arranged on a surface of a member which is located in the vicinity of an end of the self-heating hot-cathode tube and heated by the self-heating hot-cathode tube to a higher temperature than any other member associated with self-heating hot-cathode tube, the member having a possibility of melting due to an abnormal heat generated by the self-heating hot-cathode tube, the surface of the member facing toward the self-heating hot-cathode tube.

According to this construction of the seventh aspect of the invention, no thermal loss due to conduction of heat from the self-heating hot-cathode tube to the overtemperature cutout occurs, so that the self-heating of the self-heating hot-cathode tube is promoted to improve the rise in the quantity of light generated by the same. Further, it is possible to positively prevent a member which is located close to the end of the self-heating hot-cathode tube and has a possibility of melting from being melted due to an abnormal heat generated by the self-heating hot-cathode tube.

To attain the third object, according to an eighth aspect of the invention, there is provided an exposure system for a stamp-making apparatus, the exposure system having an exposure light source, and exposure means for exposing a stamp-making object material to light from the exposure light source by the use of an ink ribbon formed with a stamp image as a mask, wherein the exposure light source comprises a self-heating hot-cathode tube and an overtemperature cutout for thermally detecting abnormality of the self-heating hot-cathode tube, the overtemperature cutout being arranged close to the self-heating hot-cathode tube, the exposure light source having a cutout cover at a location of the overtemperature cutout for enclosing the overtemperature cutout and a portion of the self-heating hot-cathode tube close to the overtemperature cutout.

According to this construction of the eighth aspect of the invention, the overtemperature cutout is not in contact with the self-heating hot-cathode tube, so that it is possible to prevent heat from directly leak to the overtemperature cutout. On the other hand, as for the overtemperature cutout, heat is prevented from escaping therefrom, whereby it is possible to cause the temperature of overtemperature cutout to follow a change in the temperature of the self-heating hot-cathode tube.

To attain the third object, according to a ninth aspect of the invention, there is provided an exposure system for a stamp-making apparatus, the exposure system having an exposure light source, and exposure means for exposing a stamp-making object material to light from the exposure light source by the use of an ink ribbon formed with a stamp image as a mask, wherein the exposure light source comprises a self-heating hot-cathode tube and an overtemperature cutout for thermally detecting abnormality of the self-heating hot-cathode tube, the overtemperature cutout being arranged close to the self-heating hot-cathode tube, the exposure light source having a collector for converging light from the self-heating hot-cathode tube onto the overtemperature cutout.

According to this construction of the ninth aspect of the invention, it is possible to prevent heat from directly leak to the overtemperature cutout. On the other hand, as for the overtemperature cutout, heat around the self-heating hot-cathode tube can be converged onto the overtemperature cutout, whereby it is possible to cause the temperature of overtemperature cutout to follow a change in the temperature of the self-heating hot-cathode tube.

In the exposure system according to the fifth to ninth aspects of the invention, preferably, the stamp-making object material has a stamp-making surface formed by an ultraviolet-curing resin, the self-heating hot-cathode tube is formed by an ultraviolet ray tube.

According to this construction of a preferred embodiment, since the rise of the quantity of light generated by the self-heating hot-cathode tube is excellent, it is possible to reduce the curing time of the ultraviolet-curing resin, so that the stamp can be formed on the stamp-making object material in a short time period.

To attain the fourth object, according to a tenth aspect of the invention, there is provided a stamp-making apparatus having a pocket in which a stamp-making object material in the form of a pillar is mounted, the stamp-making object material having a stamp-making surface at one end thereof, and a reverse side surface parallel to the stamp-making surface, the stamp-making object material-detecting device detecting that the stamp-making object material is mounted in the pocket.

The stamp-making object material-detecting device according to the tenth aspect of the invention is characterized by comprising detecting means arranged to face toward a central portion of the reverse side surface of the stamp-making object material mounted in the pocket to thereby detect whether the stamp-making object material is mounted in the pocket.

According to this construction of the tenth aspect of the invention, a portion of the stamp-making object material used for the detecting the presence thereof is located in the center of the back (reverse side surface) of the stamp-making object material. Therefore, even if different types of stamp-making object materials having various shapes are received, so long as the center position of a stamp-forming surface of the stamp-making object material on which the stamp is formed is identical, the position of the detecting device is not outside a range corresponding to the back of the stamp-making object material, so that the mounting of the stamp-making object material can be positively detected. In short, it is possible to detect any of different types of stamp-making object materials in a reliable manner, which have various shapes and are mounted such that the center position of the stamp-making surface of each stamp-making object material is identical.

To attain the fourth object, according to an eleventh aspect of the invention, there is provided a stamp-making object material-detecting device for a stamp-making apparatus having a pocket in which a stamp-making object material in the form of a pillar is mounted, the stamp-making object material having a stamp-making surface at one end thereof, and a reverse side surface parallel to the stamp-making surface, the stamp-making object material-detecting device detecting that the stamp-making object material is mounted in the pocket.

The stamp-making object material-detecting device according to the eleventh aspect of the invention is characterized by comprising detecting means arranged to face toward any of end faces of the stamp-making object material which are parallel to a direction of mounting of the stamp-making object material to thereby detect whether the stamp-making object material is mounted in the pocket.

According to this construction of the stamp-making object material-detecting device according to the eleventh aspect of the invention, it is possible to detect the stamp-making object material even if it is not inserted to the innermost part of the pocket. That is, it is possible to positively detect different types of the stamp-making object material having various shapes each of which is mounted with reference to a portion or site of the stamp-making object material other than a forward end surface of the stamp-making object material in the direction of mounting of the same.

Preferably, the detecting means comprises a mechanical switch for detecting the stamp-making object material, the mechanical switch having a detecting tip, and detecting the stamp-making object material by causing the detecting tip to project toward the stamp-making object material for abutment thereon.

According to this construction of a preferred embodiment, by employing the mechanical switch, it is possible to detect a stamp-making object material in a reliable manner. That is, the pocket for mounting the stamp-making object material therein is part for being opened to the outside, so that dust or the like can accumulate therein. However, the mechanical switch is different from an optical sensor the like and capable of positively detecting the stamp-making object material in spite of the presence of such dust or the like.

Preferably, the pocket is provided with a lid, the mechanical switch being projected toward the stamp-making object material for abutment thereon in a manner linked to closing of the lid.

According to this construction of a preferred embodiment, the mechanical switch does not obstruct the mounting or removal of the stamp-making object material in or from the pocket, so that the mounting or removal of the stamp-making object material can be easily effected. Further, by utilizing manual closing operation of the lid is utilized for causing the switch to strike or abut the stamp-making object material.

Preferably, the mechanical switch comprises a switch holder, a switch top mounted on the switch holder for forward and backward movement, a switch base, and a switch body mounted on the switch base for being in contact with the switch top for turning on and off according to the forward and backward movement of the switch top.

According to this construction of a preferred embodiment, by changing the shape of the switch top, a manner of provision or location of one end of a switch top for abutment can be made dependent on an object to be accessed, while a manner of provision or location of the switch body can be made dependent on the switch base. That is, the degree of freedom of the manner of provision or location of the switch body can be increased.

Preferably, the mechanical switch comprises a plurality of mechanical switches, the stamp-making object material is formed with type-detecting holes for escaping abutment of predetermined ones of the plurality of mechanical switches, the correspondence of the type-detecting holes to the predetermined ones of the plurality of mechanical switches varying with a type of the stamp-making object material.

According to this embodiment, since the correspondence of the type-detecting holes to the predetermined ones of the plurality of mechanical switches varies with a type of the stamp-making object material. It is possible to detect not only the mounting of the stamp-making object material but also the type of the stamp-making object material mounted in the pocket.

To attain the fourth object, according to a twelfth embodiment of the invention, there is provided a stamp-making object material-detecting device comprising a plurality of switches, a stamp-making object material having an abutment surface having a width corresponding to at least one of the plurality of switches, portions of the abutment surface of the stamp-making object material corresponding to the at least one of the plurality of switches each being either a hole portion formed with a hole for escaping abutment of a corresponding one of the at least one of the plurality of switches or a no-hole portion for receiving abutment of a corresponding one of the at least one of the plurality of switches, the abutment surface being formed with an alternative combination of at least one of the hole portion and the no-hole portion, the combination being selected depending on the width of the abutment surface, and discriminating means for discriminating a combination of signals indicative of hole portions and signals indicative of no-hole portions each generated when the plurality of switches are caused to moved toward the abutment surface for abutment thereon, whereby the type of the stamp-making object material can be detected in an alternative manner.

According to this construction of the twelfth aspect of the invention, it is possible to detect various kinds of stamp-making object materials having respective widths can be detected according to their types.

To attain the fourth object, according to a thirteenth embodiment of the invention, there is provided a stamp-making object material-detecting device for a stamp-making apparatus, comprising n (n≧2) switches each operating by being moved to the stamp-making object material for abutment thereon, first stamp-making object material having an abutment surface corresponding to all of the n switches, second stamp-making object material having an abutment surface corresponding to some of the plurality of switches, a remainder of the plurality of switches being moved toward the stamp-making object only to miss the stamp surface, type-detecting holes selectively formed in the first stamp-making object material and the second stamp-making object material in a manner corresponding to respective ones of the n switches to thereby escape abutment of the respective ones of the n switches, wherein discriminating patterns of n bits of data are formed based on a relationship between the n switches and "presence or absence" of the type-detecting hole corresponding to each of the n switches, a state of the remainder of the plurality of switches being moved toward the stamp-making object only to miss the stamp surface being defined as "presence" of the type-detecting hole, ones of the discriminating patterns each including the "presence" of the type-detecting hole being assigned to the second stamp-making object material, and remaining ones of the discriminating patterns being assigned to the first stamp-making object material.

According to this construction of the twelfth aspect of the invention, by assigning discriminating patterns of n bits to various types of stamp-making object materials having different shapes, it is possible to detect the type of each stamp-making object material. To this end, a state of the remainder of the plurality of switches being moved toward the stamp-making object only to miss the stamp surface is defined as "presence" of the type-detecting hole, and ones of the discriminating patterns each including the "presence" of the type-detecting hole are assigned to the second stamp-making object material, while remaining ones of the discriminating patterns are assigned to the first stamp-making object material. This makes it possible to detect even a stamp-making object material which do not have a sufficient width for all the switches, without decreasing the whole number of possible discriminating patterns. This means that it is possible to detect a stamp-making object material having a smaller abutment surface than an area in which the n switches are arranged. Inversely, it is possible to widen the area in which mechanical switches are provided. Further, at least one of the mechanical switches operates to indicate "absence" of the type-detecting hole, the existence of the stamp-making object material is detected.

Preferably, the stamp-making apparatus include an exposure system, the stamp-making object material is a stamp body on which a stamp surface is formed by exposure of the stamp body to tight by the exposure system.

According to this construction of a preferred embodiment, it is possible to discriminate the types of stamp bodies which are different in shape, as well as the mounting of a stamp body in the pocket. As long as various types of sample bodies each of which is to be mounted such that the stamp surface thereof is positioned to an identical location as described above, they can be positively detected.

The above and other objects, features, and advantages of the invention will become more apparent from the following detailed description taken in conjunction with the accompanying drawings.

BRIEF DESCRIPTION OF THE DRAWINGS

FIG. 15A is a front elevation showing an ultraviolet ray source of the exposure system and component parts associated therewith;

FIG. 15B is a side elevation showing the ultraviolet rays source of the exposure system and component parts associated therewith;

FIG. 33A is a diagram showing a pattern for discriminating a stamp body of a small square stamp;

FIG. 33B is a diagram showing a pattern for discriminating a stamp body of a large square stamp;

FIG. 33C is a diagram showing a pattern for discriminating a stamp body of a personal name stamp;

FIG. 33D is a diagram showing a pattern for discriminating a stamp body of a small business stamp;

FIG. 33E is a diagram showing a pattern for discriminating a stamp body of a large business stamp;

FIG. 33F is a diagram showing a pattern for discriminating a stamp body of an address stamp;

FIG. 33G is a diagram showing a pattern for discriminating a maximum size stamp body;

DETAILED DESCRIPTION

The invention will now be described in detail with reference to the drawings showing embodiments thereof.

Figure 1A:
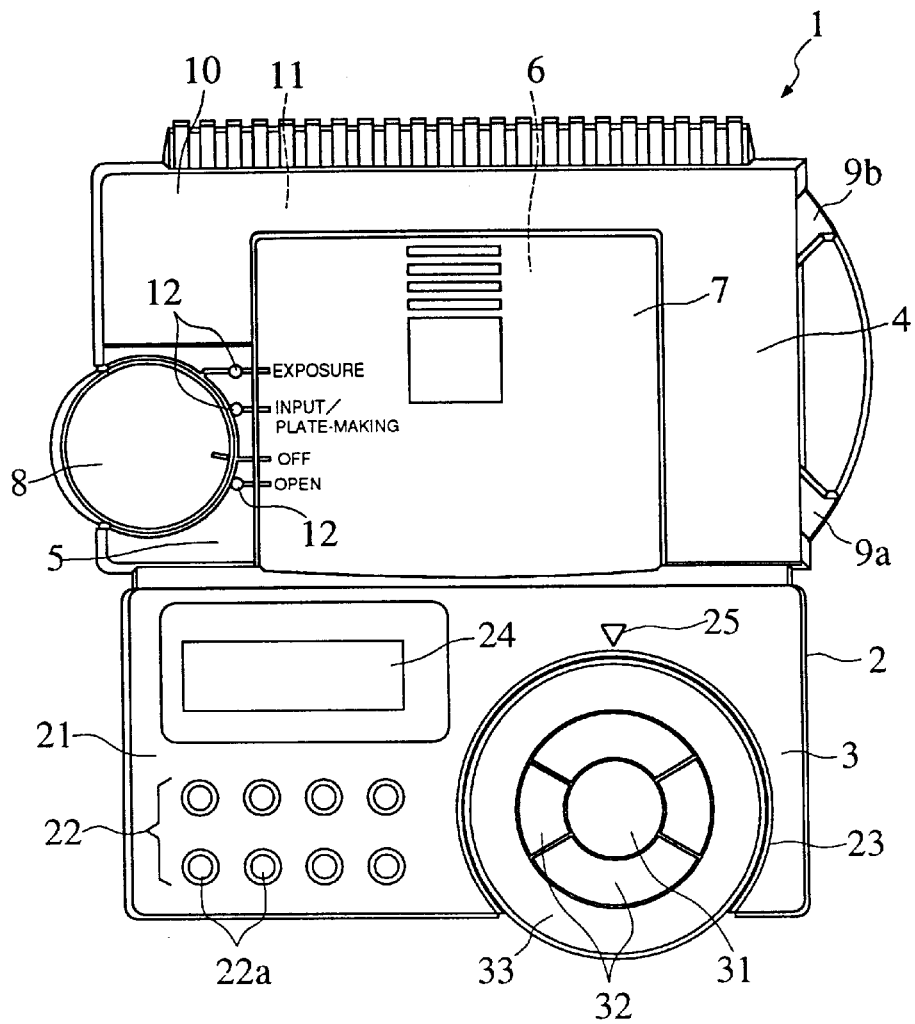
FIG. 1A is a plan view showing an appearance of a stamp-making apparatus equipped with a function changeover mechanism, according to a first embodiment of the invention.
Figure 1B:
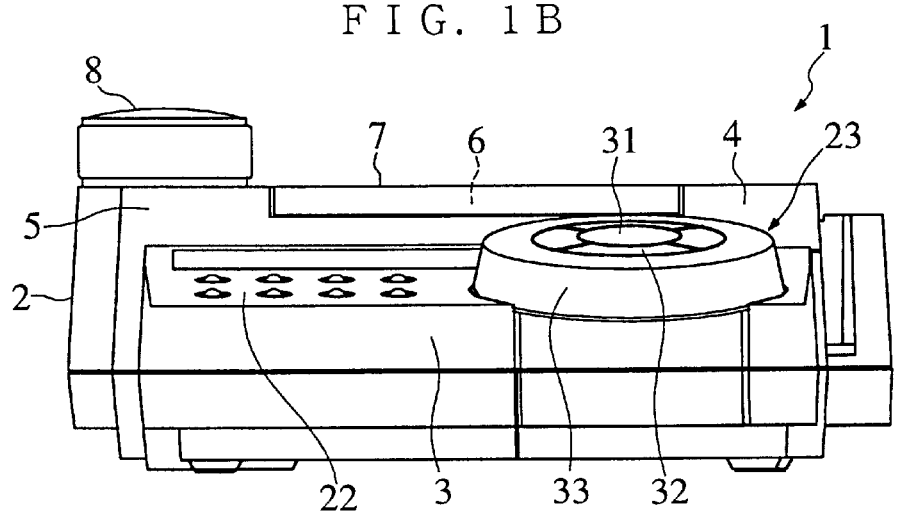
FIG. 1B is a front view showing an appearance of the stamp-making apparatus.

Referring first to FIGS. 1A and 1B, there is shown a stamp-making apparatus 1 equipped with a function changeover mechanism, according to an embodiment of the invention. The stamp-making apparatus makes a desired stamp by exposing a stamp body having a stamp surface made of ultraviolet-curing resin to ultraviolet rays via a mask of an ink ribbon printed with a stamp image including images of characters and pictures. FIG. 1A is a plan view of the apparatus, while FIG. 1B is a front elevation of the same.

As shown in these figures, the stamp-making apparatus 1 includes a casing 2 having upper and lower divisional portions, an electronic block 3 arranged in a front part of the casing 2, and a mechanical block 4 arranged in a rear part of the same. The mechanical block 4 is comprised of a mechanical block body 5, a pocket 6 formed in a central area of the mechanical block for receiving therein a stamp body A as a stamping-making object material from which a stamp is made to mount the same in the mechanical block body 5, and a lid 7 for opening and closing the pocket 6, which is formed with a window. In a left side portion of the mechanical block 4 as viewed in the figures, a function switch (operating knob) 8 is provided for switching the operation of the stamp-making apparatus 1 between printing and exposure, as well as for permitting the lid 7 to be opened. In a right side portion of the mechanical block 4, an inserting slot 9a for feeding a plate-making sheet B from which a stamp character label, referred to hereinafter, is made, and a take-out slot 9b for delivering the plate-making sheet B. Further, the mechanical block 4 has a maintenance cover 10 removably mounted on part thereof outside the pocket 6, and an ink ribbon cartridge 11 carrying an ink ribbon C is mounted under the maintenance cover 10.

The electronic block 3 has an operating block 21 formed on the top thereof and contains an information processing system therein. The operating block 21 includes a push button group 22 and an operating dial 23 which form an input block of the information processing system, and an indicator 24 which forms an output block of the same. The operating dial 23 has a trial structure of an execution key 31 having a circular shape and arranged in the center, a cursor/conversion key 32 having four divisional blocks and arranged along the outer periphery of the execution key 31 to form an annular shape, and a character input key 33 having an annular shape and arranged along the outer periphery of the cursor/conversion key 32. On the surface of the character input key 33, hirakana characters representative of the Japanese syllabary, not shown, are printed. The inputting of stamp characters is carried out by first setting each of desired hirakana characters to a triangle mark 25 by turning the character input key 33, and pushing the execution key 31 whenever each of the desired hirakana characters is set to the triangle mark 25, followed by converting desired ones of the input hirakana characters to kanji characters by operating the cursor/conversion key 32. When desired stamp characters are formed on the display 24, a predetermined button 22a of the push button group 22 is pushed to settle the inputting of the desired characters. The operating dial 23 is constructed such that the character input key 33 alone can rotate in both directions.

Now, a sequence of operations for making a stamp will be briefly described with reference to FIGS. 1A and 1B, and 2. First, the function switch 8 is operated to open the lid 7, and a stamp body A is set in the pocket 6. As the stamp body A is set, the type of the stamp body A is detected by a detecting device 66, described in detail hereinafter, and based on results of the detection, the information processing system controls the input block and the output block thereof. Then, the function switch 8 is operated to shift the function of the apparatus to plate-making, and the push button group 22 and the operating dial 23 are operated to input stamp characters. When the inputting of stamp characters is completed, the plate-making sheet B on which a stamp character label is provided is set by inserting the same into the inserting slot 9a.

Then, a predetermined button 22a of the push button group 22 is operated to cause the apparatus to execute the plate-making operation, i.e. printing of the stamp characters. The printing is effected simultaneously on the ink ribbon C and the plate-making sheet B. When the printing is completed, the ink ribbon C is fed or advanced to set a portion thereof printed with the stamp characters for exposure to ultraviolet rays, and at the same time plate-making sheet B is discharged from the take-out slot 9b. When it is confirmed by the plate-making sheet B that there is no error in the printed stamp characters, the function switch 8 is operated to shift the function of the apparatus to exposure, thereby causing the same to perform exposure of the stamp body to ultraviolet rays. The apparatus may be configured such that after operating the function switch 8, a predetermined button 22a is operated to cause the apparatus to execute exposure.

When the exposure to ultraviolet rays is completed, the function switch 8 is operated to open the lid 7, and then the stamp body A is removed from the pocket 6 to wash the same. The washing completes the stamp. Before or after completion of the stamp, the stamp character label is peeled off the plate-making sheet B to attach the same on the back of the stamp.

Next, the component devices of the stamp-making apparatus 1 will be described, one by one.

The function switch 8 arranged in the mechanical block 4 can be turned clockwise from an "OFF" position in which the apparatus is set on stand-by to an "OPEN" position, as well as anticlockwise from the "OFF" position to an "INPUT/PLATE-MAKING" position, and further to an "EXPOSURE" position (see FIG. 1A). Inversely, the function switch 8 automatically returns anticlockwise from the "OPEN" position to the "OFF" position by the urging force of a spring, and it is manually clockwise turned from the "INPUT/PLATE-MAKING" position and the "EXPOSURE" position to the "OFF position". In the "OPEN" position, the lid 7 provided on the pocket 6 is popped up to open, and in the "INPUT/PLATE-MAKING" position and the "EXPOSURE" position, mechanical operations for a printing block and an exposure block, referred to hereinafter, are carried out. The function switch 8 also serves as a switch for switching between electrical modes of the apparatus. By the electrical mode-switching operation, a corresponding lamp 12 (no lamp for the "OFF" position) provided adjacent to the function switch 8 is lighted to indicate the selected position.

Thus, the function switch 8 constructed as a rotational switch is easier to operate than a linearly-operated type, and it is possible to prevent an wrong operation, such as an overrun. Further, since the direction of rotation of the function switch 8 in a change from the "OFF" position to the "OPEN" position is opposite to that of rotation of the same in a change from the "OFF" position to the "INPUT/PLATE-MAKING" position or the "EXPOSURE" position, this also helps to prevent an wrong operation. As another method of preventing an wrong operation, the operation of shifting between the "OFF" position to the "INPUT/PLATE-MAKING" position or the "EXPOSURE" position may be permitted only in one rotational direction, i.e. in a direction from the "OFF" position toward the "OPEN" position or the "EXPOSURE" position, and a return from the "EXPOSURE" position to the "OFF" position may be effected by making an approximately one turn of the function switch.

The ribbon cartridge 11 is constructed such that it is removable from the mechanical block body 5, and it is replaceable together with a casing thereof when the ink ribbon C is used up. As shown in FIG. 2, the ribbon cartridge 11 has a take-up reel 13 arranged at one end thereof and a supply reel 14 arranged at the other end thereof. The ink ribbon C is rolled out from the supply reel 14, fed along a feed path in the form of a rotation of an inverted-L shape as viewed in FIG. 2, and taken up by the take-up reel 13. The feed path in the form of a rotation of an inverted-L shape has a shorter side portion which the printing block faces and a longer side portion which the exposure block faces. The printing block faces the ink ribbon C and the plate-making sheet B simultaneously, and the exposure block faces the ink ribbon C after being printed with the image of the stamp characters.

The ink ribbon C is comprised of a transparent ribbon tape and ink coated thereon. In the present embodiment, it has a thickness of 6 μm. When the printing block of the apparatus carries out printing on the ink ribbon C, a portion of ink coated on the ink ribbon, which defines a character, is transferred to the plate-making sheet B, whereby the ribbon tape of the ink ribbon C is formed with a negative image by a transparent portion from which the portion of ink defining the character has been transferred, while the plate-making sheet B is formed with a positive image by the transferred portion of ink defining the character. The ink ribbon C is sent forward to the exposure block to use the resulting negative image-formed portion thereof as a mask in carrying out the exposure, while the plate-making sheet B is delivered from the apparatus for confirmation of the stamp characters and affixing the same to the stamp thus made.

Figure 35:
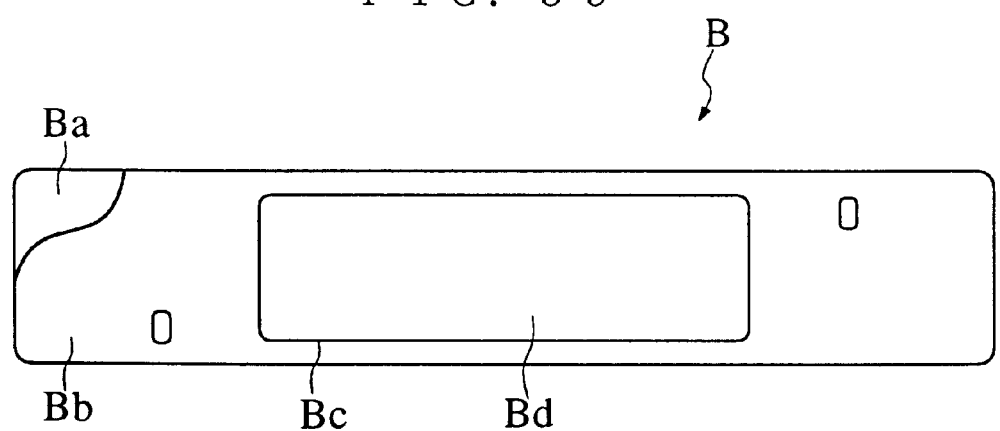
FIG. 35 is a diagram showing a structure of a plate-making sheet.

As shown in FIG. 35, the plate-making sheet B is a laminate of a base sheet Ba and an adhesive sheet Bb, generally in the form of a strip. The adhesive sheet Bb is formed with cutting lines Bc defining a rectangular area. The rectangular area of the adhesive sheet Bb is peeled off the base sheet Ba along the cutting lines Bc to form the stamp character label Bd to be affixed to the back of the stamp. There are provided several types of the stamp body A which are different in shape from each other so as to meet needs of stamps, and there are also provided respective corresponding types of the plate-making sheet which are different in the shape of an area of the stamp character label Bd (shape and size of an area defined by cutting lines).

Figure 34:
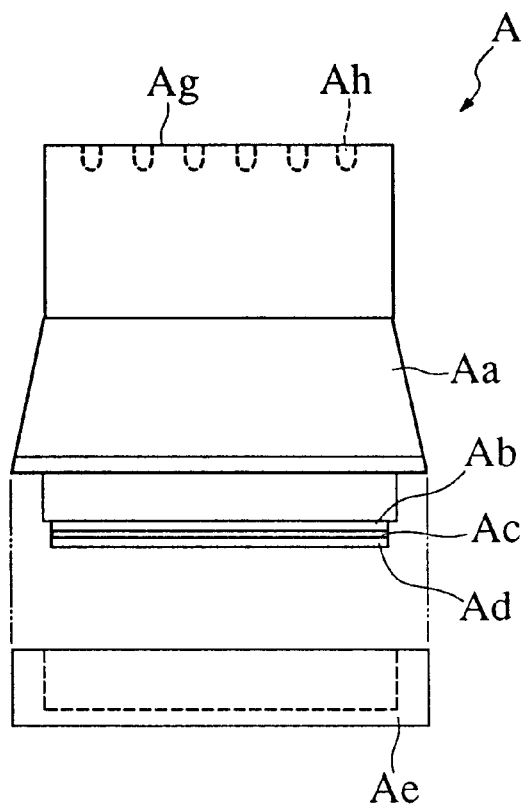
FIG. 34 is a diagram showing a structure of a stamp body.

On the other hand, as shown in FIG. 34, the stamp body A is comprised of a stock Aa (formed of a resin in the present embodiment), a thin sponge Ab (foamed urethane) affixed to a front end of the stock Aa, a non-ultraviolet-curing resin base Ac affixed to the sponge Ab, and an ultraviolet-curing resin affixed to the resin base Ac for forming a stamp surface Ad. The ultraviolet-curing resin portion (stamp surface Ad) of the stamp body A is exposed to ultraviolet rays with the ink ribbon C as a mask, whereby portions of the stamp surface Ad corresponding to the stamp characters are cured. In this state, the stamp body A is taken out of the pocket 6, and washed with water to remove uncured portions of the stamp surface, which are soluble in water, from the stamp surface Ad. Thus the stamp is completed. Symbol Ae in the figure designates a cap made of resin. In stead of the ultraviolet-curing resin, ultraviolet-softening resin may be used. In such a case, the reversed relationship of the ink ribbon C and the plate-making sheet B in respect of positiveness and negativeness makes it possible to make the same stamp as made in the present embodiment.

Figure 2:
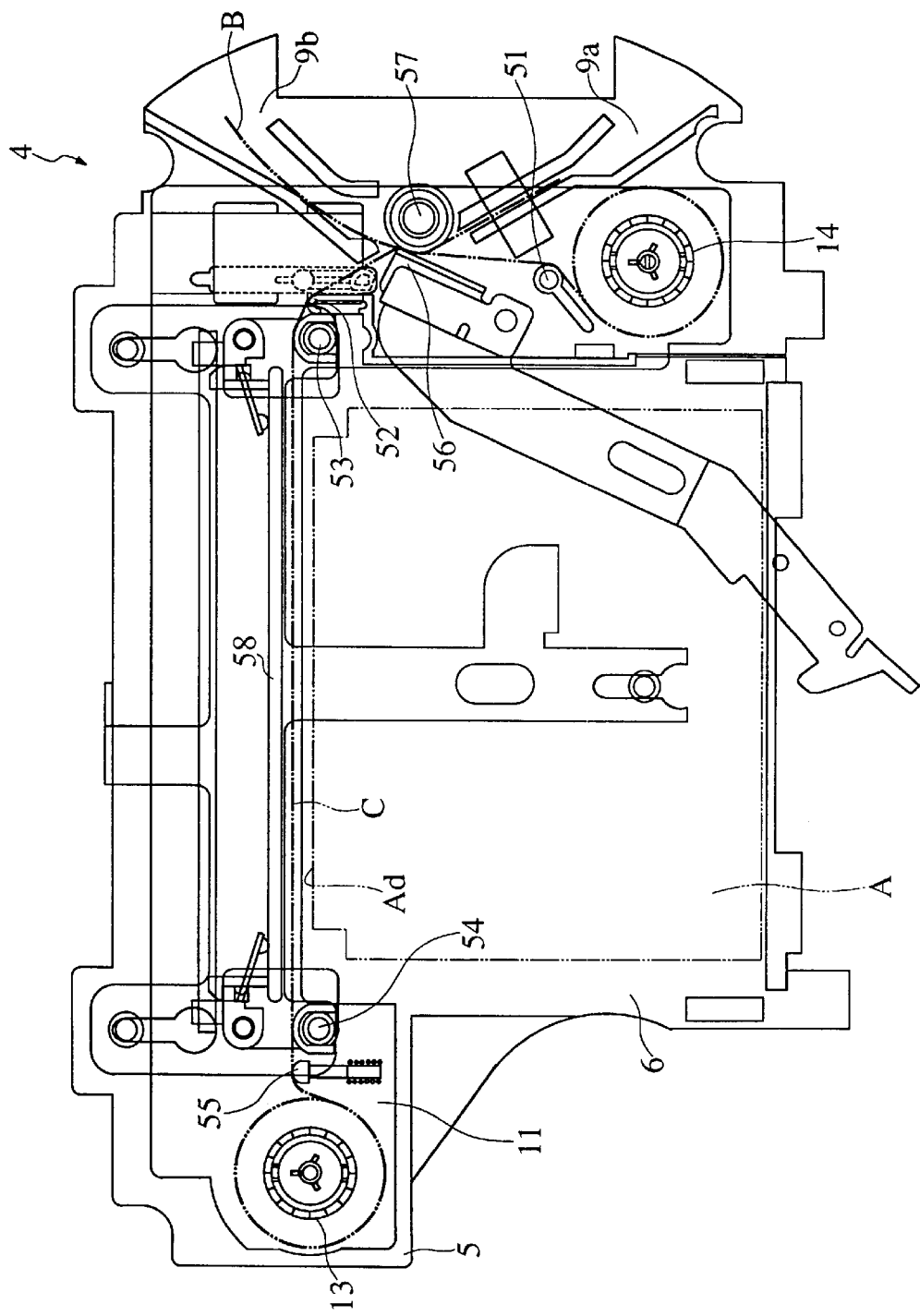
FIG. 2 is a diagram showing an internal construction of a mechanical block of the stamp-making apparatus.

As shown in FIG. 2, in the stamp-making apparatus 1, the ink ribbon C wound around the supply reel 14 is rolled out therefrom, and fed via a first path-setting pin 51 to the printing block, and further via a second path-setting pin 52 and a first guide pin 53 to the exposure block. From the exposure block, the ink ribbon C is advanced to the take-up reel 13 via a second guide pin 54 and a tension pin 55 to be taken up by the take-up reel 13. In the printing block, a print head 56 and a platen roller 57 arranged in a manner sandwiching the ink ribbon C operates to push the ink ribbon C forward while printing a character on the irk ribbon C. In the exposure block, a presser plate 8 holds the ink ribbon C between the stamp body A and itself to carry out the exposure of the stamp body to ultraviolet rays. The second path-setting pin 52 and the tension pin 55 serve as path-changing members for changing the feed path of the ink ribbon with respect to the exposure block, while the first guide pin 53 and the second guide pin 54 serve as guide members for guiding the ink ribbon C through the exposure block.

Figure 3:
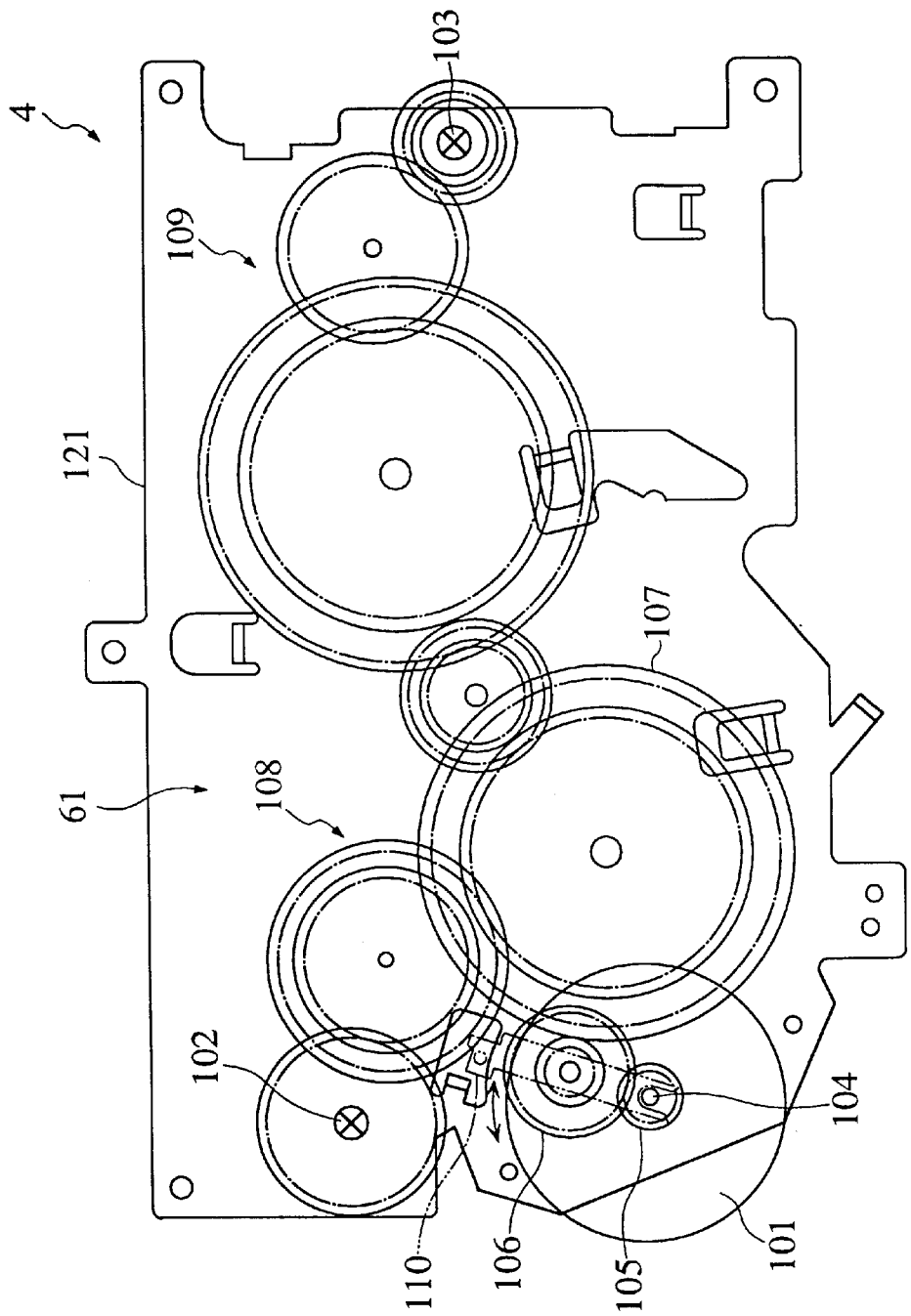
FIG. 3 is a plan view showing a ribbon feeder provided in the mechanical block.
Figure 4:
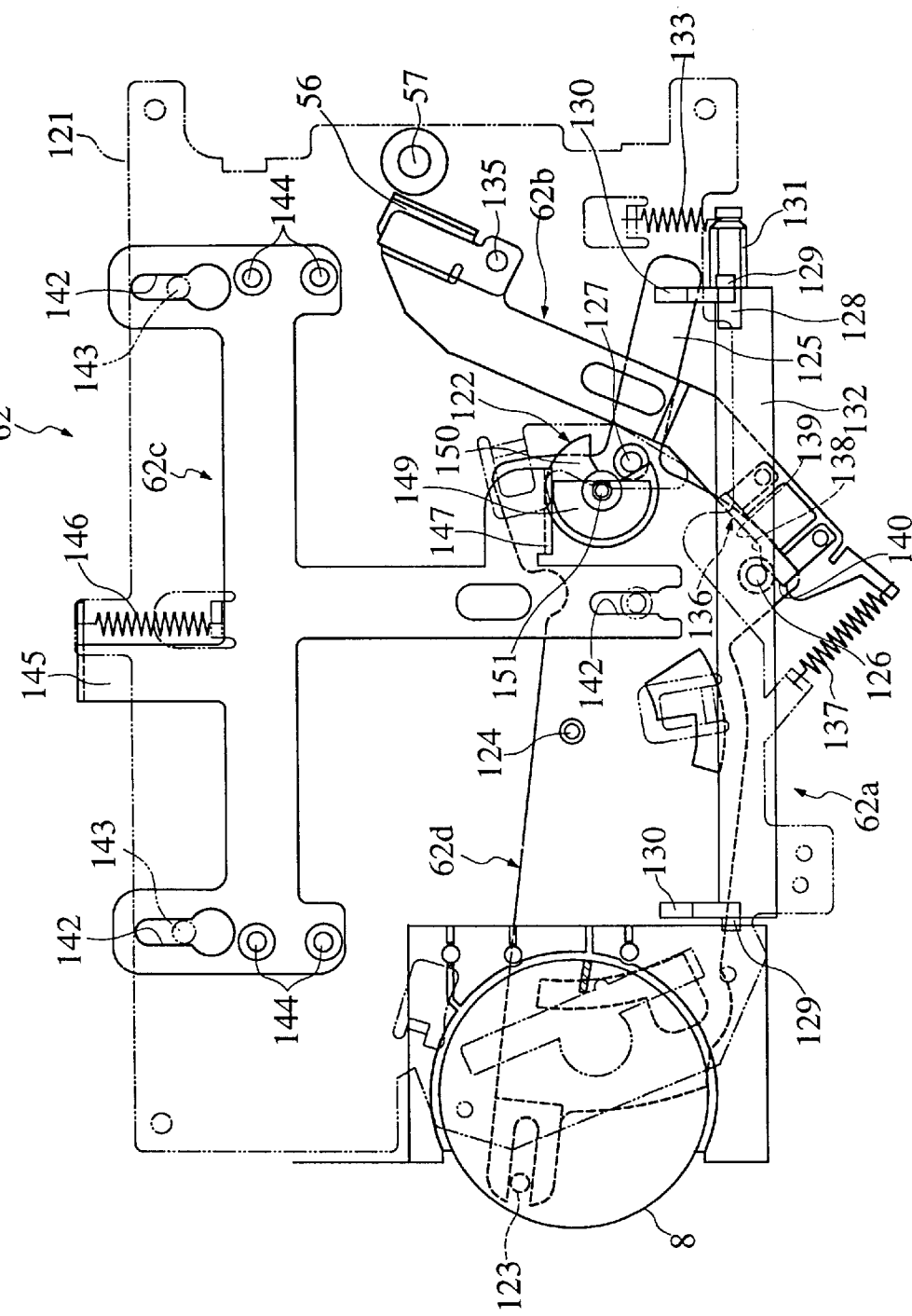
FIG. 4 is a plan view showing a state of a function link mechanism provided in the mechanical part in an "OFF" position.
Figure 5:
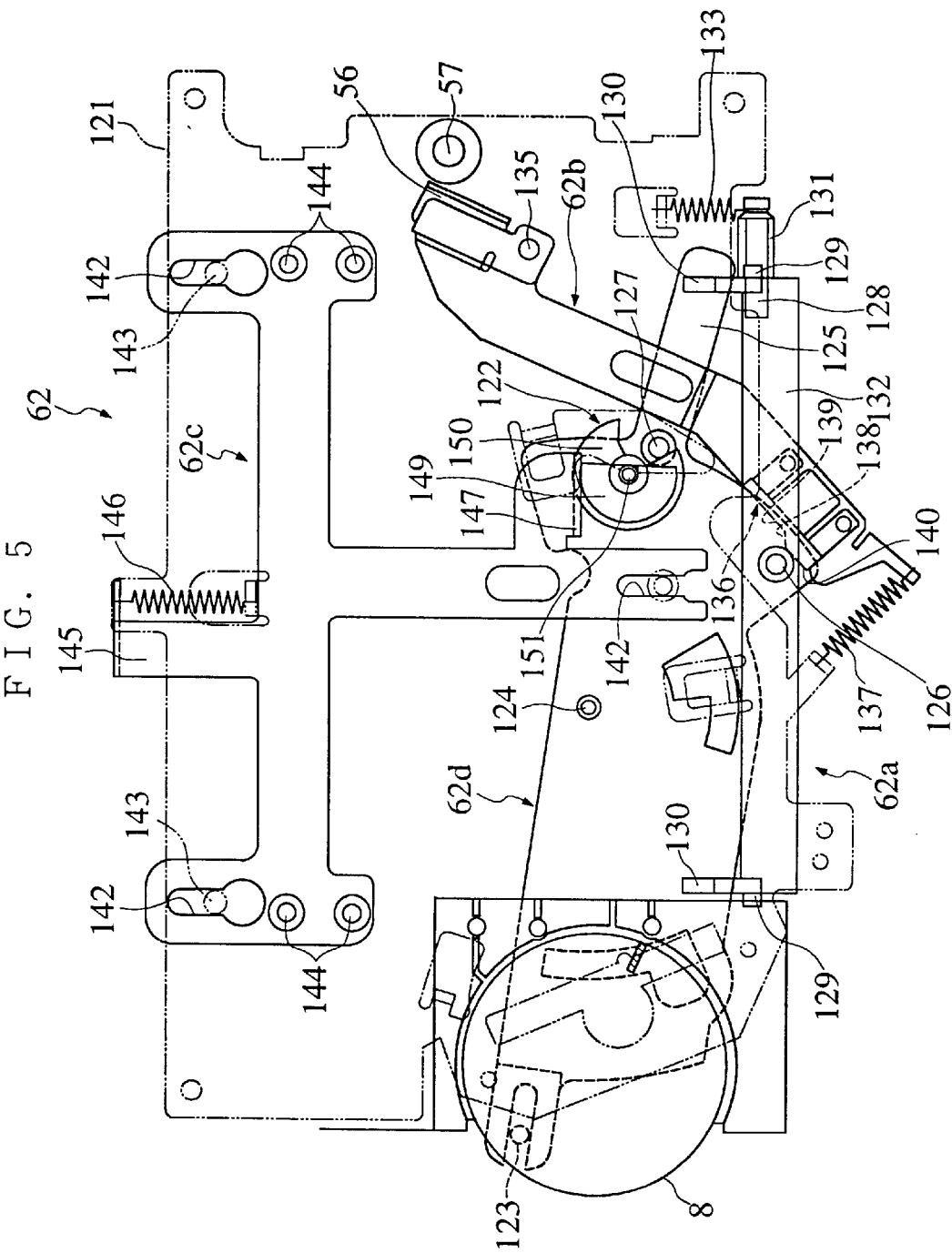
FIG. 5 is a plan view showing a state of the function link mechanism provided in the mechanical part in an "OPEN" position.

As shown in FIG. 3, the mechanical block 4 incorporates a ribbon feeder (ribbon-feeding means) 61 which rotates the take-up reel 13 and the platen roller 57 to feed the ink ribbon C. Further, as shown in FIG. 4, the mechanical block 4 incorporates a function link mechanism 62 comprised of a lid-opening link (first link means) 62a for locking/unlocking the lid 7, a head-moving link (second link means) 62b for moving the print head 56 of the printing block to and from the platen roller 57, a ribbon-holding link (third link means) 62c for moving the presser plate 58 of the exposure block forward or backward, and a main link 62d for actuating the (lid-opening link 62a, the head-moving link 62b and the ribbon-holding link 62c. The function link mechanism 62 and the function switch 8 forms the function changeover mechanism.

First, the ribbon feeder 61 will be described in detail with reference to FIG. 3. The ribbon feeder 61 has a drive motor 101 arranged below the bottom of the function switch 8 as a driving force source, and a reel shaft 102 fitted on the take-up reel 13 and a roller shaft 103 fitted on the platen roller 57 are driven for rotation by the (drive motor 101. More specifically, a ribbon take-up mechanism is provided on the reel shaft 102 side for taking up the ink ribbon, while a ribbon supply mechanism is provided on the roller shaft 103 side (actually, the platen roller 57 and the print head 56). The drive motor 101 has an output shaft 104 on which an output gear 105 is rigidly fitted. The output gear 105 is mated with a driving force-transmitting gear 106, which in turn is mated with a main gear 107. The main gear 107 transmits part of the driving force via a reel reduction gear train 108 to the reel shaft 102 for one route of transmission, and the rest of the driving force via a roller reduction gear train 109 to the roller shaft 103 for the route of transmission.

The output shaft 104 of the drive motor 101 has a clutch arm 110 rotatably supported thereon, and the driving force-transmitting gear 106 is rotatably supported on the clutch arm 110. The clutch arm 110 rotates with rotation of the output shaft 104 in a free-running manner, thereby causing the driving force-transmitting gear 106 to be mated with the main gear 107 in a disengageable manner. That is, when the driving motor 101 rotates, the clutch arm 110 rotates to cause the driving force-transmitting gear 106 to mate with the main gear 107, thereby causing the driving force of the drive motor 101 to be transmitted to the take-up reel 13 and the platen roller 57. Inversely, when the drive motor 101 is not in operation, if torque is input from the take-up reel 13 or the platen roller 57, the driving force-transmission gear 106 is moved away from the main gear 107 to be disengaged therefrom. This makes it possible to easily pull the plate-making sheet B alone from the apparatus by (reversely) rotating the platen roller, without receiving any load of the drive motor 101 when the plate-making sheet B is erroneously inserted into the stamp-making apparatus. Alternatively, the clutch 110 may be rotated in a manner linked to the switching operation of the function switch 8. It should be noted that the reel shaft 102 is a slide shaft which absorbs a change in the circumferential speed of the taken-up ribbon in an increasing direction as the ink ribbon C is taken up by the take-up reel 13 by occurrence of sliding.

Next, with reference to FIGS. 4 to 8, the function link mechanism 62 will be described in detail. The function link mechanism 62 is comprised of a frame 121, the lid-opening link 62a rotatably supported by the frame 121 in a state extending perpendicular to the frame 121, the head-moving link 62b in the form of a plate rotatably supported on the frame 121, the ribbon-holding link 62c in the form of a plate supported on the frame 121 in a manner movable forward and backward, the main link 62d in the form of a plate rotatably supported on the frame 121, and a ribbon-holding cam 122 interposed between the main link 62d and the ribbon-holding link 62c. Various kinds of gears of the ribbon feeder 61 are arranged between the frame 121 and the ribbon-holding link 62c, and the main link 62d is arranged below the frame 121 in a manner extending along therewith.

The main link 62d is engaged with an eccentric pin 123 of the function switch 8 on an input side, and is rotated about a support shaft 124 by rotation of the function switch 8 in a normal or reverse direction. The main link 62d has a tongue 125 integrally formed therewith at an extreme end on an output side, with a first pin 126 provided at a forward end, and a second pin 127 provided at a root of the tongue 125. The tongue 125 is engaged with a lower portion of the lid-opening link 62a, the first pin 126 is engaged with the head-moving link 62b, and further, the second pin 127 is engaged with the ribbon-holding link 62c via the ribbon-holding cam 122.

Thus, the main link 62d is interposed between the function switch and the links 62a, 62b, and 62c, and a manner or state of engagement of the main link 62d with each of the links 62a, 62b, and 62c is properly defined such that each predetermined operation of the function switch 8 corresponds to an operation of each of the links 62a, 62b and 62c, whereby it is possible to cause each of the links 62a, 62b, and 62c to be selectively operated in a desired manner.

Figure 8:
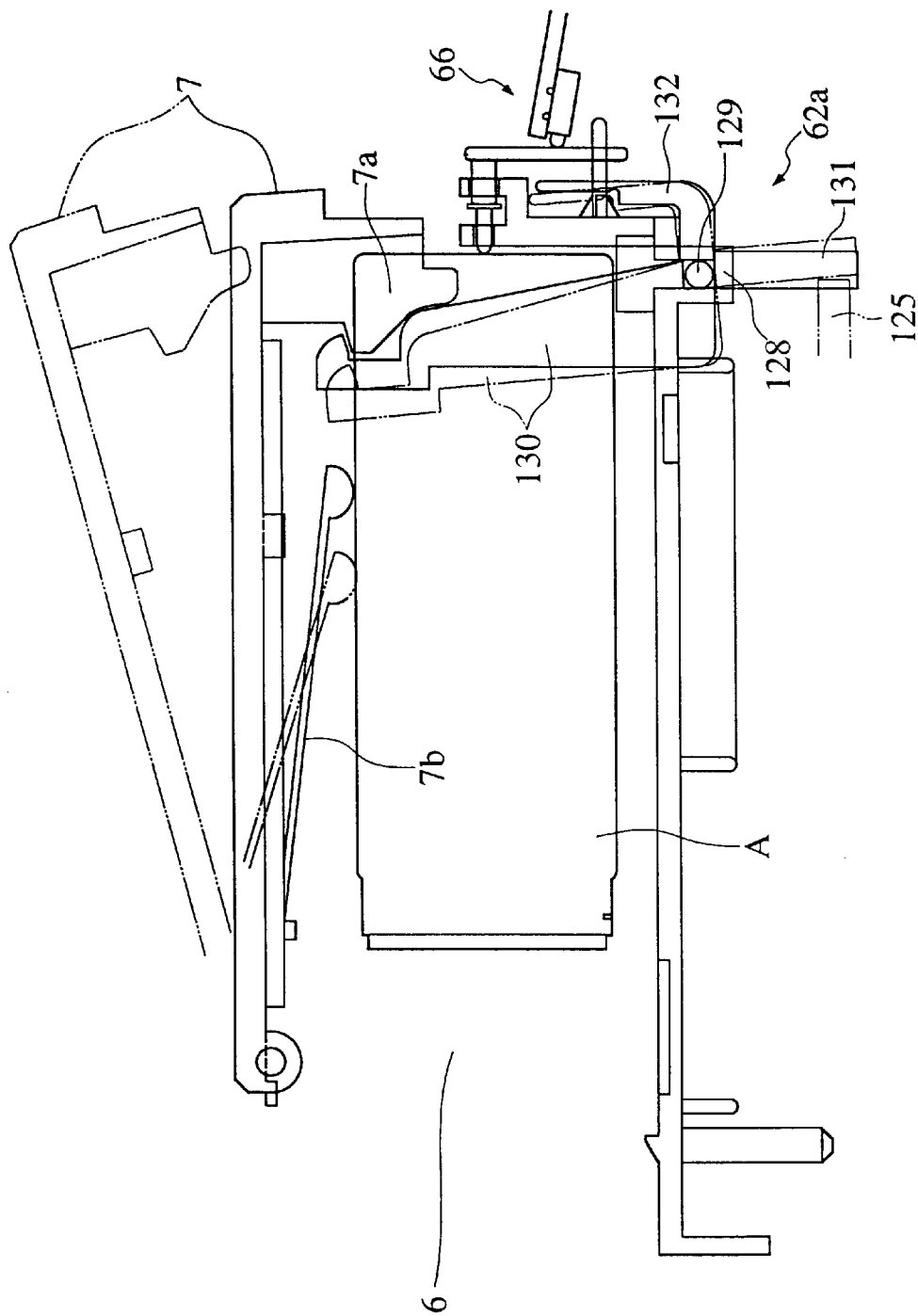
FIG. 8 is a side elevation showing a lid-opening link of the function link mechanism and component parts associated therewith.

The lid-opening link 62a is a one-piece member comprised of an opening link body 128, a pair of support shafts 129, 129 formed at opposite longitudinal ends of the opening link body 128 in a manner projecting therefrom, a pair of hooks 130, 130 extending from the opposite ends of the opening link body 128 toward the lid 7, a lever 131 extending downward from the opening link body 128 in a manner corresponding to the tongue of the main link 62d, and a switching operation portion 132 which extends forward from the opening link body 128 in a bending manner (see FIG. 8). A coiled spring 133 is stretched between the lever 131 and the frame 121 whereby the lid-opening link 62a is urged for rotation in such a direction that the tip of a hook 130 thereof is hooked on a hook catch 7a of the lid 7.

When the function switch 8 is rotated from the "OFF" position to the "OPEN" position, the tongue 125 of the main link 62d is rotated forward to push the lever 131 of the lid-opening link 62a against the pulling force of the coiled spring 133 whereby the hook 130 is disengaged from the hook catch 7a. The underside of the lid 7 has a plate spring 7b mounted thereon for retaining the stamp body A received in the pocket 6 in a stable manner. When the hook 130 is disengaged, the lid 7 is popped upward by a reactionary force of the urging force of the plate spring acting on the stamp body A (see FIGS. 5 and 8). Even when no stamp body A is received within the pocket 6, the lid 7 is popped upward by the action of a lock member 171 of a lock mechanism 63 described hereinafter (see FIG. 10) when the function switch 8 is turned to the "OPEN" position.

When the lid-opening link 62a is disengaged from the lid-opening ink 62a, the switching operation portion 132 causes detecting ends of the detecting device 66 to project into the pocket 6. Then, when the function switch 8 rotated to the "OPEN" position is released, the coiled spring 133 acts by way of the lid-opening link 62a and the main ink 62d such that the function switch 8 automatically returns from the "OPEN" position to the "OFF" position. On the other hand, when the lid 7 is closed, it is pushed toward the pocket 6 against the urging force of the plate spring 7b, whereby the hook 130 of the lid-opening link 62a climbs on the hook catch 7a to be hooked thereon.

The head-moving link 62b is rotated about a support shaft 135 provided at a holding portion of the print head 56, with the print head 56 installed led at one end thereof. The head-moving link 62b is formed with an engaging surface 136 at a tail end, which is brought into contact with the first pin 126 of the main link 62d, and a coiled spring 137 is stretched between the tail end of the head-moving link 62b and the frame 121. The coiled spring 137 urges the one end of the head-moving link 62b for rotation about the support shaft 135 toward the platen roller 57, and at the same time rotationally urges the engaging surface 136 against the first pin 126. The engaging surface 136 includes a sloping surface 138, a first stationary surface 139 provided on the one end side of the sloping surface 138 in a manner forming an arcuate surface concentric with the support shaft 124 of the main link 62d and a second surface 140 provided on the tail end side of the sloping surface 138. When the first pin 126 is brought into contact with the second stationary surface 140 through rotation of the main link 62d, the print head 56 is away from the platen roller 57, whereas when the first pin 126 is brought into contact with the first stationary surface 139, the print head 56 is in contact with the platen roller 57. When the ribbon cartridge 11 is mounted or removed, the head-moving link 62b is further rotated by means of a jig, not shown in the figure, in such a direction that the print head 56 is moved away from the platen roller 57.

Figure 6:
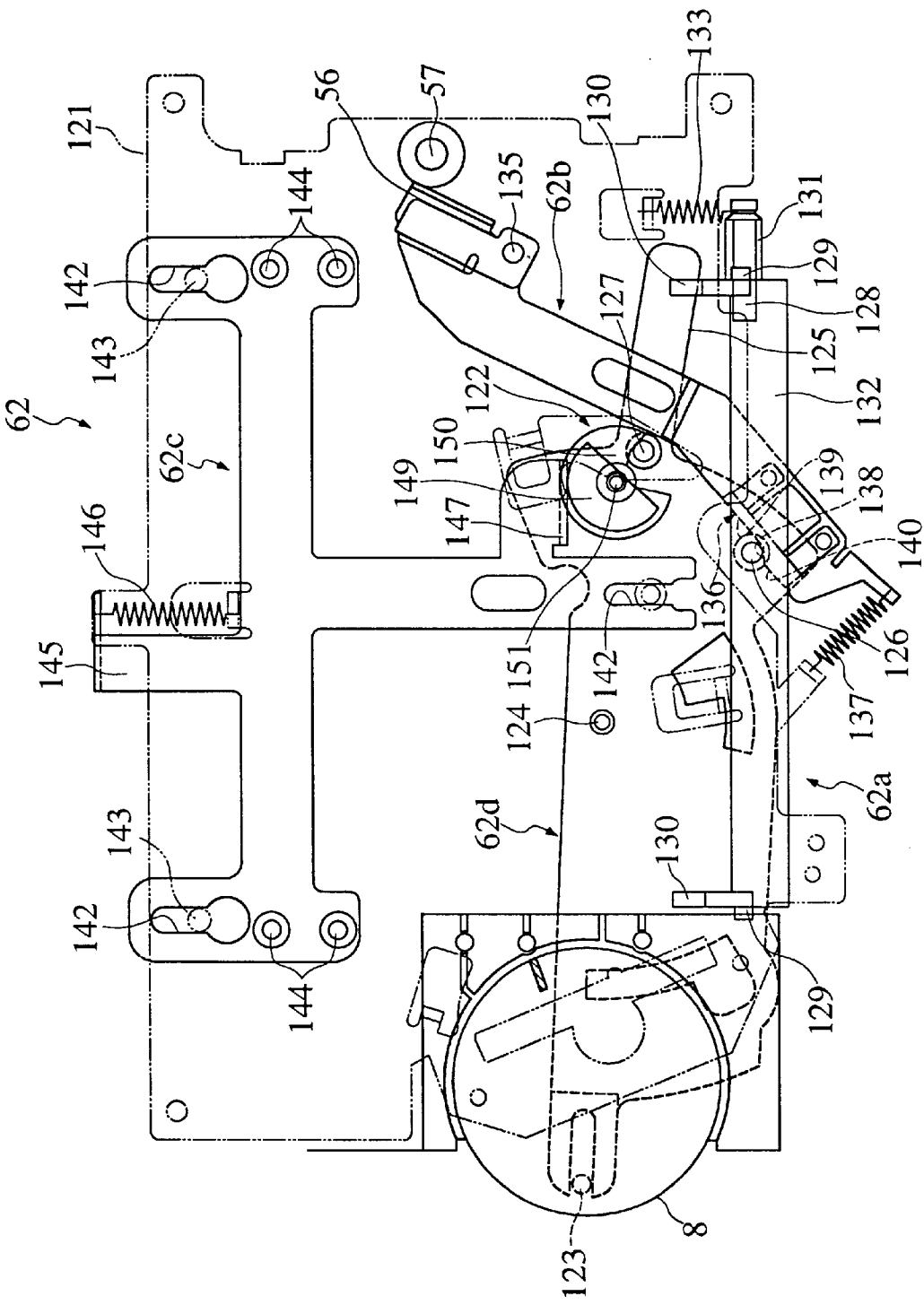
FIG. 6 is a plan view showing a state of the function link mechanism in an "INPUT/PLATE-MAKING" position.

When the function switch 8 is rotated from the "OFF" position to the "INPUT/PLATE-MAKING" position as shown in FIG. 6, the first pin 126 of the main link 62d is moved from the second stationary surface 140 down the sloping surface 138 to the first stationary surface 139, whereby the head-moving link 62b is moved by the urging force of the coiled spring 137 to urge the print head 56 against the platen roller 57. Inversely, when the function switch 8 is rotated from the "INPUT/PLATE-MAKING" position to the "OFF" position, the first pin 126 is moved from the first stationary surface 139 up the sloping surface 138 to the second stationary surface 140, whereby the head-moving link 62b is rotated against the pulling force of the coiled spring 137 to move the print head 56 away from the platen roller 57.

Figure 7:
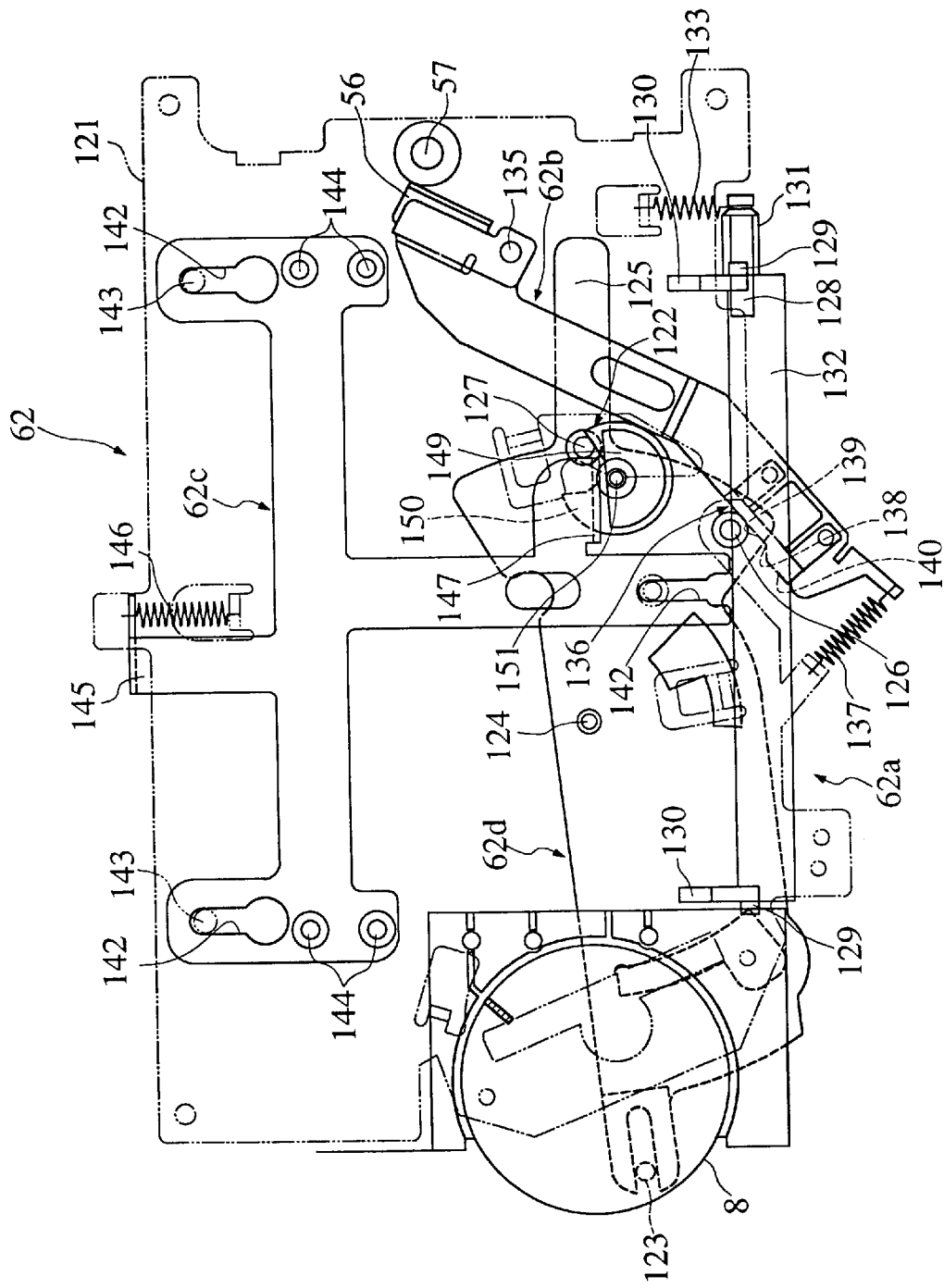
FIG. 7 is a plan view showing a state of the function link mechanism in an "EXPOSURE" position.

When the function switch 8 is further rotated from the "INPUT/PLATE-MAKING" position to the "EXPOSURE" position, the first pin 126 is further moved on the first stationary surface, whereby the print head 56 remains in contact with the platen roller 51 (see FIG. 7). Similarly, when the function switch 8 is rotated from the "OFF" position to the "OPEN" position, the first pin 126 is moved further toward the front side on the second surface 140, whereby the print head 56 remains away from the platen roller 57 (see FIG. 5). When the coiled spring 137 has brought the print head 56 into contact with the platen roller 57, actually, the first pin 126 is slightly away from the first stationary surface 139, whereby the print head 56 is positively held in contact with the platen roller 51.

The ribbon-holding link 62c is generally T-shaped, and has each of left, right, and forward end portions thereof formed with a guide slot 142. The guide slots 142 are respectively engaged with three projections 143 erected on the frame 121, whereby the ribbon-holding link 62c is mounted on the frame 121 in a state slightly floated on the frame 121 such that it can be moved forward and backward. Each guide slot 142 is in the form of a key hole, while the projection 143 is formed with a disk-shaped retaining portion, not shown, at an upper end thereof. The ribbon-holding link 62c is mounted in the frame 121 by positioning the retaining portion to a circular portion of the guide slot and then pushing the former into the latter, whereby the ribbon-holding link 62c is guided forward and backward by the projections 143 of the frame 121 each sliding along an elongate slot portion of a corresponding one of the guide slots 142. Further, the ribbon-holding link 62c has two support pins 144, 144 erected on each of the right and left ends thereof away from the guide slots 142, and the presser plate 58 and the first and second guide pins 53, 54 are mounted on the support pins 144, 144 (see FIG. 13).

From an intermediate portion of the ribbon-holding link 62c, a spring-holding piece 145 with a bent end portion extends backward, and a coiled spring 146 is interposed between the spring-holding piece 145 and the frame 121. The coiled spring 146 urges the ribbon-holding link 62c in a forward direction, i.e. toward the front end of the stamp-making apparatus. From a front-side portion of the ribbon-holding link 62c branches an engaging portion 147 which the ribbon-holding cam 122 abuts.

The ribbon-holding cam 122 is a one-piece member having an upper cam 149 and a lower cam 150 in the form of a laminate of two plate cams. The ribbon-holding cam 122 is rotatably mounted on the frame 21 via a support shaft 151. The lower cam 150 is in the shape of a circular disk from which a sector-shaped portion is cut out, while the upper cam 149 is in the shape of a semicircular disk. The engaging portion 147 of the ribbon-holding link 62c is in contact with the peripheral end of the upper cam 149, and the second pin 127 of the main link 62d is engaged with a cut-out portion of the lower cum 150 (see FIG. 6).

FIG. 6 shows the function switch 8 in the "INPUT/PLATE-MAKING" position. When the function switch 8 is rotated from this position to the "EXPOSURE" position, the second pin 127 of the main link 62d pushes one radial end wall of the cut-out portion to move or rotate the ribbon-holding cam 122 in an anticlockwise direction. This rotation of the ribbon-holding cam 122 causes the engaging portion 147 of the ribbon-holding link 62c to drop from a peripheral end portion of the upper cam 7149 onto a chord portion of the same, whereby the ribbon-holding link 62c is displaced by the urging force of the coiled spring 146. Since the ribbon-holding cam 122 is constructed such that it is freely rotatable about its rotational axis, so that it is instantly rotated to a position in which the chord portion of the upper cam 149 and a contacting surface of the engaging portion 147 of the ribbon-holding link 62c are brought into overall contact with each other. This rotation also brings the other radial end wall of the cut-out portion of the lower cam 150 to a position in substantial contact with the second pin 127 (see FIG. 7).

Thus, by means of the ribbon-holding cam 122, a short stroke of the main link 62d can be transmitted to the ribbon-holding link 62c, causing a long stroke of the same. Therefore, it is possible to make constant an angle though which the function switch 8 is rotated so as to change its position to an adjacent one.

The guide slot 142 also serves as a stopper for restricting the forward movement of the ribbon-holding link 62c. That is, when an inner wall defining the rear end of the elongate slot of each guide slot 142 strikes the projection 143, the ribbon-holding link 62c is stopped in a forward extremity position. Therefore, when the engaging portion 147 of the ribbon-holding link 62c is in overall contact with the chord portion of the upper cam 149, the urging force of the coiled spring 146 does not actually act on the chord portion of the upper cam 149, so that the engaging surface of the engaging portion is slightly spaced from the chord portion of the upper cam 149.

On the other hand, when the function switch 8 is rotated from the "EXPOSURE" position through the "INPUT/PLATE-MAKING" position to the "OFF" position, the second pin 127 displaces the other radial end wall of the cut-out portion of the lower cam 150 to rotate the ribbon-holding cam 122 in a clockwise direction. This rotation of the ribbon-holding cam 122 causes the engaging portion 147 of the ribbon-holding link 62c to return from the chord portion of the upper cam 149 to the peripheral end portion of the same, whereby the ribbon-holding link 62c is moved backward against the urging force of the coiled spring 146. In this state, the ribbon-holding cam 122 which is freely rotatable supports the ribbon-holding link 62c urged by the coiled spring 146 to hold the ribbon-holding link 62c in a backward position (see FIG. 4). When the function switch 8 is further moved from the "OFF" position to the "OPEN" position, the other radial end wall of the cut-out portion of the lower cam 150 is in contact with the second pin 127 become substantially parallel with a direction of movement of the second pin 127, so that the ribbon-holding cam 122 only rotates slightly in a clockwise direction, and the ribbon-holding link 6c remains held in the backward position (see FIG. 5).

Thus, when the function switch 8 is rotated from the "OFF" position to the "OPEN" position, the hook 130 is disengaged from the hook catch of the lid 7 to permit the lid 7 to open, and when the same is rotated from the "OFF" position to the "INPUT/PLATE-MAKING" position, the print head 56 displaces the ink ribbon C to urge same against the platen roller 57 to permit printing. Further, when the function switch 8 is rotated from the "INPUT/PLATE-MAKING" position to the "EXPOSURE" position, the presser plate 8 displaces the ink ribbon C to urge the same against the stamp body A to permit exposure. If the lid 7 is opened by mistake during exposure to ultraviolet rays, or if the exposure is carried out with the lid 7 being open, ultraviolet ray undesirably leak out of the apparatus. To avoid this inconvenience, the stamp-making apparatus incorporates the lock mechanism 63 which locks the lid 7 in a closed state during printing and exposure, and inhibits the function of the apparatus from shifting to printing and exposure when the lid 7 is open.

Figure 9A:
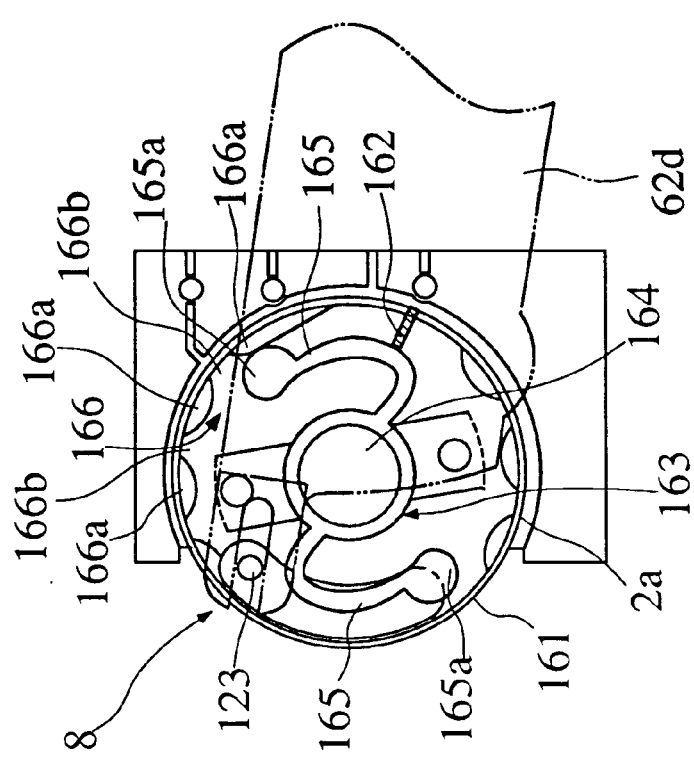
FIGS. 9A and 9B are diagrams each showing an internal construction of a function switch and operations thereof.
Figure 9B:
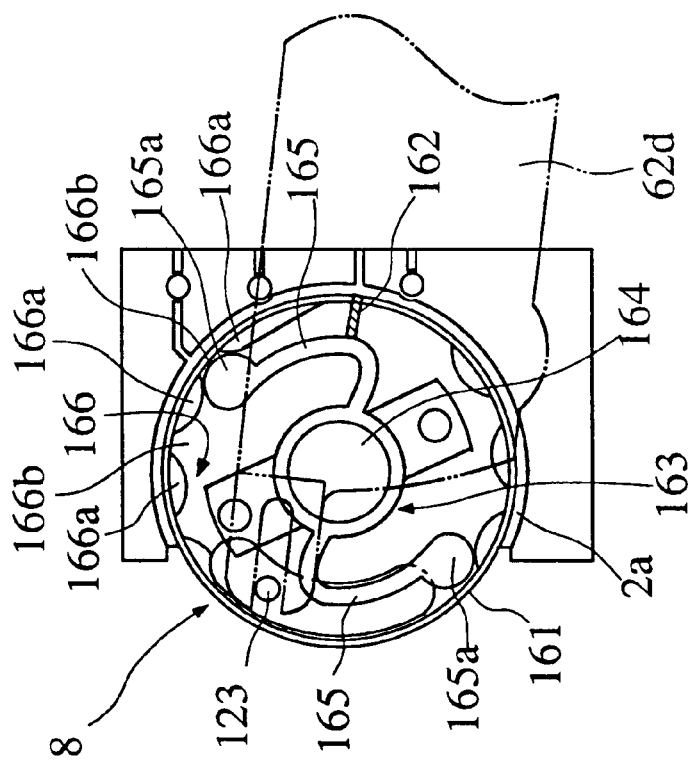

The lock mechanism 63 is arranged in the function switch 8. Now, for easy understanding purposes, description will be first made of the construction of the function switch 8. As shown in FIGS. 9A and 9B, the function switch 8 includes a dial 161 formed with a mark 162 on its top for indicating an active position of the switch, a click member 163 attached to the underside of the dial 161 and received in the space within the same, and an eccentric pin 123 in engagement with the main link 62d. The function switch 8 is rotatably mounted on a seat plate 2a of the casing 2, via a shaft 164. The click member 163 has a pair of click arms 165, 165 extending radially in a winding manner, and positioned in centrosymmetry. The resilient properties of each click arm 165 urges a circular portion 165a at an end thereof against a corresponding one of click-engaging portions 166 formed on the seat plate 2a.

Each click-engaging portion 166 is a sequence of four convex portions 166a and three concave portions 166b each located between adjacent ones of the convex portions 166a. States of the circular portion 165a of each click arm dropped in or engaged with any of the three concave portions 166b of the corresponding click-engaging portion 166 correspond to the "OFF" position, the "INPUT/PLATE-MAKING" position, and the "EXPOSURE" position, respectively (see FIG. 9A). An intermediate portion of the outermost convex portion corresponds Lo the "OPEN" position, and in this position, no clicking engagement occurs between the click arms and the click-engaging portions (see FIG. 9B). This enables the function switch 8 to automatically smoothly return from the "OPEN" position to the "OFF" position. A rotational angle between the "OFF" position and the "OPEN" position through which the function switch 8 should rotate is 15 degrees, and a rotational angle between the "OFF" position and the "EXPOSURE" position is 30 degrees.

Figure 10:
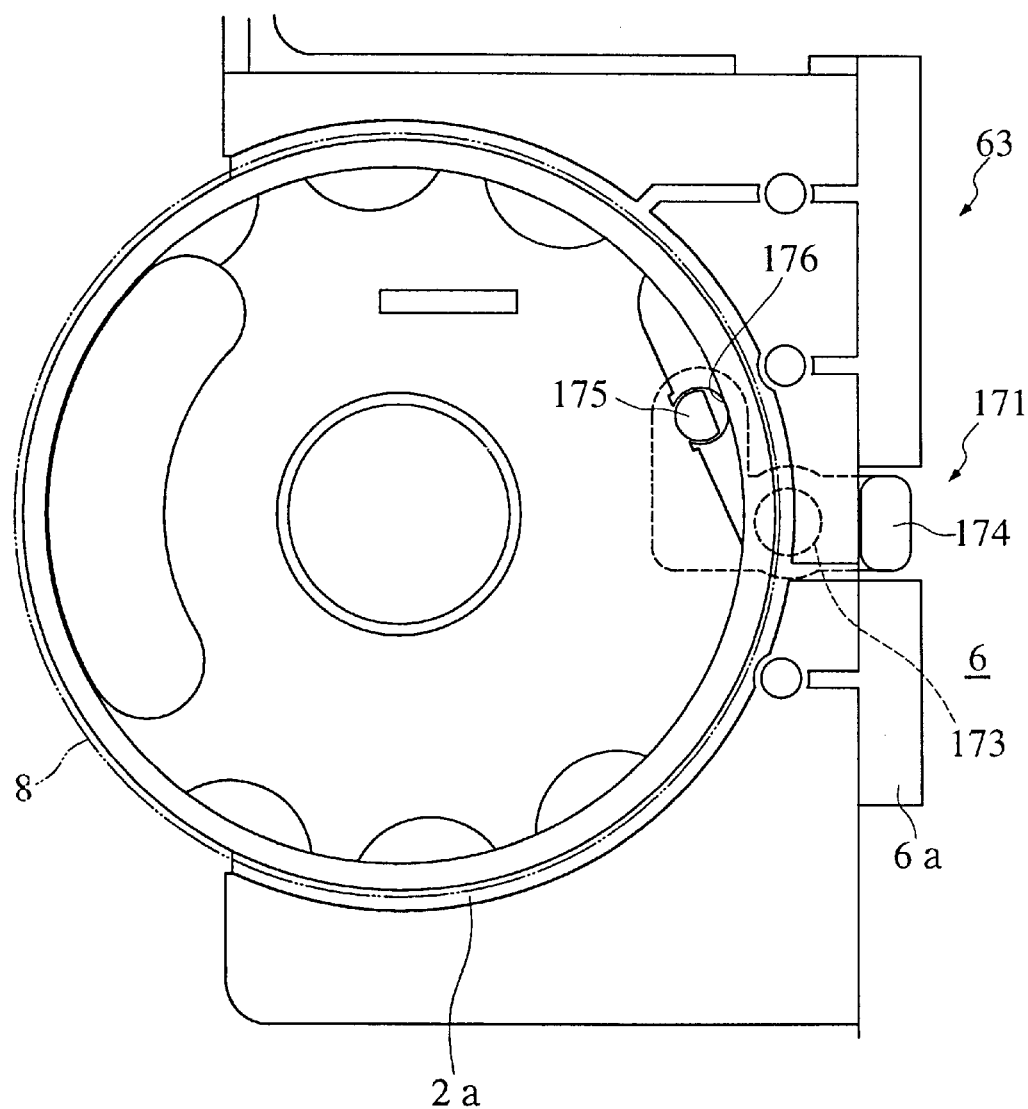
FIG. 10 is a plan view showing a lock mechanism from which a dial of the function switch is removed.
Figure 11:
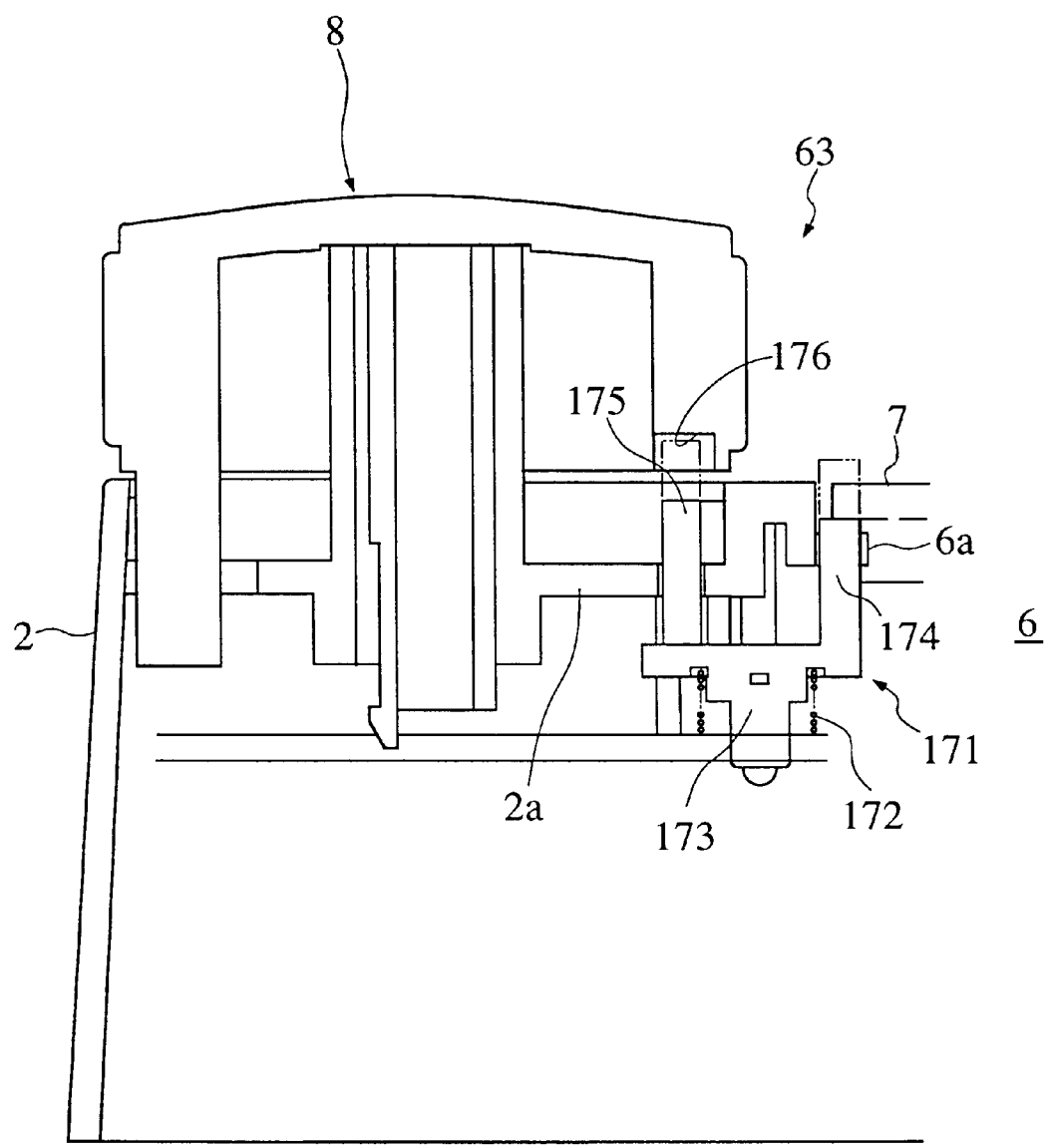
FIG. 11 is a cross-sectional view showing the function switch and the lock mechanism as well as component parts associated therewith.

On the other hand, as shown in FIGS. 10 and 11, the lock mechanism 63 includes the lock member 171 arranged in a boundary between the function switch 8 and the pocket 6. The lock member 171 is mounted on the seat plate 2a of the casing 2 such that it is urged upward by a lock spring 172 and is vertically movable. The lock member 171 is comprised of a body 173 guided by the seat plate 2a in a vertically movable manner, a push arm 174 which extends from the body 173 toward the pocket 6 and then bends upward, and a lock arm 175 which extends from the body 173 toward the function switch 8 and then bends upward.

The push arm 174 faces a lid-seating portion 6a of the pocket 6 from below, and when the lid 7 is opened, the push arm 174 projects out of the lid-seating portion 6a, whereas when the lid 7 is closed, the push arm 174 is pushed downward to be retracted into the lid-seating portion 6a. That is, when the lid 7 is opened, the lock member 171 is displaced upward by the lock spring 172, and when the lid 7 is closed, the lock member 171 is moved downward against the urging force of the lock spring 172. When the lock member 171 is moved upward, the lock arm 175 is engaged in an engaging groove 176 formed in a side wall of the function switch 8, to inhibit rotation of the function switch 8. Inversely, when the lock member 171 is movers downward, the lock arm 175 is disengaged from the engaging groove 176 of the function switch 8 to cancel the inhibition of rotation of the function switch 8.

The engaging groove 176 is an elongate groove which extends circumferentially, and when the function switch 8 is to be rotated between the "OFF" position and the "OPEN" position (normally, this operation is not carried out), the rotation of the function switch 8 is permitted. Inversely, when an attempt is made to rotate the function switch 8 from the "OFF" position to the "INPUT/PLATE-MAKING" position or the "EXPOSURE" position, the rotation of the function switch 8 is inhibited. This construction of the lock mechanism inhibits the rotation of the function switch 8 when the lid 7 is open, thereby making it impossible to start printing and exposure.

The mechanism of locking the lid in a closed state during printing and exposure by the stamp-making apparatus is achieved by the main link 62d and the lid-opening link 62a. That is, when the function switch 8 is in the "INPUT/PLATE-MAKING" position or the "EXPOSURE" position, the lid is locked in a closed state by the lid-opening link 62a. This prevents the exposure from being carried out when the lid 7 is open, so that no ultraviolet rays leak to the outside of the stamp-making apparatus, thereby increasing the reliability of the apparatus.

Figure 12:
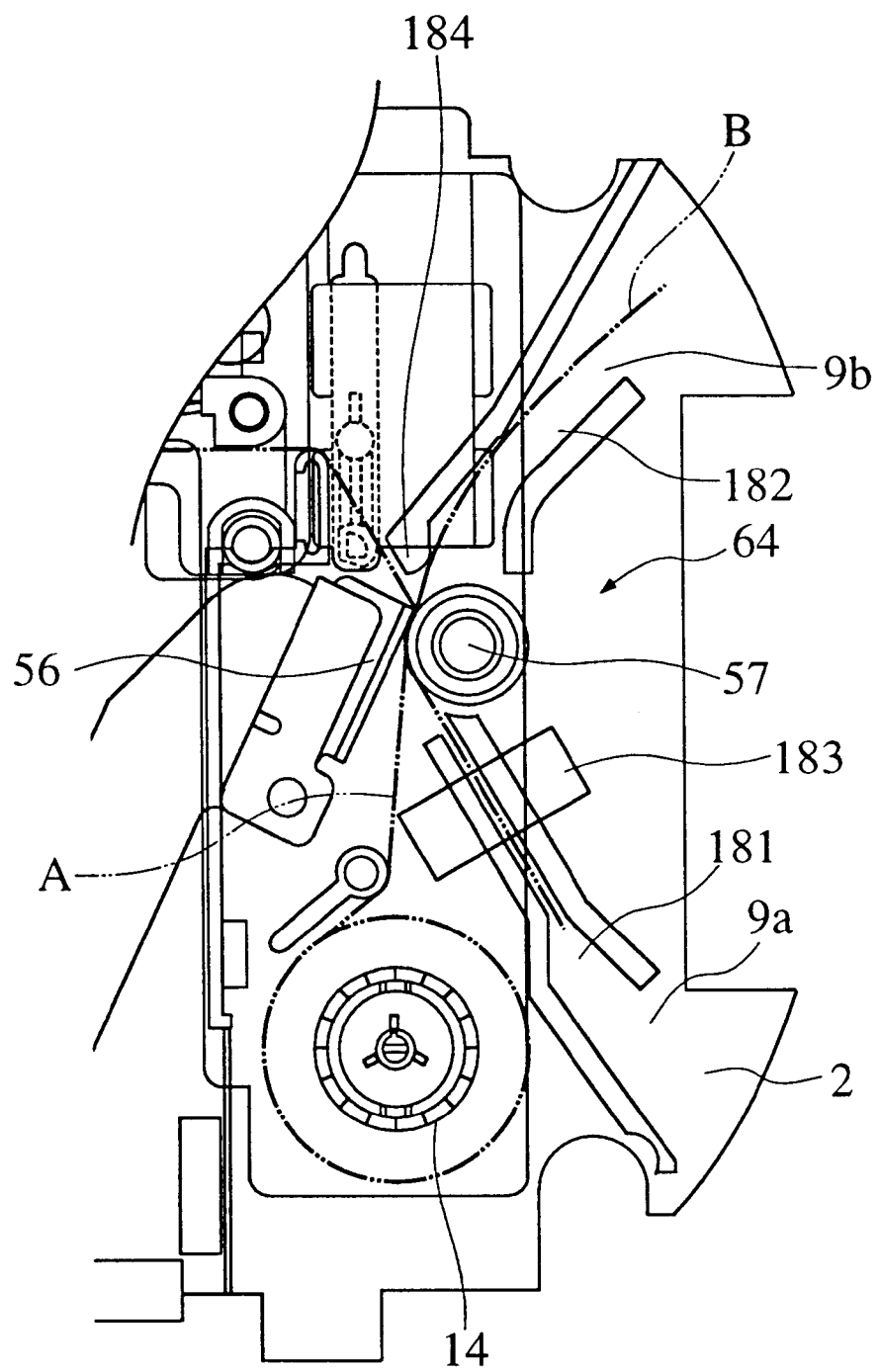
FIG. 12 is an enlarged plan view showing a printing device of the mechanical block and component parts associated therewith.

Next, a printing device 64 provided for the printing block will be described with reference to FIG. 12. The printing device 64 includes the print head 56 for printing stamp characters on the ink ribbon C, and the platen roller 57 for feeding the ink ribbon C in a manner timed to printing operations of the print head 56. Further, the casing 2 is formed with a feeding passage 181 through which the plate-making sheet B is fed to a contacting area between the print head 56 and the platen roller 57 and a delivery passage 182 through which the plate-making sheet B is delivered. The feeding passage 181 is formed with the inserting slot 9a which is open to the outside of the apparatus, at an upstream end thereof, and the delivery passage 182 is formed with the take-out slot 9b which is open to the outside of the apparatus, at a downstream end thereof.

The platen roller 57 is a drive roller as described hereinabove, and when the ink ribbon C is rolled out from the supply reel 14, it pulls in the plate-making sheet B between the print head 56 and itself to thereby bring a portion of the ink ribbon C and a portion of the plate-making sheet B, one upon the other, onto the print head 56. The print head 56 is a thermal head, and thermally transfer ink coated on the ribbon tape of the ink ribbon C to the plate-making sheet B. This transfer of the ink peels a portion of ink corresponding to a stamp character off the ink ribbon C to reveal a corresponding portion of the transparent base of the ribbon tape, while the peeled portion of the ink is attached to the plate-making sheet B as the stamp character.

On the feeding passage 181 faces a sensor 183 which detects insertion of the plate-making sheet B and a feeding reference position of the same. The plate-making sheet inserted into the feeding passage 181 is sent forward by the platen roller 57 in response to results of the detection of the sensor 183 whereby printing is started from one end of a stamp character label Bd (see FIG. 35). One of walls defining the delivery passage 182 on a left-hand side as viewed in FIG. 12 is formed with a separating nail at an upstream end thereof, whereby the ink ribbon C and the plate-making sheet B fed, one upon the other, are separated from each other. Thereafter, the ink ribbon C is sent forward to the exposure block, while the plate-making sheet B is delivered via the delivery passage 182 out of the apparatus.

Next, the exposure system 65 provided for the exposure block will be described with reference to FIGS. 13 and 14. The exposure system 65 includes an ultraviolet ray source 191 arranged in a manner opposed to the stamp surface Ad of the stamp body A set in the pocket 6, and the presser plate 58 arranged between the ultraviolet ray source 191 and the stamp surface Ad of the stamp body A. The stamp surface Ad of the stamp body A set in the pocket 6, the presser plate 58 and the ultraviolet ray source 191 are arranged such that they are spaced from each other by a gap in a manner parallel to each other. The ink ribbon C is positioned between the stamp surface Ad and the presser plate 58. The presser plate 58 is formed of a transparent resin or the like and is caused to move forward to displace the ink ribbon C so as to urge the same against the stamp surface Ad of the stamp body A. That is, when the exposure is carried out, the presser plate 58 urges the ink ribbon C against the stamp surface Ad of the stamp body A, and then the ultraviolet ray source 191 is lighted to expose the stamp surface Ad to ultraviolet rays using the ink ribbon C as a mask (see FIG. 13). In the present embodiment, an exposure time period during which the ultraviolet ray source 191 is energized is approximately 90 seconds.

Figure 16:
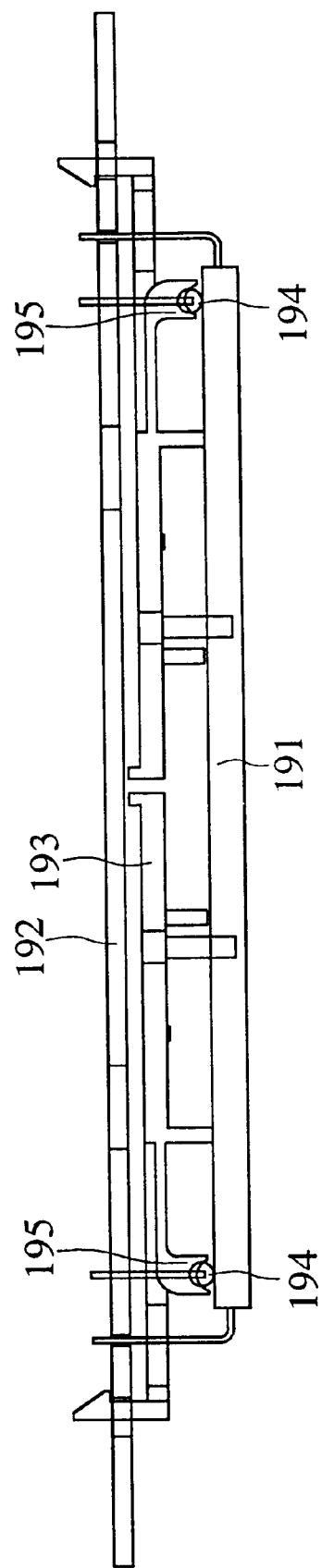
FIG. 16 is a plan view showing the ultraviolet ray source of the exposure system and component parts associated therewith.

The ultraviolet ray source 191 is a self-heating hot-cathode tube which is also called a semi-hot tube. As shown in FIG. 15A (front elevation), FIG. 15B (side elevation) and FIG. 16 (plan view), the ultraviolet ray source 192 is supported on a fluorescent tube holder 193 provided on a base plate 192. The ultraviolet ray source 191 has a pair of overtemperature cutouts 194, 194 arranged on longitudinal opposite ends thereof, for detecting expiration of the service life of the ultraviolet ray source 191 and failure of the same. The overtemperature cutouts 194 shut down the power supply when the ultraviolet ray source 191 is abnormally heated due to expiration of the service life or failure. Each overtemperature cutout 194 is constructed in the form of a hollow cylinder, and arranged such that it extends crosswise at a right angle to the longitudinal axis of the ultraviolet ray source 191 and touches ultraviolet ray source 191 from underside thereof (i.e. from the holder side). Each overtemperature cutout 194 is held from underneath by a hold arm 194 extending from the fluorescent tube holder 193, and at the same time urged against the ultraviolet ray source 191 by the hold arm 195 having the resilient properties.

Thus, the overtemperature cutouts 194 are arranged at right angles to the ultraviolet ray source 191, whereby heat conduction from the ultraviolet ray source 191 to the overtemperature cutouts 194 is suppressed, resulting in the minimized adverse influence of the presence of the overtemperature cutouts 194 on self-heating of the ultraviolet ray source 191. As a result, the overtemperature cutouts 194 can detect expiration of the service life of the ultraviolet ray source 191 and failure of the same without adversely affecting a rise in quantity of light generated by the ultraviolet ray, source 191 when it starts to be energized. It is preferred that a reflector, not shown, is provided at the rear of the ultraviolet ray source 191 whereby the ultraviolet rays are caused to be emitted forward in a concentrated manner. Further, the overtemperature cutouts 194 may be provided in a manner spaced from the ultraviolet ray source 191 to thereby inhibit conduction of heat from the ultraviolet ray source 191 to the overtemperature cutouts 194.

More specifically, in this variation, each overtemperature cutouts 194 is provided away from the ultraviolet ray source 191 at a location of the fluorescent tube holder 193. Since the fluorescent tube holder 193 is formed of a resin, there is a fear that it is melted due to abnormal heat, while the ultraviolet ray source 191 exhibits a highest temperature at opposite electrode portions thereof. Therefore, it is preferred that the overtemperature cutout 194 is arranged on the surface of the fluorescent tube holder 193 which is closest to the electrode of the ultraviolet ray source 191. This arrangement cuts off conduction of heat from the ultraviolet ray source 191 to the overtemperature cutouts 194, and at the same time prevents the fluorescent tube holders 193 from being melted by abnormal heat. This, thermal influence of the overtemperature cutouts 194 on the ultraviolet ray source 191 is reduced to the minimum, and a rise in the quantity of light (ultraviolet rays) generated by the ultraviolet ray source 191 is improved, making it possible to shorten the exposure time period.

Further, when priority is given to detection of abnormal heat, a cutout cover may be provided to enclose the electrode portions of the ultraviolet ray source 191 and the overtemperature cutouts 194, whereby the difference in temperature between the ultraviolet ray source 191 and the overtemperature cutouts 194 is minimized. Further, if only limited space can be secured for the overtemperature cutouts 194, it is also preferred that ultraviolet rays are converged on the overtemperature cutouts 194 by means of a collector or reflector.

Now, with reference to FIGS. 17A to 17C, and 18, the relationship between the location of the overtemperature cutouts 194 and the rise in the quantity of light generated by the ultraviolet ray source 191 will be described based on results of experimental tests. In these experimental tests, rises in luminescence of ultraviolet rays generated by the ultraviolet rays source 191 are measured for a case (FIG. 17A) in which the overtemperature cutouts 194 are arranged along the ultraviolet ray source 191 in parallel therewith, a case (FIG. 17B) in which the former are arranged at right angles to the latter, and a case (FIG. 17C) in which the former are arranged away from the latter.

Figure 17A:
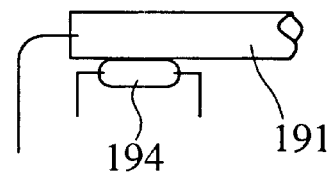
FIGS. 17A to 17C are diagrams showing conditions of experiments concerning a rise in the quantity of light generated by the ultraviolet ray source, respectively.
Figure 17B:
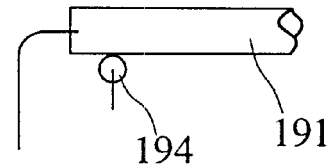
Figure 17C:
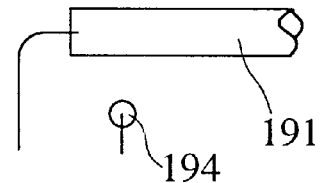
Figure 18:
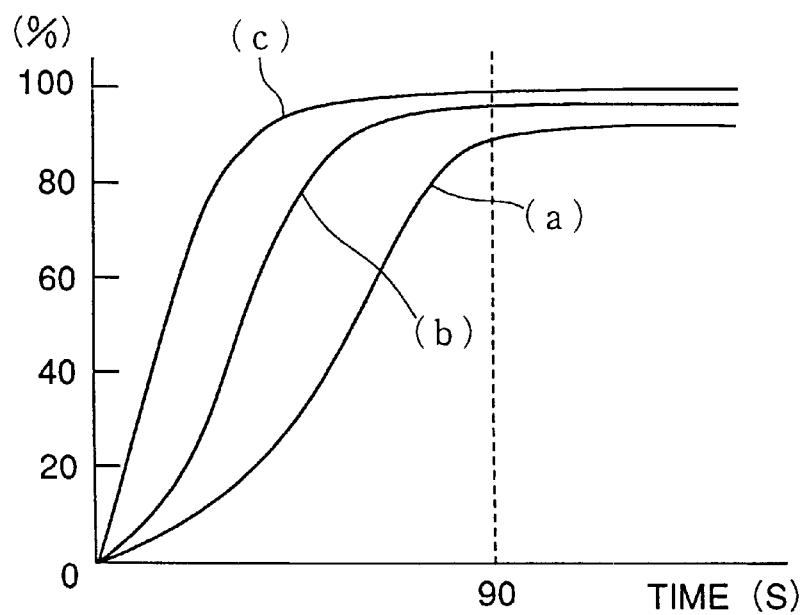
FIG. 18 is a diagram showing results of experiments conducted under the conditions showing in FIGS. 17A to 17C on the rise in the quantity of light generated by the ultraviolet ray source.

As shown in FIG. 18, a curve (a) indicative of experimental results of the FIG. 17A case shows that the arrangement of FIG. 17A takes the longest time period before the luminescence of ultraviolet rays reaches 100%, which means that this arrangement is slowest in the rise in the quantity of light generated. A curve (b) indicative of experimental results of the FIG. 17B case shows that the arrangement of FIG. 17B is faster in the rise in the quantity of light generated than that of FIG. 17A. A curve (c) shows that arrangement shown in FIG. 17C is fastest of all the three cases in the rise in the quantity of light generated. That is, the parallel arrangement of the overtemperature cutouts 194 along the ultraviolet ray source is slowest in the rise of quantity of light generated by the ultraviolet ray source 191, the crosswise arrangement of the former at a right angle to the latter is faster, and the spaced arrangement of the former from the latter is even faster.

The quantity of light irradiated to the stamp surface Ad during the exposure is a cumulative amount of luminescence over an exposure time period. Therefore, in FIG. 18, an area defined by each curve and the abscissa represents the quantity of light generated by the ultraviolet ray source 191. The lager the area, the shorter time period it takes to complete the exposure of the stamp body A to ultraviolet rays. Therefore, assuming that the exposure time period required in the FIG. 17B case, i.e. the arrangement of the overtemperature cutouts of the present embodiment, is approximately 90 seconds, an exposure time period of more than 120 seconds is required in the FIG. 17A case, whereas an exposure time period of approximately 80 seconds is required in the FIG. 17C case. In short, the above experimental tests show that the crosswise arrangement of the overtemperature cutouts 194 at a right angle to the ultraviolet ray source 191 and the spaced arrangement of the overtemperature cutouts 194 from the ultraviolet ray source 191 contributes to reduction of the exposure time period.

The presser plate 58 is formed of a rectangular-shaped transparent resin or the like, and has longitudinal opposite ends thereof mounted on presser plate holders 201, 201. Each presser plate holder 201 is fitted on two support pins 144, 144 erected on each of the ends of the ribbon-holding link 62c (see FIG. 14). The presser plate 58 is comprised of a presser plate body 202, a pair of upper and lower guide nails 203, 203 extending backward from each of opposite ends of the presser plate body 202, and plates 204 each extending from the presser plate body 202 into space between the corresponding upper and lower guide nails 203, 203. Each plate 204 is formed with an outwardly projecting shaft portion 205 at a vertically intermediate location of the presser plate 58 for guiding the forward and backward swinging motion of the presser plate 58.

Although omitted in the figure, the presser plate body 202 is slightly bent in a direction away from the stamp body A, i.e. toward the ultraviolet ray source side along the longitudinal axis, whereby when the ink ribbon C is urged against the stamp surface Ad of the stamp body A by the presser plate 58, the ink ribbon C is outstretched or spread on the stamp surface Ad. This increases intimacy of the contact between the stamp surface Ad and the ink ribbon C, and makes it possible to press the ink ribbon C against the stamp surface Ad without producing any wrinkles.

Figure 19:
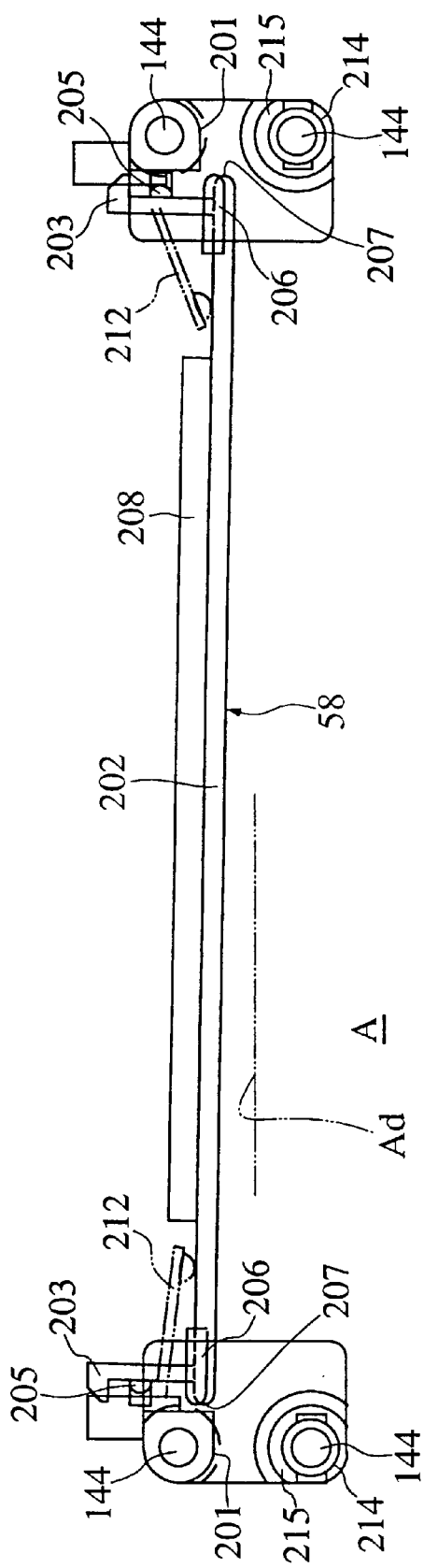
FIG. 19 is a plan view showing a presser plate of the exposure system and component parts associated therewith.
Figure 20:
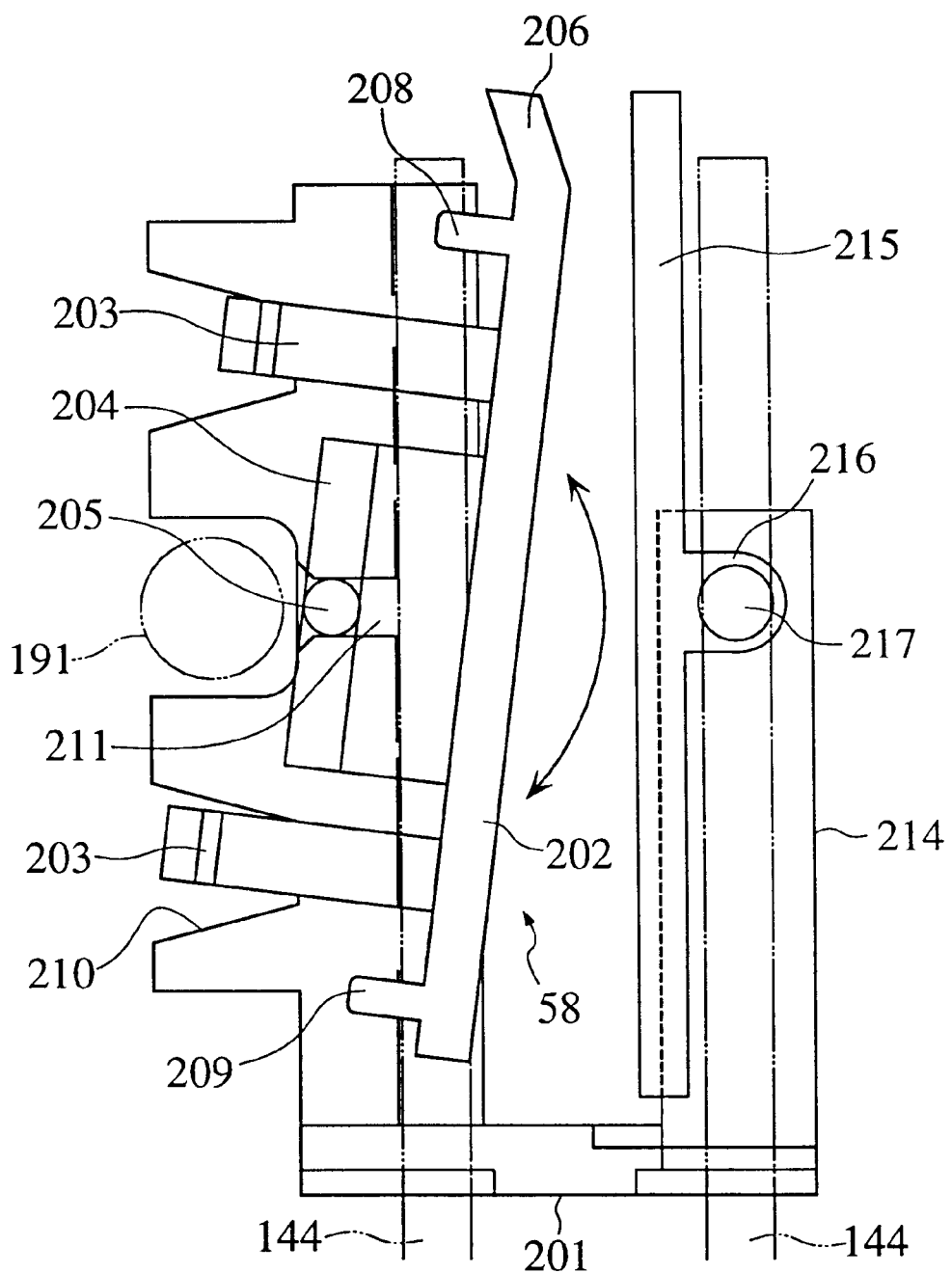
FIG. 20 is an enlarged side elevation showing the pressure plate and a presser plate holder of the exposure system.

Further, the presser plate body 202 is formed with guide pieces 206, 206 which extend upward from the top of the longitudinal opposite ends thereof in a manner obliquely bent backward. They guide the ink ribbon C into space between the presser plate 58 and the stamp body A properly when the ink ribbon cartridge 11 is mounted in the stamp-making apparatus. Further, each of the longitudinal opposite ends of the presser plate body 202 is chamfered to form a chamfered portion having a segmental cross-section. When the exposure is carried out, the ink ribbon C is bent along the chamfered portions so that no wrinkles are formed (see FIG. 13). In FIGS. 19 and 20, reference numerals 208, 209 designate ribs for increasing the rigidity of the presser plate body 202.

On the other hand, each presser plate holder 201 is formed with a pair of V-shaped grooves 210, 210 for guiding the pair of upper and lower guide nails 203, 203, transversely or forward and backward, and recesses 211 for respectively guiding the outwardly projecting shaft portions 205 such that they are rotatable about the longitudinal axis thereof. That is, the presser plate 58 is mounted on the presser plate holders 201, 201 at the longitudinal opposite ends thereof such that the guide nails 203 are respectively engaged with the V-shaped grooves 210, and the outwardly projecting shaft portions 205 are respectively engaged with the recesses 211 whereby the presser plate 58 is capable of moving forward and backward over a slight distance and swinging transversely. Further, in this state, a pair of spring pieces 212, 212 respectively extending from the presser plate holders 201 are urged against the outer or rear side of the opposite ends of the presser plate 58, whereby the presser plate 58 is urged toward the forward extremity position in which the nail portions of the guide nails 203 abut the bottoms of the V-shaped grooves 210, respectively.

Figure 13:
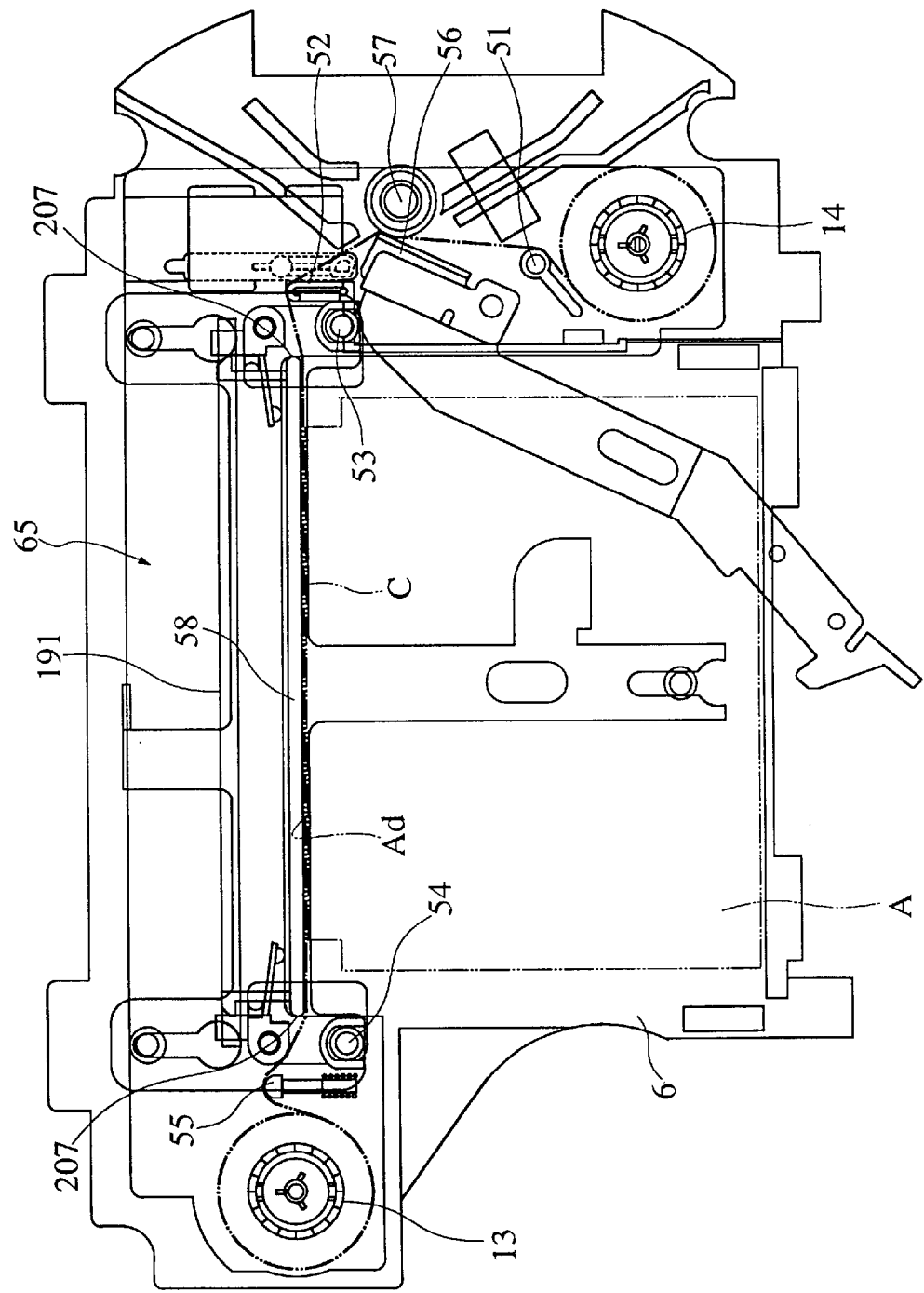
FIG. 13 is a plan view showing an exposure system of the mechanical block and component parts associated therewith.
Figure 14:
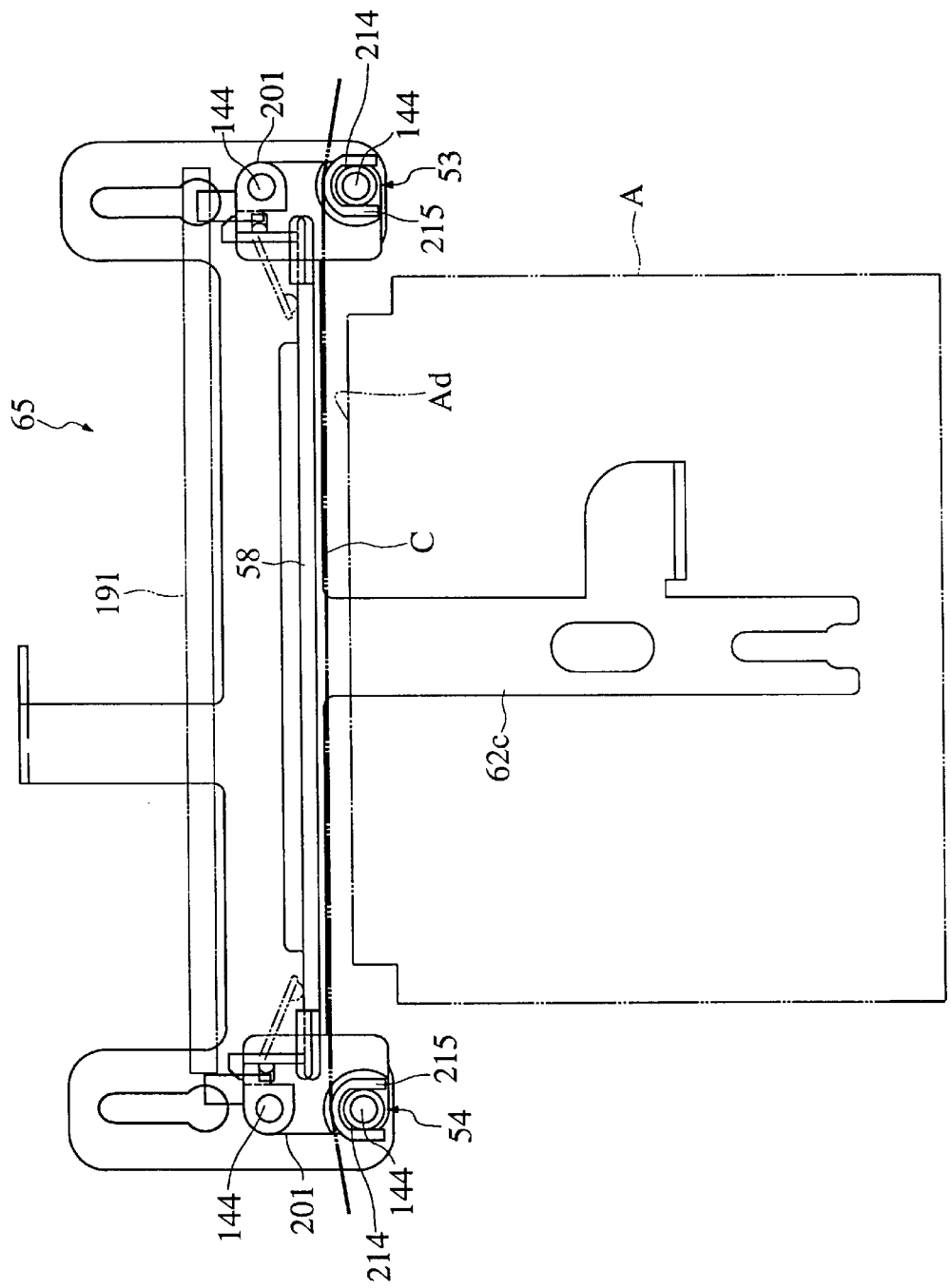
FIG. 14 is an enlarged plan view showing the exposure system of the mechanical block and component parts associated therewith.

As the ribbon-holding link 62c is moved forward from the state shown in FIG. 14 (or FIG. 2), the presser plate holders 201, 201 are moved forward, whereby the presser plate 58 makes a parallel translation toward the stamp surface Ad of the stamp body A. The stroke of movement of the ribbon-holding link 62c is slightly longer than the distance between the presser plate 58 and the stamp surface Ad of the stamp body A, and therefore, when the ribbon-holding link 62c reaches the forward extremity position, the presser plate 58 and the stamp surface Ad of the stamp body A strikes or abuts each other, so that the presser plate 58 receives a reactionary force from the stamp surface Ad to make a slight backward displacement with respect to the presser plate holders 201. Since the backward movement of the presser plate 58 is caused by the reactionary force from the stamp surface Ad, this reactionary force and the urging forces applied on the presser p ate 58 become balanced to bring the presser plate 58 into contact along the stamp surface Ad of the stamp body A (see FIG. 13). That is, the presser plate 58 catches and brings the ink ribbon C into intimate contact with the stamp surface Ad of the stamp body A without forming any gap.

The spring pieces 212 are arranged away from an exposure area defined on the stamp surface Ad of the stamp body A (actually, defined on the ink ribbon C as the mask), thereby inhibiting the spring pieces 212 from interfering with the exposure, though there will be almost no problem even if the spring pieces 212 project into the light pass to the exposure area, so long as the spring pieces are formed of a transparent material.

Further, as shown in FIG. 20, each presser plate holder 201 has a guide pin-holding portion 214 integrally formed therewith, and a corresponding one of the support pins 144 extends through the guide pin-holding portion 214. The guide pin-holding portions 214 have respective ribbon-sliding members 215 mounted thereon. Each ribbon-sliding member 215 is segmental in cross-section, with an arcuate surface thereof facing toward the presser plate side. The ribbon-sliding member 215 is formed with a pair of holding pieces 216 at a vertically intermediate portion thereof, each projecting to the front side and having a round through hole extending in a longitudinal direction. The round through holes of the holding pieces 216 of the ribbon-sliding members 215 are fitted in a pair of shaft projections 217 formed on the guide pin-holding portion 214, respectively, such that the holding pieces 216 are fitted on the guide pin-holding portion 214 from the outside, whereby the ribbon-sliding member 215 is mounted on the guide pin-holding portion 214 in a manner swingable about the axis of the shaft projections 217.

The guide pin-holding portions 214 and the ribbon-sliding members 215 are arranged outside an area of the presser plate 58 and the stamp body A (see FIGS. 14 and 19), and the guide pin-holding portion 214 and the ribbon-sliding member 215 located on the right-hand side as viewed in the figures form the first guide pin 53, and the guide pin-holding portion 214 and the ribbon-sliding member 215 located on the left-hand side form the second guide pin 54. That is, the first guide pin 53 and the second guide pin 54 guide the ink ribbon C through space between the presser plate 58 and the stamp surface Ad of the stamp body A such that the ink ribbon C is fed in parallel with the presser plate 58 and the stamp body A without interfering with any of them.

Although detailed description is made hereafter, since the guide pin-holding portions 214 form part of the presser plate holder 201, the first guide pin 53 and the second guide pin 54 are moved in the same direction as the presser plate 58 (driven by the ribbon-holding link 62c) is translated forward. This movement decreases the tension of the ink ribbon C stretched between the first and second guide pins 53, 54, whereby the ink ribbon C is urged against the stamp surface Ad of the stamp body A with reduced tension, i.e. without forming any vertical wrinkles thereon.

Now, the above-mentioned state of the ink ribbon C is described in further detail with reference to FIGS. 2 and 13. Referring to FIG. 2, when the ink ribbon C is fed or advanced, the pulling force of the take-up reel 13 causes strong tension of the irk ribbon C, so that vertical wrinkles are formed on the ink ribbon C due to its very small thickness. Therefore, if the ink ribbon C is urged against the stamp surface Ad of the stamp body A as it is, there remain the wrinkles formed on the ink ribbon C urged against the stamp surface Ad, so that deformed images (negative) of the stamp characters on the ink ribbon C are used in carrying out the exposure of the stamp surface Ad to the ultraviolet rays. On the other hand, if the ink ribbon C is loosened, the exposure can be carried out with the images of the stamp characters being out of position. The eliminate these inconveniences, as shown in FIG. 13, the first guide pin 53 and the second guide pin 54 are moved forward in accordance with the forward movement of the presser plate 58, whereby the tension of the ink ribbon C is reduced, and at the same time, a slight stretching force is applied to the ink ribbon C by the tension pin 55, which is moderate enough not to produce any wrinkles on the ink ribbon C.

Thus, the ribbon-holding link 62c and the presser plate holder 201 form translating means for making a parallel translation of the presser plate 8, and the ribbon-holding link 62c, the first guide pin 53, the second guide pin 54, and the tension pin 55 form tensionregulating means for reducing tension of the ink ribbon C to a predetermined degree. These component members cooperate to bring the ink ribbon C into intimate contact with the stamp surface Ad of the stamp body A without forming any wrinkles on the ink ribbon C, so as to carry out the exposure. As a result, the images of the stamp characters are formed on the stamp surface Ad of the stamp body A by the exposure with an excellent reproducibility, so that a stamp formed with stamp characters favorably comparable with the original of the stamp characters can be made.

Further, the ink ribbon C in the exposure position shown in FIG. 13 is bent backward at the longitudinal opposite ends of the presser plate 58 by the tension pin 55 and the second path-setting pin 52, and the chamfered portions formed at the longitudinal opposite ends of the presser plate 58 operate to prevent undesired wrinkles from being produced on the ink ribbon C. That is, since the opposite end faces of the presser plate 58 are at right angles to a stretch of the ink ribbon C between the tension pin 55 and the second path-setting pin 52, and at the same time, the opposite ends of the presser plate 58 are chamfered, the ink ribbon C is urged on the presser plate 58 with uniform pressure along the width of the ink ribbon C, so that no wrinkles are produced on the ink ribbon C.

Next, a variation of the translating means will be described with reference to FIG. 37. As described with reference to FIG. 37 above, when the function switch 8 is moved from the "INPUT/PLATE-MAKING" position to the "EXPOSURE" position, the urging force of the coiled spring 146 moves the ribbon-holding link 62c forward, to cause the presser plate 58 to be urged against the stamp body A via the presser plate holder 201. This sequence of movements is instantly carried out in response to the trigger of a rotational operation of the function switch 8. In contrast, in the present variation, the forward (translating) movement of the presser plate 58 is caused to be made slowly.

Figure 37:
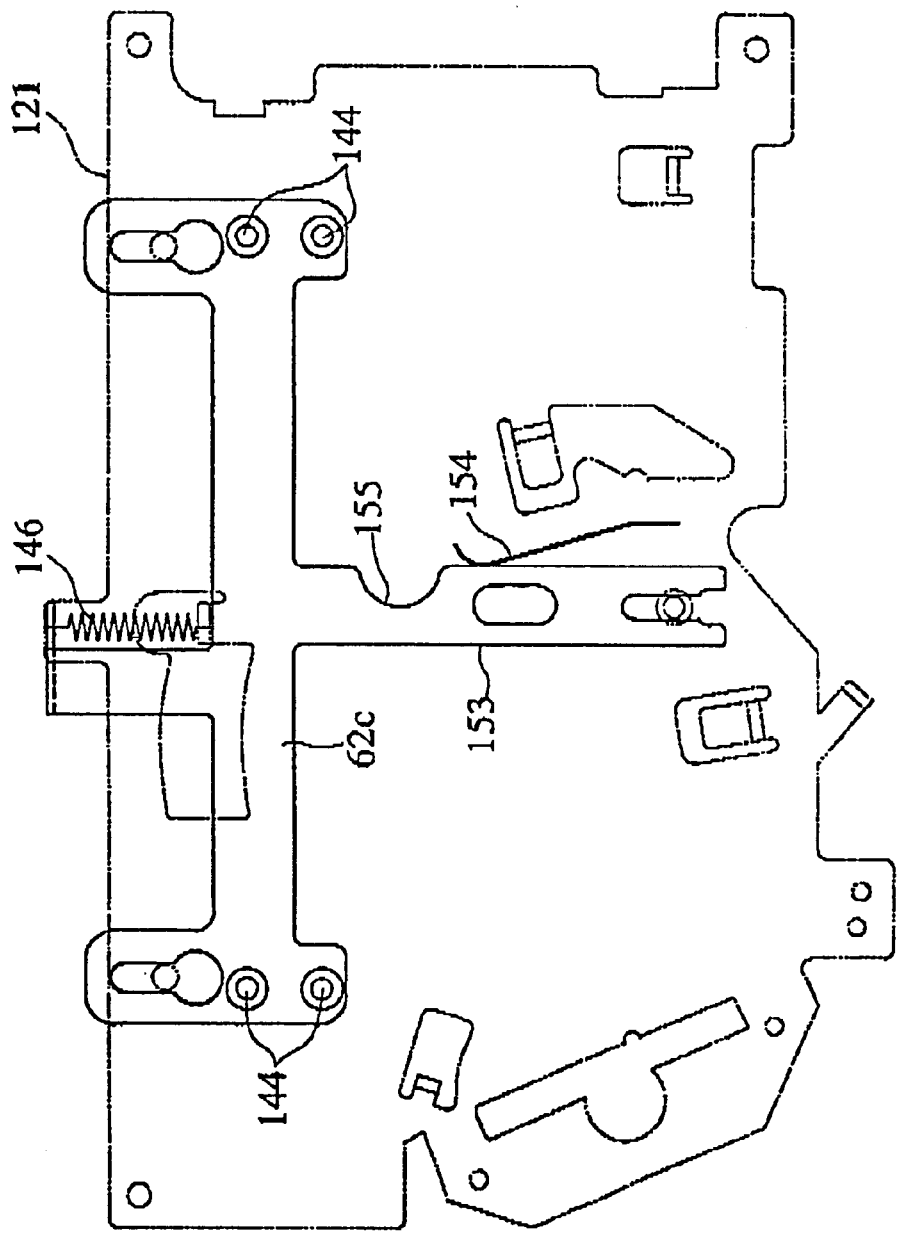
FIG. 37 is a plan view showing a variation of translating means.

As shown in FIG. 37, the ink ribbon-holding link 62c has a forward-extending portion 153 against a side surface of which a plate spring 154 is urged. The plate spring 154 has its root-side end fixed to the frame 121, and its free end is in sliding contact with the side surface of the forward-extending portion 153. When the ribbon-holding link 62c moves forward, the plate spring 154 slides on the forward-extending portion 153 to thereby brake the forward movement of the presser plate 58, i.e. reduce the speed of movement of the presser plate 58. That is, the plate spring 154 forms a brake mechanism of the translating means. In the figure, reference numeral 155 designates a recess into which the free end of the plate spring 154 slides.

This arrangement causes the presser plate 58 to make a slow forward movement over a sufficient time period during which the tension pin 55 applies a stretching force to the ink ribbon C. That is, only after the ink ribbon C is stretched properly by the tension pin 55, the ink ribbon can be urged against the stamp body A. Therefore, irrespective of tolerance and mounting accuracy of the tension pin 55, the ink ribbon C can be reliably brought into intimate contact with the stamp body A. Further, at the very instant that the presser plate 8 is brought into urging contact with the stamp body A, the tension pin 55 retracts and the ink ribbon C is slightly pulled toward the printing device 64. However, in this variation, since the presser plate 8 is slowly urged against the stamp body A, it is possible to reliably prevent unfavorable consequences, e.g. wrinkles formed due to loosening of the ink ribbon C.

Instead of the plate spring, a damper may be used as the brake mechanism. For example, the brake mechanism may be constituted by a rack formed in the forward-extending portion 153 of the ribbon-holding link 62c, and a pinion provided on the frame 121 for mating with the rack in a rotatable manner, with the pinion being equipped with a viscous damper.

Now, the feed path of the ink ribbon C will be described with reference to FIG. 21. The ink ribbon C rolled out from the supply reel 14 is properly guided by the first path-setting pin 51 to the printing device 64. From the printing device 64, the ink ribbon C is fed to the second path-setting pin 52, at which the ink ribbon C is largely bent. Then, it is properly guided by the first guide pin 53 and the second guide pin 54 to the exposure system 65 between them. Finally, the ink ribbon C is advanced via the tension pin 55, and taken up by the take-up reel 13. This feed path of the ink ribbon C is for feeding or advancing the ink ribbon C or for setting the same on standby for feeding. A feed path of the ink ribbon C during the exposure of the stamp body A to ultraviolet rays is different from the above feed path, as described hereinabove, and from a feed path of the same when the ribbon cartridge 11 is carried separately from the plate-making apparatus. Before describing the feed path of the ink ribbon C taken when the ribbon cartridge 11 is carried as an separate piece, the construction of the ribbon cartridge 11 per se including the reels and the pins will be described.

Figure 22:
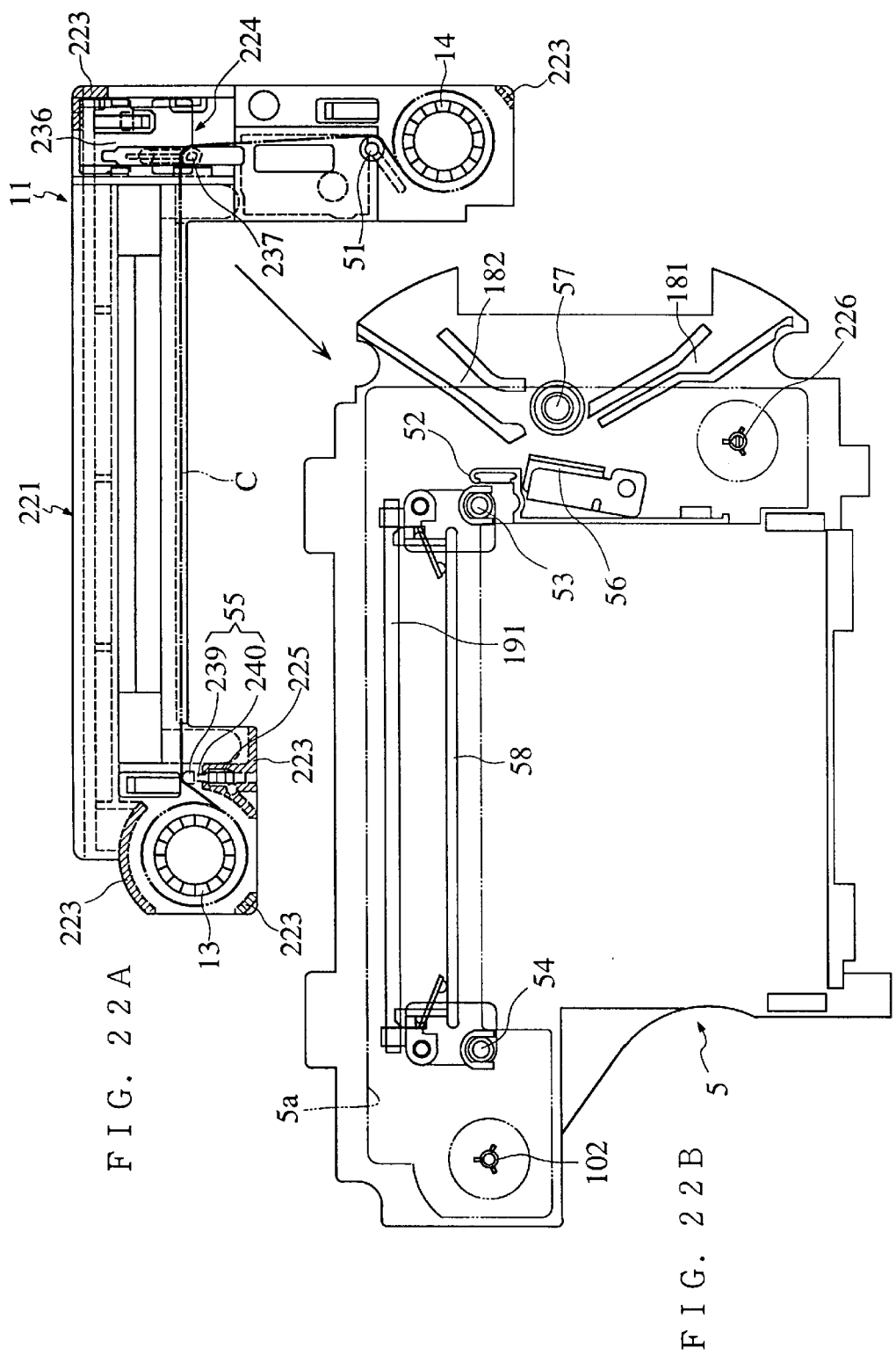
FIG. 22A is a plan view showing a ribbon cartridge.
FIG. 22B is a plan view showing a ribbon cartridge main body from which the ribbon cartridge is removed.
Figure 23:
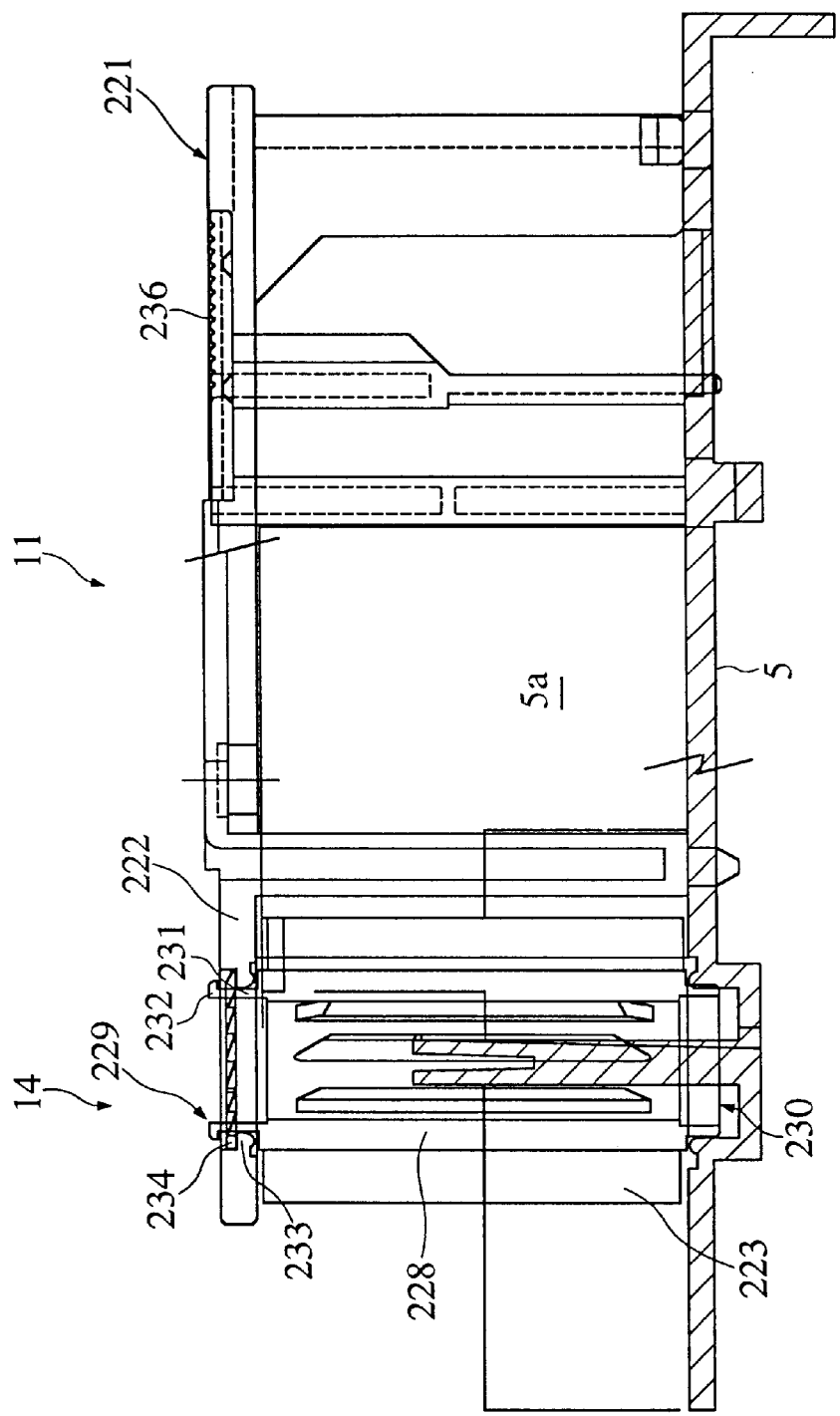
FIG. 23 is an enlarged side elevation showing the ribbon cartridge mounted in the ribbon cartridge main body.

As shown in FIGS. 22A and 22B, and 23, the ribbon cartridge 11 includes a cartridge case 221 comprised of a base plate 222 in the form of an inverted L-shape, and a plurality of legs 223 extending from the base plate 222, as well as the reels and pins each attached to the cartridge case 221 in a cantilever manner. The ribbon cartridge 11 is mounted in the mechanical block body 5 by fitting the legs 223 in a receiving block 5a with the base plate 222 being positioned above. The legs 223 are arranged at corners of the inverted L-shaped cartridge case 221, as shown in FIGS. 22A.

At an end of a shorter-side portion of the base plate 222, the supply reel 14 extends downward in a rotatable manner, and at an end of a longer-side of the base plate 222, the take-up reel 13 extends downward in a rotatable manner. Further, at a location downstream of the supply reel 14 along the feed path of the ink ribbon C, the first path-setting pin 51 reinforced with ribs extends downward from the base plate 222, and at a location downstream of the first path-setting pin 51, there is provided a path-changing member 224 constructed in a manner movable forward and backward. At a location upstream of the take-up reel 13, the tension pin 55 is provided in a manner urged by a coiled spring 225 such that it can be moved forward and backward on the base plate 222. As shown in FIG. 22B, arranged in the receiving block 5a of the mechanical block body 5 are the reel shaft 102 of the take-up reel 13, a reel shaft 226 of the supply reel 14, the print head 56, the platen roller 57, the feeding passage 181 and the delivery passage 182, the second path-setting pin 52, the first and second guide pins 53, 54, the presser plate 58, the ultraviolet ray source 191, etc.

As shown in FIG. 23, the supply reel 14 (identical with the take-up reel 13) has a shaft 228 in the form of a hollow cylinder around which the ink ribbon C is wound, an upper engaging portion 229 extending from an upper end of the shaft 228, and a lower engaging portion 230 extending from a lower end of the shaft 228, whereby the supply reel 14 is rotatably held on the base plate 222 by the upper engaging portion 229, and on the mechanical block body 5 by the lower engaging portion 230. The upper engaging portion 229 is comprised of a hollow cylindrical portion 231, and an flanged end portion 232 continuously extending from an upper end of the hollow cylindrical portion 231. In a manner corresponding to this construction of the upper engaging portion 229, the base plate 222 is formed with a shaft-holding portion 233 for sliding contact with the hollow cylindrical portion 231 such that the hollow cylindrical portion 231 can rotate in the shaft-holding portion 233, and a stepped portion 234 on which the bottom of the flange of the flanged end portion 232 is seated. The bottom of the flanged end portion 232 and the stepped portion 234 are each in the form of sawteeth, and the supply reel 14 is rotatable only in one direction when the flanged end portion 232 is brought into contact (engaged) with the stepped portion 234.

In this case, when the ribbon cartridge 11 is mounted in the mechanical block body 5, the supply reel 14 is slightly pushed upward, whereby the flanged end portion 232 is disengaged from the stopped portion 234 to permit free rotation of the supply reel 14. On the other hand, when the ribbon cartridge 11 is not mounted in the mechanical block body 5, the supply reel 14 is displaced downward by empty load to cause the flanged end portion 232 to engage with the stepped portion 234, to set or form a back stop. The back stop is provided for preventing the ink ribbon C from becoming loose. In the case of the take-tip reel 13, the back stop inhibits the ink ribbon from moving in a direction opposite to a feeding direction, and in the case of the supply reel 14, the back stop therefor inhibits the ink ribbon from moving in the feeding direction. It goes without saying that both the take-up reel 13 and the supply reel 14 are permitted to be rotated in respective directions in which the ink ribbon becomes tight. For a ribbon cartridge 11 provided for replacement, the base plate 222 is provided with a plate, not shown, on the top thereof for urging the flanged end portion 232 against the stepped portion 234, and the ribbon cartridge 11 is wrapped and provided in this state, i.e. with the flanged end portion 232 being urged on the stepped portion 234.

Figure 24:
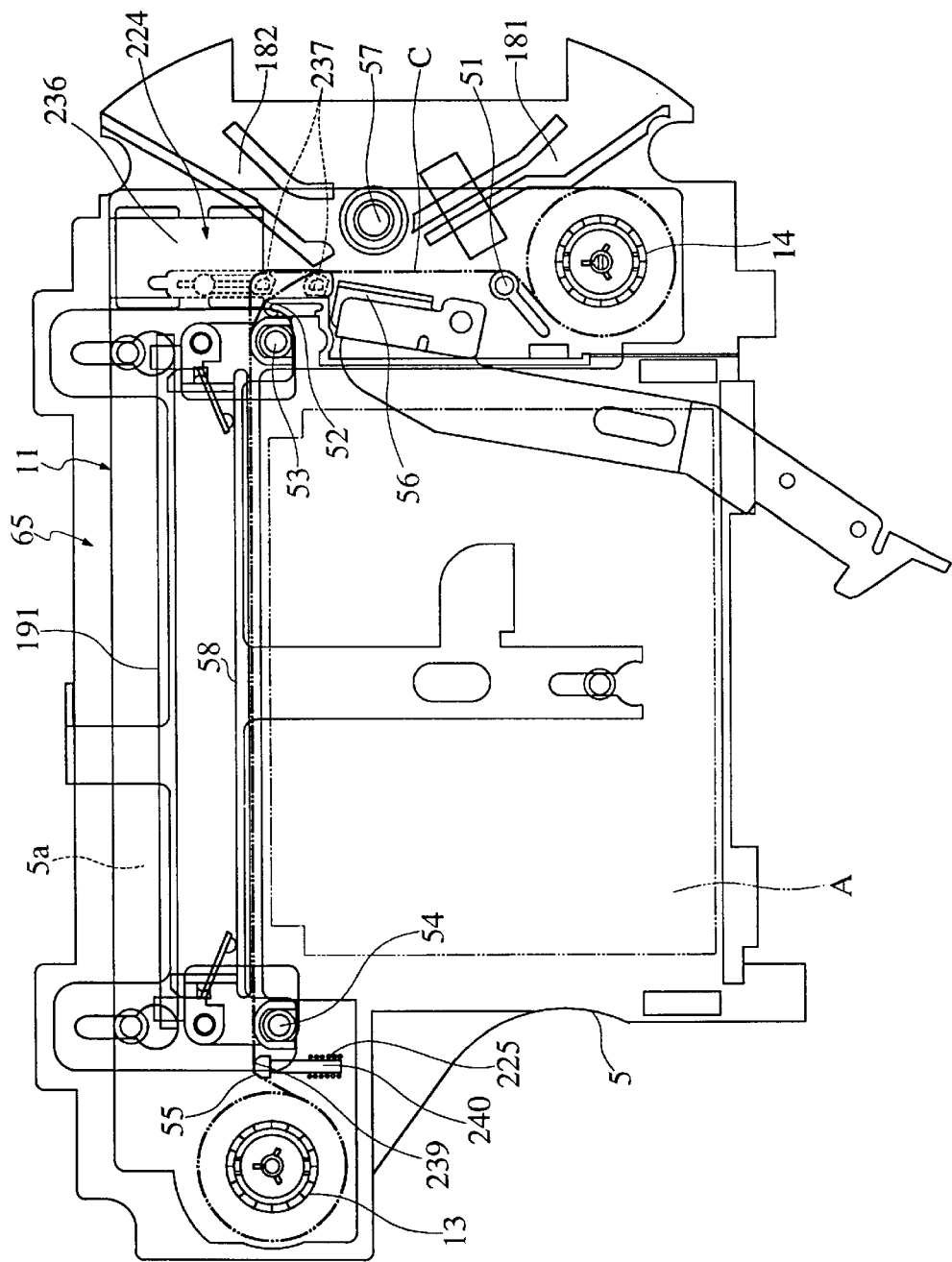
FIG. 24 is a plan view showing the mechanical block exclusive of the function switch, in which the ribbon cartridge has just been mounted.

As shown in FIGS. 22 and 23, the path-changing member 224 is comprised of a slider 236 slidably arranged at the corner of the base plate 222, and a path-changing pin 237 integrally formed with the slider 236. The slider is arranged such that the top thereof is exposed to the outside and at the same time flush with the top of the base plate 222. The path-changing pin 237 is moved transversely as the slider 236 slides, and stretches the ink ribbon between the take-up reel 13 and the supply reel 14 in a manner bent at right angles, when in the backward extremity position thereof. Before the ink ribbon cartridge 11 is mounted on the mechanical block body 5, the ink ribbon C is held in a state stretched to be bent at a right angle, and after the ribbon cartridge 11 is mounted on the mechanical block body 5, the path-changing pin 237 is moved forward to the forward extremity position (see FIG. 24).

By the above arrangement, when the ribbon cartridge 11 is mounted, the path-changing pin 237 and the tension pin 55 cooperate to control the path of the ink ribbon C such that the ink ribbon C does not interfere with the presser plate 58, the stamp body A, the second path-setting pin 52, etc., and the path-changing pin 237 and the first path-setting pin 51 cooperate to control the path of the ink ribbon C such that the ink ribbon C does not interfere with the print head 56, the platen roller 57, etc. Then, after the ribbon cartridge 11 is mounted, the path-changing pin 237 is moved to thereby set the path of the ink ribbon C in position for feeding or for being on standby for feeding.

The tension pin 55 is comprised of a sliding contact portion 239 having a semicircular cross-section, and a support plate 240 supporting the sliding contact portion 239, and a coiled spring 225 arranged between the tension pin 55 and the base plate 222 urges the tension pin 55 in a direction for stretching the ink ribbon C. The urging force of the coiled spring 225 is moderate enough not to produce any wrinkles on the stretched ink ribbon C, and the tension pin 55 functions so as not to make the ink ribbon loose. That is, in a ribbon cartridge 11 for replacement, the take-up reel 13 and the supply reel 14 are in the backstop active position as described above, and the ink ribbon C is stretched between the take-up reel 13 and the supply reel 14. The tension pin 55 abutting the ink ribbon C prevents the ink ribbon C from becoming loose due to vibrations and the like.

Further, as described hereinbefore, when the presser plate 58 and the first and second guide pins 53, 54 are simultaneously moved forward toward the stamp body A to carry out the exposure, the tension pin 55 stretches the ink ribbon C to such a degree as will neither make the ink ribbon C loose nor produce any wrinkles on the ink ribbon C. If the tension pin 55 is not required to have the function described in the preceding paragraph, the tension pin 55 may be provided on the mechanical block body 5. This variation makes the tensioning function of the tension pin 55 more stable.

Figure 25A:
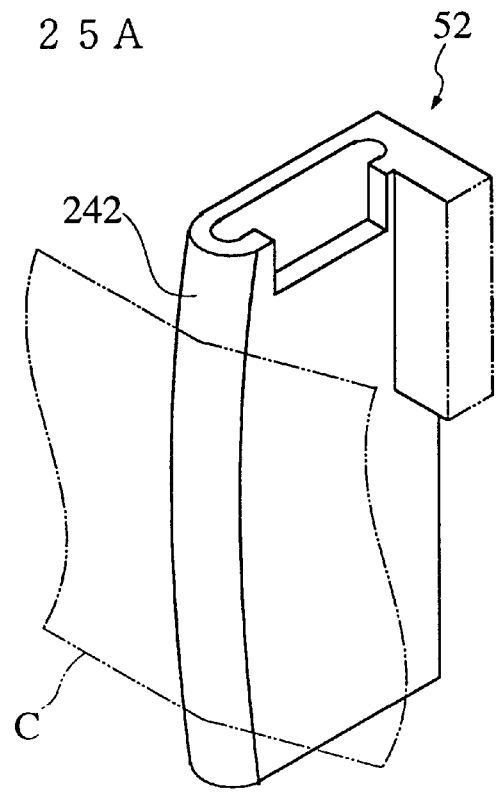
FIG. 25A is a partial perspective view showing a second path-setting pin.
Figure 25B:
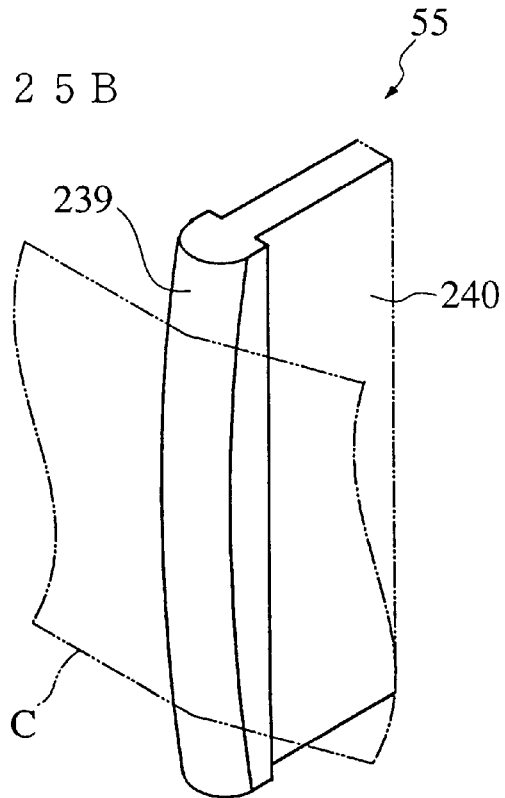
FIG. 25B is a partial perspective view showing a tension pin.
Figure 26:
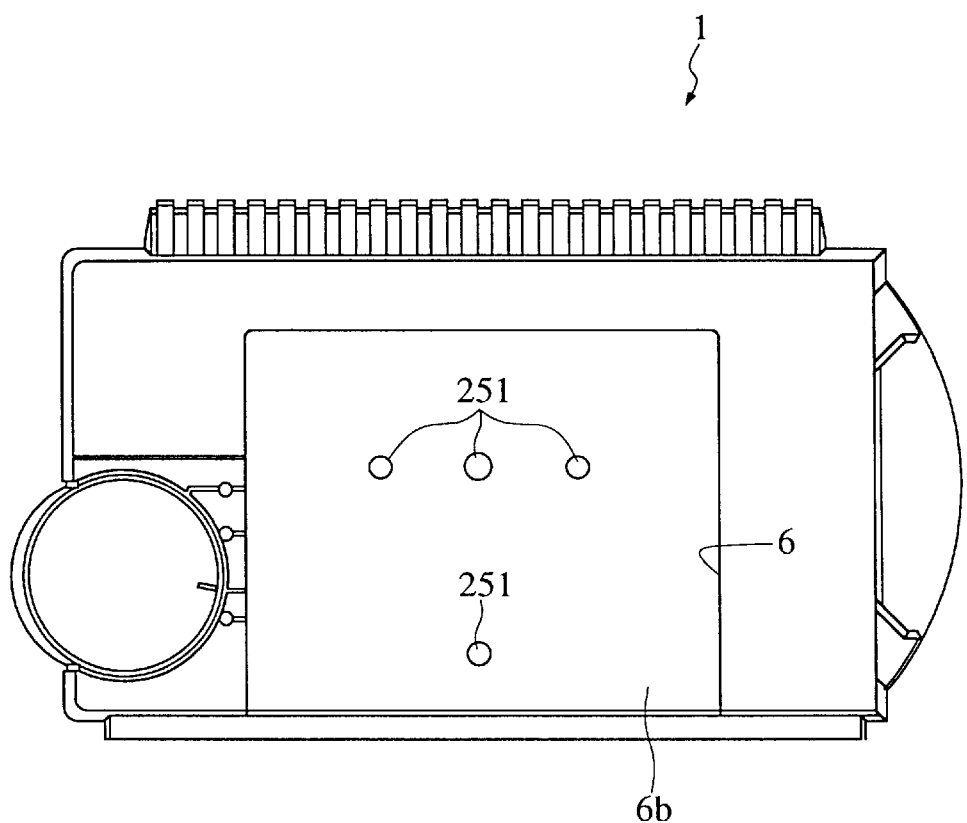
FIG. 26 is a plan view showing a pocket from which a lid is removed and component parts associated with the pocket.
Figure 27A:
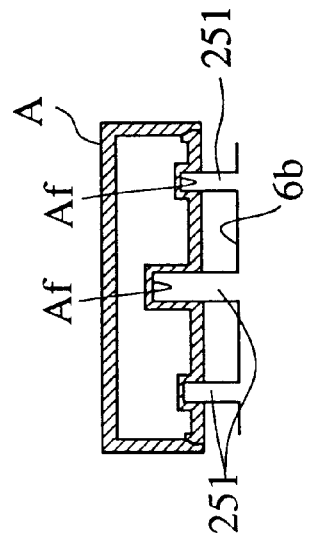
FIGS. 27A and 27B are diagrams which are useful for explaining construction of a stamp body of a square stamp, and show the stamp body in a state mounted in the pocket.
Figure 27B:
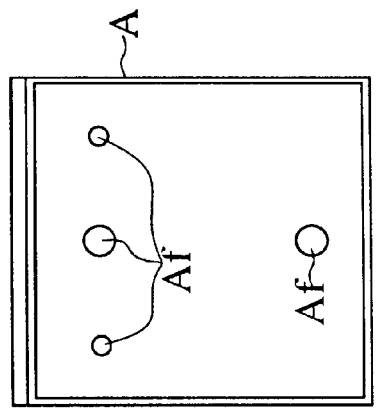
Figure 27C:
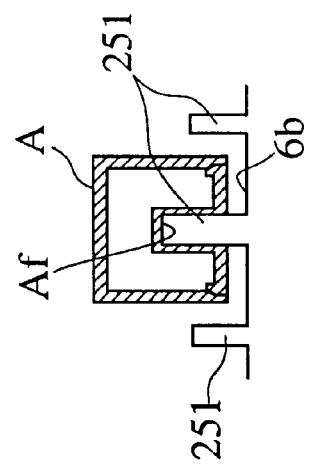
FIGS. 27C and 27D are diagrams which are useful in explaining construction of a stamp body of a business stamp, and show the stamp body in a state mounted in the pocket.
Figure 27D:
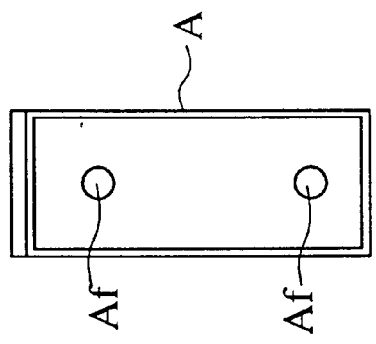

Further, as shown in FIGS. 25A and 25B, the sliding contact portion 242 of the second path-setting pin 52 and sliding contact portion 239 of the tension pin 55 are each formed such that it has a convex shape, similarly to a usual pulley, whereby the ink ribbon C is prevented from falling off the sliding contact portions 239, 242 when the ink ribbon C is fed in a state in which the width thereof extends vertically. This construction of the sliding contact portions 239, 242 also prevents the ink ribbon C from being fed in a state displaced laterally, i.e. in a state shifted to an upper or lower side of the feed path even if the ink ribbon C is not fed exactly perpendicularly to the sliding contact portions 239 and 242.

That is, when the ink ribbon C is fed along the path, it is moved laterally toward a side of the path at which the tension of the rink ribbon C is higher. Therefore, the traveling of the ink ribbon C is automatically controlled such that the center of the width of the ink ribbon C is at the top of the convex shape of each sliding contact portion. This makes it possible to prevent the ink ribbon C from being fed in a position laterally deviated with respect to the sliding contact portions 239, 242 or falling off the sliding contact portions 239, 242. Further, the ink ribbon C in sliding contact with the sliding contact portions 239, 242 is moved with a central portion along the width, i.e. a vertically central portion thereof being slightly projected outward to thereby prevent wrinkles from being produced on the ink ribbon C. Therefore, the sliding contact portions 242, 239 of the second path-setting pin 52 and the tension pin 55, and the swingable ribbon-sliding members 215 of the first and second guide pins 53, 54 cooperate to hold the ink ribbon C at a fixed position in a vertical direction to thereby cause the ink ribbon C to face the exposure system 65 in parallel therewith.

Figure 38:
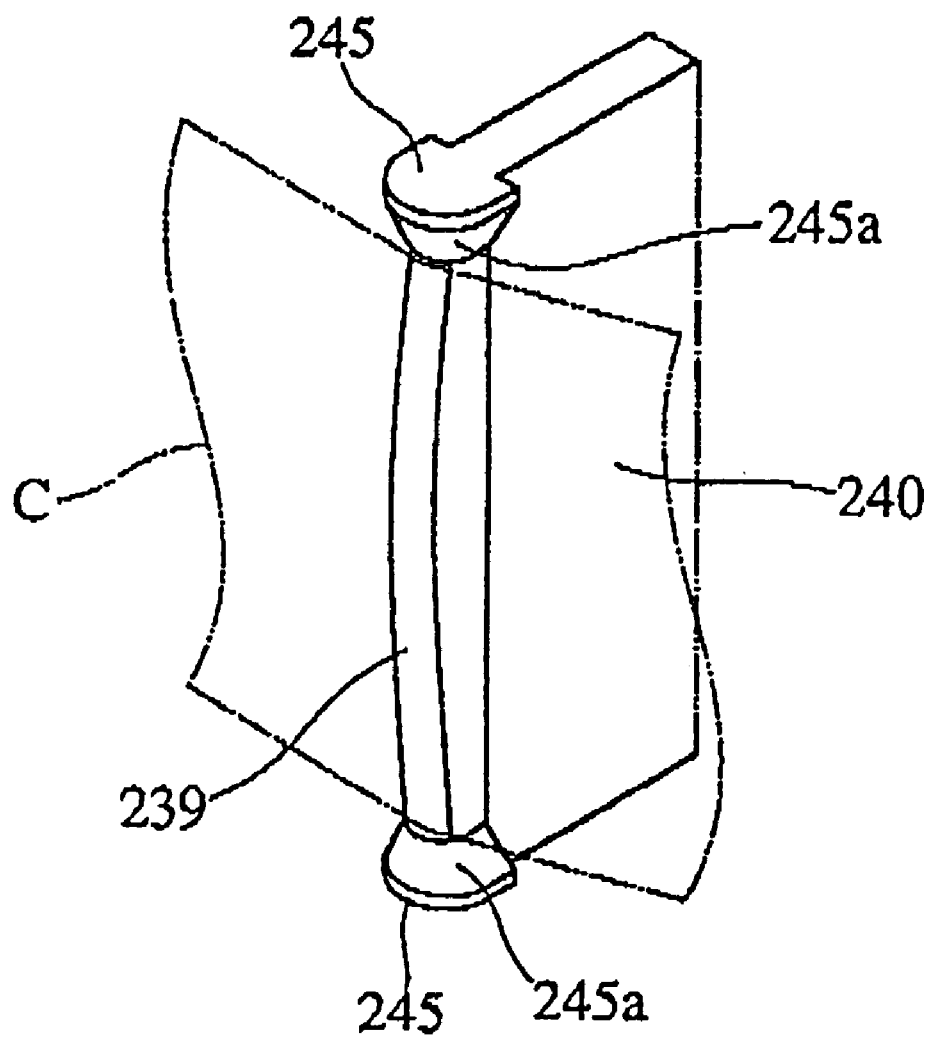
FIG. 38 is a perspective view showing a variation of the tension pin.

Next, a variation of the tension pin 55 will be described with reference to FIG. 38. The tension pin according to the variation has a pair of flange portions 245 formed on opposite sides of the sliding contact portion 239 having a convex shape. The surface of each flange portion facing the sliding contact portion 239 has a slope 245a sloping toward the sliding contact portion 239.

In the case of this arrangement of the tension pin 55, the flange portions 245 can guide the ink ribbon C when it is fed, and at the same time prevent the ink ribbon C from falling off the tension pin 55 even if the ink ribbon C is loose. Further, if the ink ribbon C is laterally moved out of position to have its side placed on the slope 245a, a force acts on the ink ribbon C to return the same to its original position, whereby the ink ribbon C can be constantly fed in a state held in a vertically fixed position. It is preferred that the second path-setting pin 52 has the same construction as the tension pin 55.

Next, the detecting device 66, the operation of which is linked to the opening and closing of the lid 7, will be described. The detecting device 66 detects the mounting of the stamp body A in the pocket 6, and at the same time discriminates the type of the mounted stamp body A. The stamp body A includes various types having respective different shapes, e.g. ones for a square stamp, a personal name stamp, a business stamp, an address stamp, etc. The stamp bodies A for these different types of the stamp are identical in length, but different in width and thickness. It should be noted that "length" means a size of the stamp body A between the stamp surface Ad and the surface on an opposite side thereof, "width" means a size of the stamp body A between the surfaces of opposite lateral ends thereof in its position mounted in the pocket 6, and "thickness" means a size of the stamp body between an upper side surface and a lower side surface of the stamp body in its position mounted in the pocket 6. To set each of these various types of the stamp body A different in width and thickness to a fixed position with respect to the directions along the width and the thickness of the stamp body A, in the present embodiment, as shown in FIGS. 26 and 27A to 27D, four bosses 251, 251, 251, 251, long and short, are provided on the bottom 6b of the pocket 6 such that they extend perpendicularly upward from the bottom, and the stamp body A is formed with fitting holes Af for fitting corresponding ones of the bosses therein, respectively, (see FIG. 34).

The four bosses 251, 251, 251, 251 are arranged to form a T shape, and in a manner corresponding thereto, a stamp body A for a square stamp, for example, is formed with two fitting holes Af, Af (see FIGS. 27A and 27B), and a stamp body A for a business stamp, for example, is formed with four fitting holes Af, Af, Af, Af (see FIGS. 27C and 27D). the number of the fitting holes Af and the depth of each of them depend on the type of the stamp body A, whereby each stamp body A is mounted in the pocket 6 such that the center of the stamp surface Ad of the stamp body A mounted in the pocket 6 is positioned to a fixed location.

Further, the back surface Ag, i.e. the surface on the side opposite to the stamp surface Ad is formed with a plurality of small holes Ah (type-detecting holes) at respective central locations i.e. at locations intermediate along the thickness of the stamp body A, in a horizontally symmetrical manner. The small holes Ah cooperate with a switch array 262 of the detecting device 66, described hereinafter, to detect the type of the stamp body A (see FIG. 33). The stamp character label Bd of the plate-making sheet B printed with stamp characters and delivered to the outside of the apparatus separately from the ink ribbon C is affixed to the back surface Ag of the stamp body A, whereby the small holes Ah are concealed.

The detecting device 66 includes switch holders 261 (also serving as the walls of the pocket 6) arranged opposed to the back surface Ag of the stamp body A, and the switch array 262 formed of six detecting switches 263 supported on the switch holders. Each detecting switch 263 is comprised of a switch body 262 formed e.g. of a push switch, and a switch top 265 having one end for being projected in to the pocket 6. The switch top 265 is formed by a plate portion 266 and a detecting projection including the one end 267 extending at a right angle to the plate portion 266, with a lower part of the plate portion 266 being guided by a guide projection 268 formed in the switch holder 261 and the detecting projection 267 being guided by a guide hole 269 formed in the switch holder 261 for forward and backward motions thereof.

The switch body 264 is fixed to the reverse side surface of a base plate 270 such that a plunger 271 thereof abuts the plate portion 266 of the switch top 265. The plunger 271 urges the switch top 265 toward the pocket 6 by its urging force. A state of the one end of the detecting projection 261 projected into the pocket 6 via the guide hole 269 through the switch holder 261, and a state of the same being retracted against the urging force of the plunger 271 correspond to ON-OFF states of the detecting switch 263, respectively.

On the other hand, a switch-operating portion 132 of the lid-opening link 62a is caused to abut the plate portion 266 of the switch holder 261, thereby urging the plate portion 266 against the urging force of the plunger 271. With rotation of the lid-opening link 62a, all the switch tops 265 are moved forward or backward. The switch-operating portion 132 and the switch top 265 may be formed in one piece. Alternatively, the switch top 265 and the detecting switch 263 may be formed in one piece, and the switch-operating block 132 may move the base plate 270.

Figure 28:
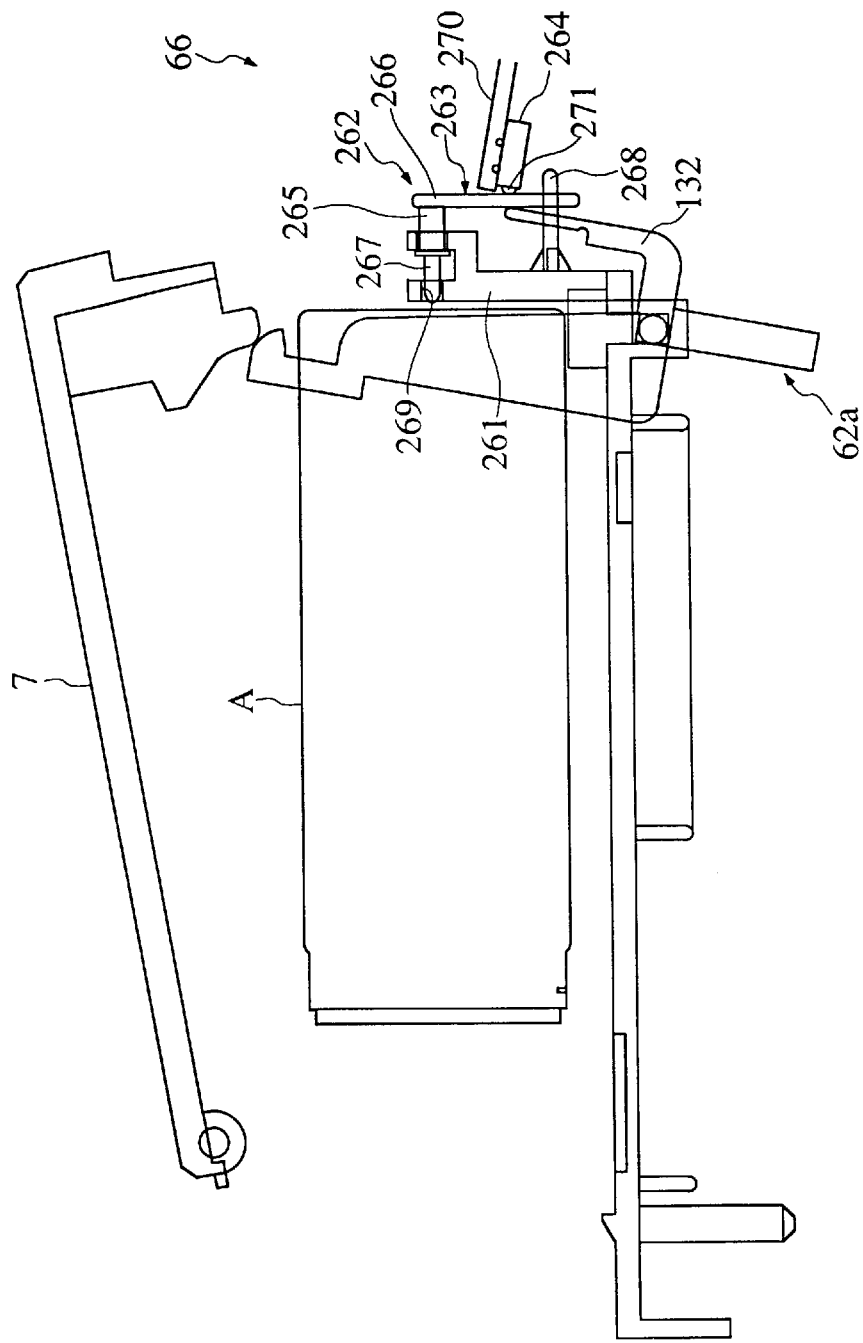
FIG. 28 is a cross-sectional view showing the pocket as well as a detecting device and component parts associated therewith.
Figure 29:
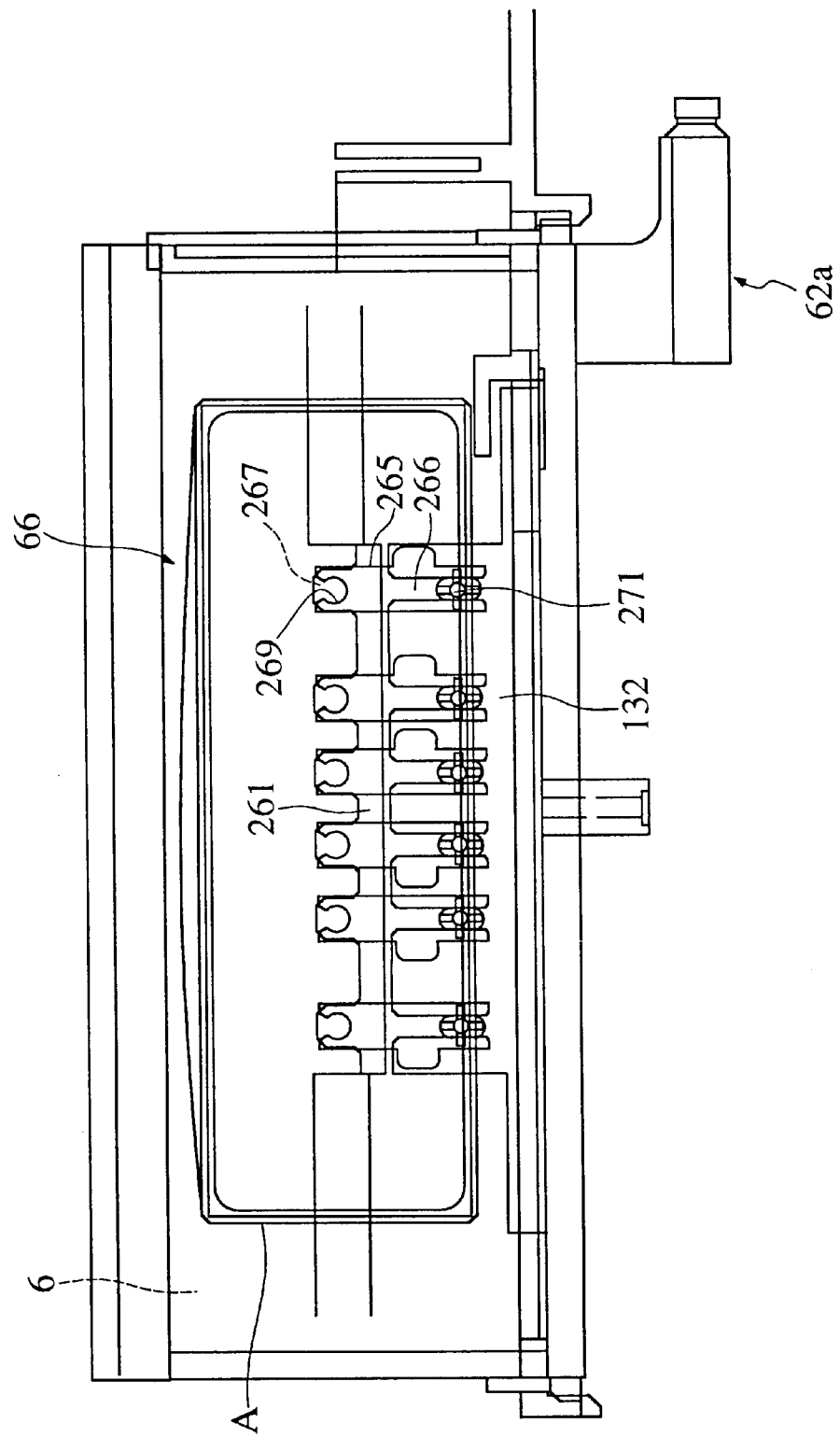
FIG. 29 is a front elevation showing the pocket as well as the detecting device and the component parts associated therewith.
Figure 30:
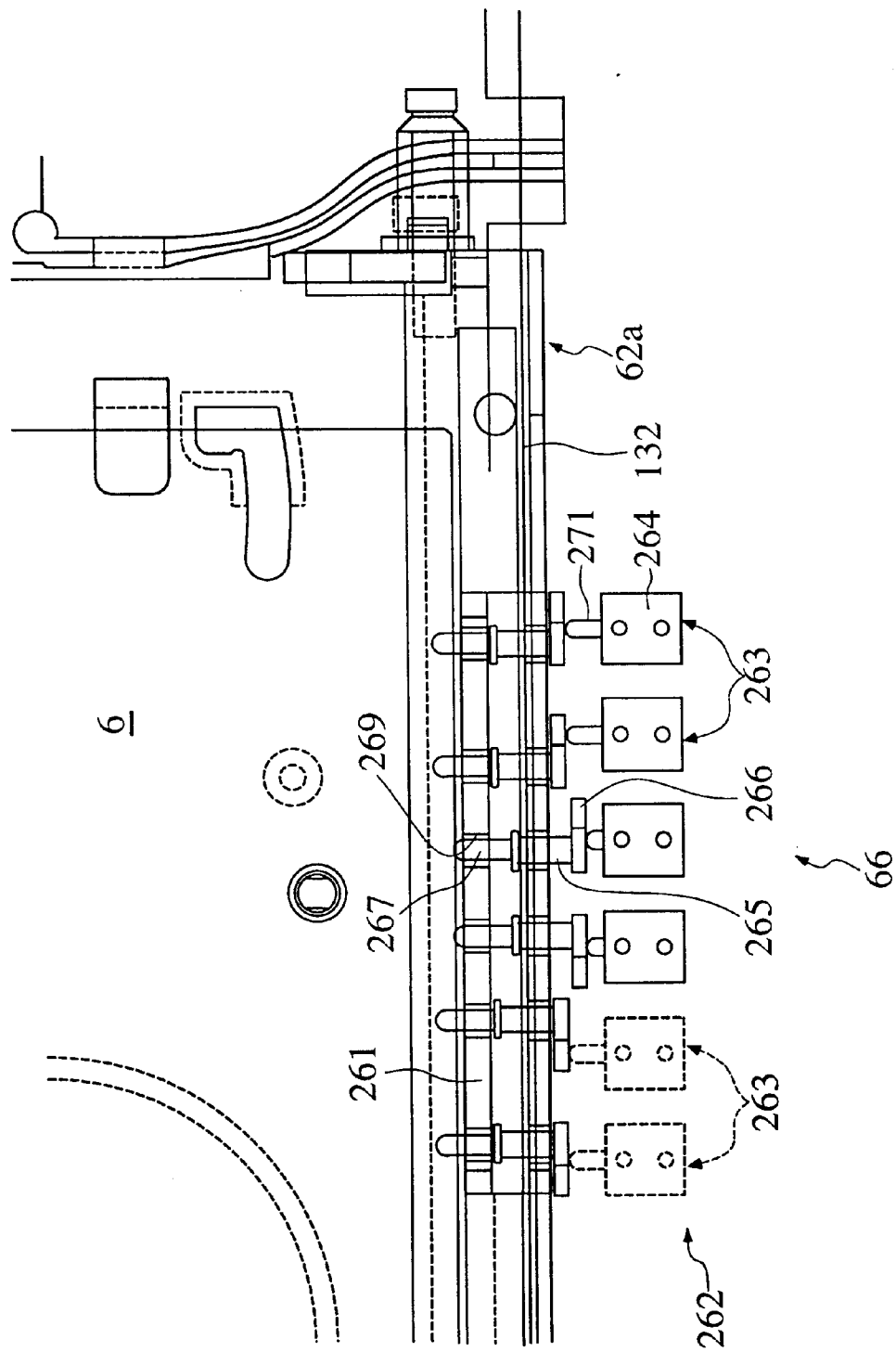
FIG. 30 is a plan view showing the pocket as well as the detecting device and the component parts associated therewith.

As shown in FIG. 28, when the lid-opening link 62a rotates in a clockwise direction as viewed in this figure to hold the lid 7 open, the switch top 265 moves forward (toward the base plate 270 side) so that the detecting projection 267 is retracted from within the pocket 6 (see FIG. 28). This cancels the detecting mode of the detecting device 66, and the stamp body A can be mounted or removed without interference to the detecting projection 267. On the other hand, when the lid-opening link 62a rotates in an anticlockwise direction to hold the lid 7 closed, the switch top 265 moves backward (to the pocket 6 side) so that the detecting projection 267 projects into the pocket 6. This sets the detecting mode of the detecting device 66. In this mode of the detecting device, if the stamp body A is mounted in the pocket 6, the switch top 265 is brought into contact with the stamp body A to turn off the detecting switch 263 whereby the mounting of the stamp body A is detected (see FIG. 31). Inversely, if the stamp body A is not mounted, the switch top 265 projects to the maximum extent to turn on the detecting switch 263, whereby the removal of the stamp body A is detected.

Actually, when any of the detecting switches 263 of the switch array 262 is turned off, mounting of the stamp body A is detected, whereas when all of the detecting switches 263 are turned on, removal of the stamp body A is detected.

As described above, each of the various types of the stamp body A mounted in the pocket 6 is positioned by the bosses 251 such that the center of the stamp surface Ad always comes to an identical point. Therefore, abutment of the detecting switches 263 on the central portion of the back surface Ag of the stamp body A ensures detection of any type of stamp body A. Further, since the detecting switches 263 are caused to abut or strike the stamp body A in a manner linked to opening and closing operations of the lid 7, no detecting switches (detecting projections 267) project into the pocket 6 when the stamp body A is mounted or removed, so that the stamp body A can be mounted or removed smoothly. Alternatively, instead of setting or canceling the detecting mode of the detecting device 66, opening of the lid 7 may be detected by detecting the retraction of the detecting projections 267 of the switch top 265 from within the pocket 6, or a priority detection signal for inhibiting the exposure may be generated by the detection of the retraction of the detecting projections 267.

Figure 31:
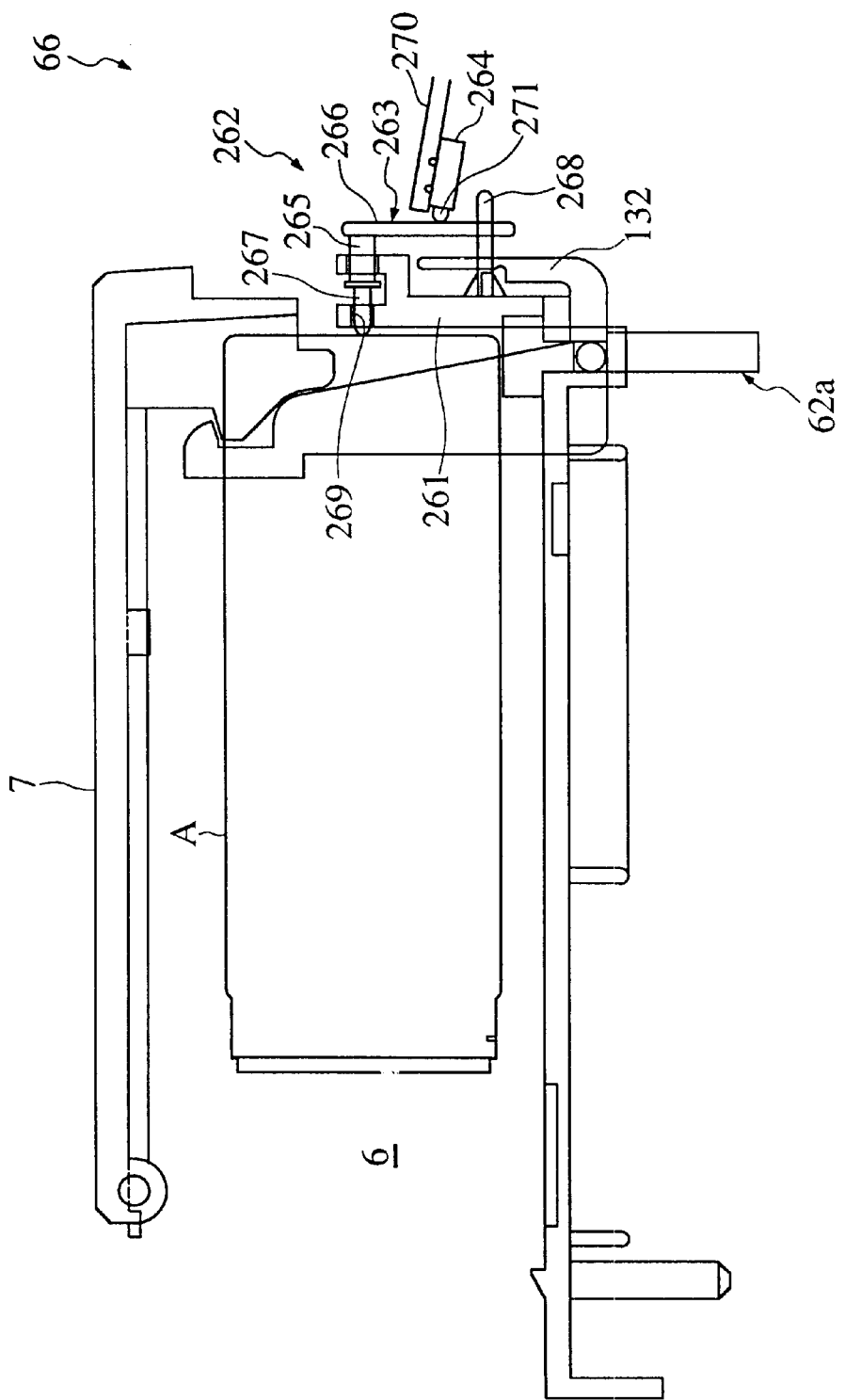
FIG. 31 is a cross-sectional view which is useful in explaining one of two kinds of detecting operation of the detecting device.
Figure 32:
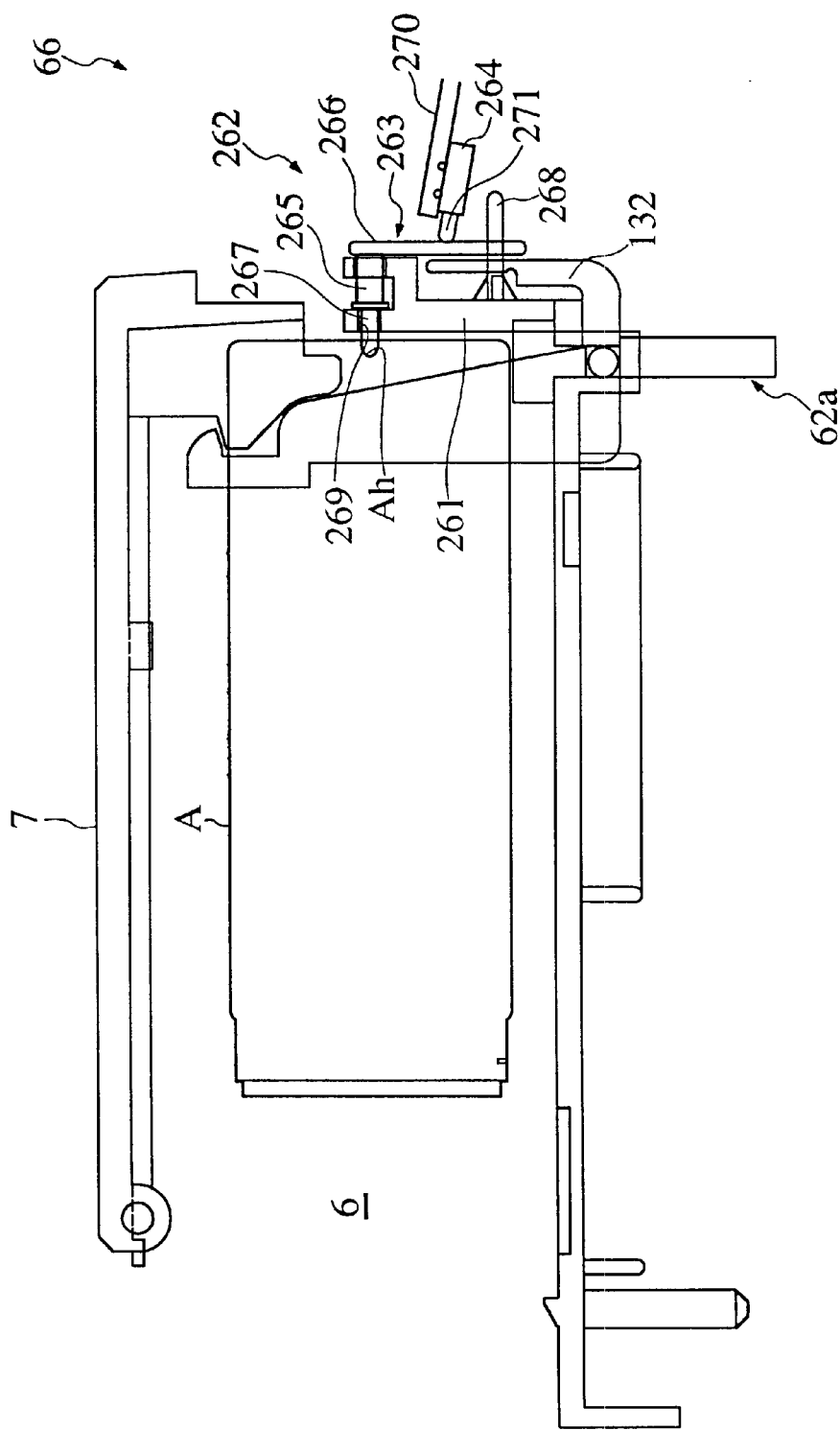
FIG. 32 is a cross-sectional view which is useful in explaining the other of two kinds of detecting operation of the detecting device.

Further, the detecting switches 263 of the switch array 262 are each in ON or OFF state depending on whether a corresponding small hole Ah exists in the stamp body A, as shown in FIG. 31 or 32. Therefore, the type of the stamp body A can be determined from a pattern of ON/OFF states of the six detecting switches 263.

FIGS. 33A to 33G show the relation ship between small holes Ah in the stamp body A and the six detecting switches 263 (detecting projections 261). Provision of the six detecting switches 263 for detecting presence or absence of the small holes Ah makes it possible to detect $2^n-1$ (n=6), i.e. 63 types of patterns. A stamp body A for a square stamp or the like, which is small in width, has no small holes Ah corresponding to two outermost detecting switches 263, 263 on respective opposite sides, and the two detecting switches 263, 263 project into space beside the stamp body A. That is, a stamp body having a small width, such as a stamp body for a square stamp, is recognized as a pattern for a stamp body having imaginary small holes Ah at outermost locations thereof.

In other words, out of the 63 types of patterns, ones having small holes Ah at outermost locations of the stamp body A are assigned to stamp bodies A for the square stamps and the like which have small widths, whereby stamp bodies which do not have a sufficient width for possible small holes Ah corresponding to all the detecting switches 263 can be discriminated, without decreasing the number of possible patterns of small holes. The six detecting switches 263 include spare switches, and in practice, tour detecting switches 263 are sufficient.

Figure 21:
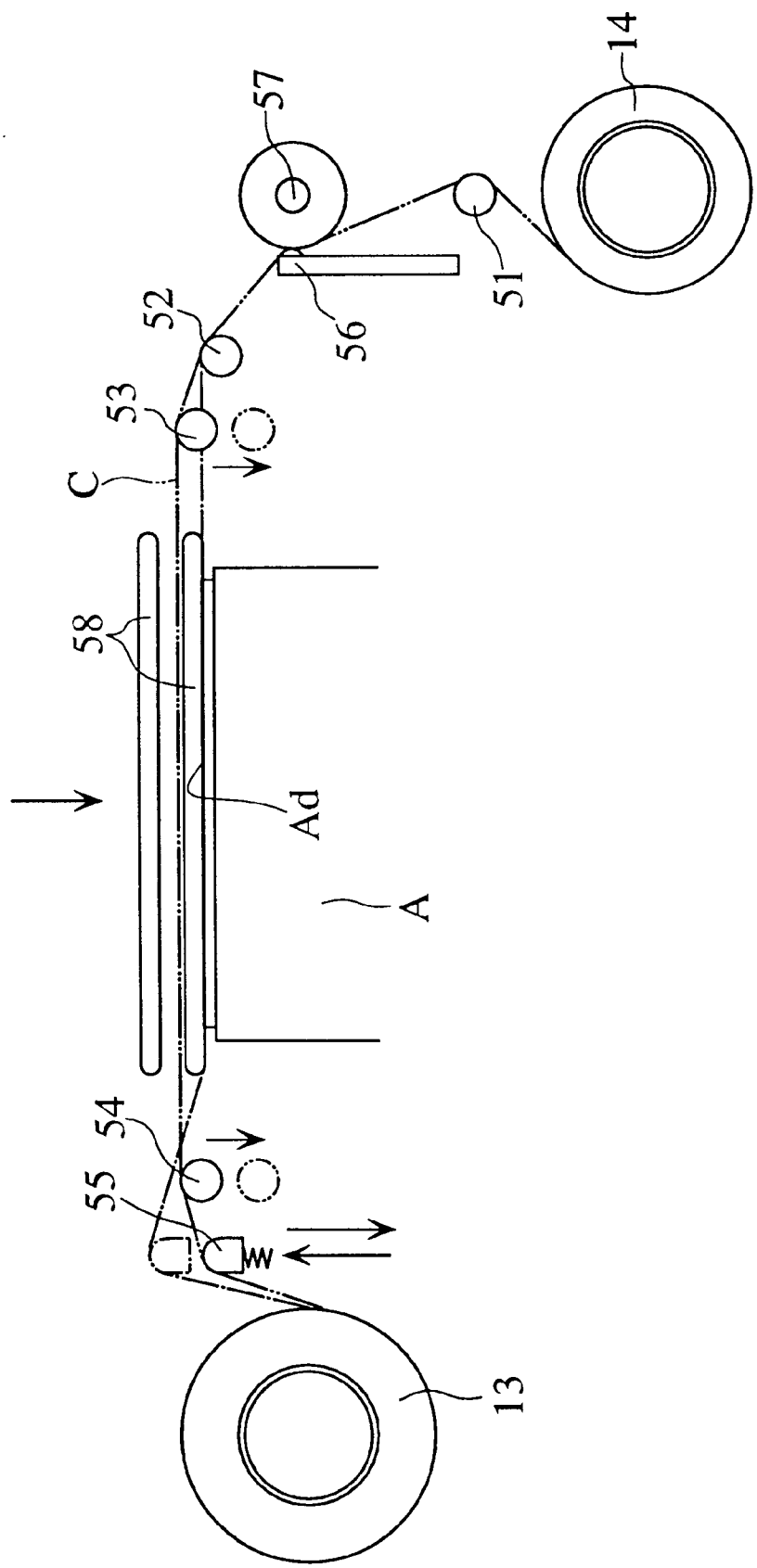
FIG. 21 is a diagram schematically showing a feed path of an ink ribbon.
Figure 36:
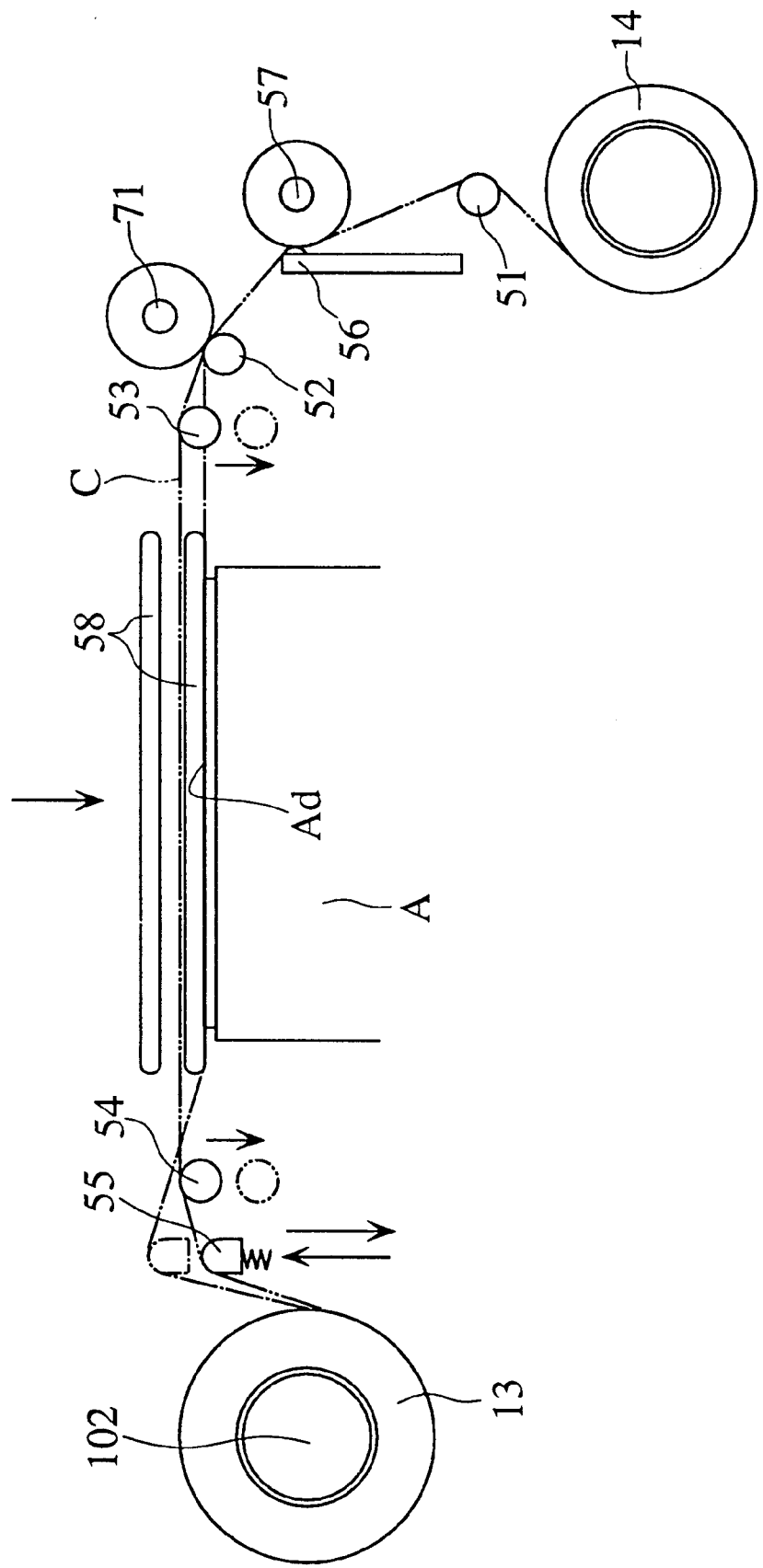
FIG. 36 is a diagram schematically showing a feed path of an ink ribbon made when a ribbon feeder according to a second embodiment of the invention is used.

Next, a ribbon feeder 61 will be described with reference to FIG. 36 showing a second embodiment of the invention, the figure corresponding to FIG. 21 showing the first embodiment. In the second embodiment, a feed roller 71 is arranged adjacent to the second path-setting pin 52 such that the feed roller 71 is urged against the second path-setting pin 52. The feed roller 71 is a drive roller driven by the drive motor 101, and feeds the ink ribbon C while regulating the tension of part of the ink ribbon C between the take-up reel 13 (reel shaft 102) and the second path-setting pin 52. Further, the urging force of the feed roller 71 against the second path-setting pin 52 can be finely adjusted by a spring, riot shown, or the like. The second path-setting pin 52 may be a driven roller in rolling contact with the feed roller 71.

According to the arrangement of the ribbon feeder 61 of the second embodiment of the invention, the tension of part of the ink ribbon C facing the exposure system 65 is determined by a slip spring interposed in the reel shaft (sliding shaft) 102, while the tension of part of the ink ribbon C from the printing device to the exposure system 65 is determined by the feed roller 71. This makes it possible to set the tension of the part of the ink ribbon C on the reel shaft (sliding shaft) 102 side with top priority to no wrinkles being formed on this part of the ink ribbon C, while it is possible to set the tension of the part of the ink ribbon C on the feed roller 71 side with top priority to smooth printing and easy peeling of the plate-making sheet B.

The tension-adjusting means may be incorporated in the shaft or the like of the take-up reel. Further, the present stamp-making apparatus may be configured such that the exposure object (stamp body) is moved to the presser plate. Further, the lock mechanism may be incorporated in the main link. Further, it goes without saying that the abnormality-detecting device of the self-heating hot-cathode tube may be applied to various electronic devices having the requirement of shorter exposure time period. Still further, the method of detecting the type of the stamp body is not particularly limited to the detecting of the stamp body by the stamp-making apparatus, but it may be applied to various electronic devices which receive different objects to be accessed.

It is further understood by those skilled in the art that the foregoing is preferred embodiments of the invention, and that various changes and modifications may be made without departing from the sprit and scope thereof.

What is claimed is:

1. A stamp-making object material-detecting device for a stamp-making apparatus having a pocket in which a stamp-making object material in the form of a pillar is mounted, said stamp-making object material having a stamp-making surface at one end thereof, and a reverse side surface parallel to said stamp-making surface, said stamp-making object material-detecting device detecting that said stamp-making object material is mounted in said pocket, said stamp-making object material-detecting device comprising detecting means arranged to face toward a central portion of said reverse side surface of said stamp-making object material mounted in said pocket to thereby detect whether said stamp-making object material is mounted in said pocket.

2. A stamp-making object material-detecting device according to claim 1, wherein said detecting means comprises a mechanical switch for detecting said stamp-making object material, said mechanical switch having a detecting tip, and detecting said stamp-making object material by causing said detecting tip to project toward said stamp-making object material for abutment thereon.

3. A stamp-making object material-detecting device according to claim 1, wherein said stamp-making apparatus include an exposure system, said stamp-making object material is a stamp body on which a stamp surface is formed by exposure of said stamp body to light by said exposure system.

4. A stamp-making object material-detecting device according to claim 1, wherein said stamp-making apparatus include an exposure system, said stamp-making object material is a stamp body on which a stamp surface is formed by exposure of said stamp body to light by said exposure system.

5. A stamp-making object material-detecting device for a stamp-making apparatus having a pocket in which a stamp-making object material in the form of a pillar is mounted, said stamp-making object material having a stamp-making surface at one end thereof, and a reverse side surface parallel to said stamp-making surface, said stamp-making object material-detecting device detecting that said stamp-making object material is mounted in said pocket, said stamp-making object material-detecting device comprising detecting means arranged to face toward any of end faces of said stamp-making object material which are parallel to a direction of mounting of said stamp-making object material to thereby detect whether said stamp-making object material is mounted in said pocket.

6. A stamp-making object material-detecting device according to claim 5, wherein said detecting means comprises a mechanical switch for detecting said stamp-making object material, said mechanical switch having a detecting tip, and detecting said stamp-making object material by causing said detecting tip to project toward said stamp-making object material for abutment thereon.

7. A stamp-making object material-detecting device according to claim 6, wherein said pocket is provided with a lid, said mechanical switch being projected toward said stamp-making object material for abutment thereon in a manner linked to closing of said lid.

8. A stamp-making object material-detecting device according to claim 6, wherein said mechanical switch comprises a switch holder, a switch top mounted on said switch holder for forward and backward movement, a switch base, and a switch body mounted on said switch base for being in contact with said switch top for turning on and off according to said forward and backward movement of said switch top.

9. A stamp-making object material-detecting device according to claim 6, wherein said mechanical switch comprises a plurality of mechanical switches, said stamp-making object material is formed with type-detecting holes for escaping abutment of predetermined ones of said plurality of mechanical switches, the correspondence of said type-detecting holes to said predetermined ones of said plurality of mechanical switches varying with a type of said stamp-making object material.

10. A stamp-making object material-detecting device according to claim 5, wherein said stamp-making apparatus include an exposure system, said stamp-making object material is a stamp body on which a stamp surface is formed by exposure of said stamp body to light by said exposure system.

11. A stamp-making object material-detecting device comprising:

a plurality of switches;

a stamp-making object material having an abutment surface having a width corresponding to at least one of said plurality of switches, portions of said abutment surface of said stamp-making object material corresponding to said at least one of said plurality of switches each being either a hole portion formed with a hole for escaping abutment of a corresponding one of said at least one of said plurality of switches or a no-hole portion for receiving abutment of a corresponding one of said at least one of said plurality of switches, said abutment surface being formed with an alternative combination of at least one of said hole portion and said no-hole portion, said combination being selected depending on said width of said abutment surface; and discriminating means for discriminating a combination of signals indicative of hole portions and signals indicative of no-hole portions each generated when said plurality of switches are caused to moved toward said abutment surface for abutment thereon;

whereby said type of said stamp-making object material can be detected in an alternative manner.

12. A stamp-making object material-detecting device according to claim 11, wherein said stamp-making apparatus include an exposure system, said stamp-making object material is a stamp body on which a stamp surface is formed by exposure of said stamp body to light by said exposure system.

13. A stamp-making object material-detecting device according to claim 11, wherein said stamp-making apparatus include an exposure system, said stamp-making object material is a stamp body on which a stamp surface is formed by exposure of said stamp body to light by said exposure system.

14. A stamp-making object material-detecting device for a stamp-making apparatus, comprising:

n (n≧2) switches each operating by being moved to said stamp-making object material for abutment thereon;

first stamp-making object material having an abutment surface corresponding to all of said n switches;

second stamp-making object material having an abutment surface corresponding to some of said plurality of switches, a remainder of said plurality of switches being moved toward said stamp-making object only to miss said stamp surface;

type-detecting holes selectively formed in said first stamp-making object material and said second stamp-making object material in a manner corresponding to respective ones of said n switches to thereby escape abutment of said respective ones of said n switches, wherein discriminating patterns of n bits of data are formed based on a relationship between said n switches and "presence or absence" of said type-detecting hole corresponding to each of said n switches, a state of said remainder of said plurality of switches being moved toward said stamp-making object only to miss said stamp surface being defined as "presence" of said type-detecting hole, ones of said discriminating patterns each including said "presence" of said type-detecting hole being assigned to said second stamp-making object material, and remaining ones of said discriminating patterns being assigned to said first stamp-making object material.

15. A stamp-making object material detecting device comprising:

a pocket for receiving a stamp body;

a plurality of switches disposed adjacent said pocket, each of said switches including a detecting projection retractably projecting into said pocket for detecting mounting of said stamp body in said pocket and determining a type of stamp body according to at least one type of detecting hole formed in a surface of said stamp body detected by said detecting projection, a lid disposed proximate said pocket and movable between an open position providing access to said pocket and a closed position preventing access to said pocket; and a lid link interconnecting said lid and said plurality of switches such that said detecting projections are retracted from said pocket when said lid is in said open position and are projected into said pocket when said lid is in said closed position.

16. The detecting device of claim 15 wherein each of said type of stamp body is identical in length.

17. The detecting device of claim 15 wherein a center of each of said type of stamp body resides at a pre-selected location when said stamp body is mounted in said pocket.

18. The detecting device of claim 15 wherein each of said plurality of switches includes a switch top for fitting into a fitting hole formed in said stamp body when said stamp body is mounted in said pocket.

19. The detecting device of claim 15 wherein each of said plurality of switches includes a switch top for fitting into a fitting hole formed in said stamp body when said stamp body is mounted in said pocket, said switch tops preventing exposure of said stamp body unless said stamp body is mounted in said pocket.

* * * * *